(12) United States Patent
Desimone et al.

(10) Patent No.: US 7,733,340 B1
(45) Date of Patent: Jun. 8, 2010

(54) SYSTEMS AND METHODS FOR USING A SINGLE TOOL FOR THE CREATION AND MODIFICATION OF SOLIDS AND SURFACES

(75) Inventors: Frank Desimone, Carlisle, MA (US); Daniel Dean, Acton, MA (US)

(73) Assignee: Spaceclaim Corporation, Inc., Concord, MA (US)

( * ) Notice: Subject to any disclaimer, the term of this patent is extended or adjusted under 35 U.S.C. 154(b) by 0 days.

(21) Appl. No.: 12/490,724

(22) Filed: Jun. 24, 2009

Related U.S. Application Data

(63) Continuation of application No. 12/351,376, filed on Jan. 9, 2009.

(60) Provisional application No. 61/020,076, filed on Jan. 9, 2008.

(51) Int. Cl.
*G06T 17/00* (2006.01)
*G06F 17/50* (2006.01)

(52) U.S. Cl. .......................... 345/420; 345/419; 703/1; 715/964

(58) Field of Classification Search .................. None
See application file for complete search history.

(56) References Cited

U.S. PATENT DOCUMENTS

| 6,795,069 | B2 * | 9/2004 | Raskar et al. ............... 345/419 |
| 2002/0015036 | A1 * | 2/2002 | Shiroyama et al. .......... 345/419 |
| 2005/0062740 | A1 * | 3/2005 | Tobita et al. ................ 345/427 |
| 2006/0079989 | A1 * | 4/2006 | Ishii et al. ................... 700/182 |
| 2006/0082571 | A1 * | 4/2006 | McDaniel .................... 345/419 |
| 2006/0195303 | A1 * | 8/2006 | Thompson et al. ............. 703/1 |
| 2006/0250393 | A1 | 11/2006 | Tsang et al. |
| 2008/0036773 | A1 * | 2/2008 | Bae ............................ 345/442 |

OTHER PUBLICATIONS

Masry, M. and Lipson, H. 2007. A sketch-based interface for iterative design and analysis of 3D objects. In ACM SIGGRAPH 2007 Courses (San Diego, California, Aug. 5-9, 2007). SIGGRAPH '07. ACM, New York, NY.*
Owada, S., Nielsen, F., Nakazawa, K., and Igarashi, T. 2007. A sketching interface for modeling the internal structures of 3D shapes. In ACM SIGGRAPH 2007 Courses (San Diego, California, Aug. 5-9, 2007). SIGGRAPH '07. ACM, New York, NY.*
Gould, Lawrence S. "PC-based CAD for the Rest of Us." Automotive Design and Production, Feb. 15, 1999, pp. 1-4. Retrieved from <www.autofieldguide.com> on Mar. 12, 2009.
Mary, et al., "A sketch-based interface for interative design and analysis of 3D objects," in ACM Siggraph 2007 Courses (San Diego, California, Aug. 2007), SIGGRAPH 2007, ACM, New York, NY, 10 pages.

* cited by examiner

*Primary Examiner*—Daniel F Hajnik
(74) *Attorney, Agent, or Firm*—Wilmer Cutler Pickering Hale and Dorr LLP

(57) ABSTRACT

Systems and methods for creating and editing 3D solids and surfaces in an intuitive manner are described. A single tool infers the most-likely correct action based on its context to a particular geometry case. The tool predicts a user's intended modification, and performs the predicted modification without recording related history information. The method includes receiving a selection of at least one CAD object. The method also includes the tool automatically predicting the user's intended type of modification to the at least one CAD object based on the type of the at least one CAD object and the at least one CAD object's relationships with the geometry of at least one surrounding (or related) CAD object. The tool can perform multiple types of modifications, and the modification is selected from the multiple types of modifications, without explicit commands from the user directing the type of modification.

18 Claims, 69 Drawing Sheets

Part modeling 214

Solid modeling 302

Face modeling 304

Pull 306

FIG. 3

| Height | 0 |
|---|---|
| Pitch | 40.000mm |
| Taper angle | 0° |

| Height | 0 |
|---|---|
| Pitch | 40.000mm |
| Taper angle | 0° |

| Height | 0 |
|---|---|
| Pitch | 40.000mm |
| Taper angle | 0° |

| Height | 0 |
|---|---|
| Pitch | 40.000mm |
| Taper angle | 0° |

| Height | 0 |
|---|---|
| Pitch | 40.000mm |
| Taper angle | 0° |

| Height | 0 |
|---|---|
| Pitch | 40.000mm |
| Taper angle | 0° |

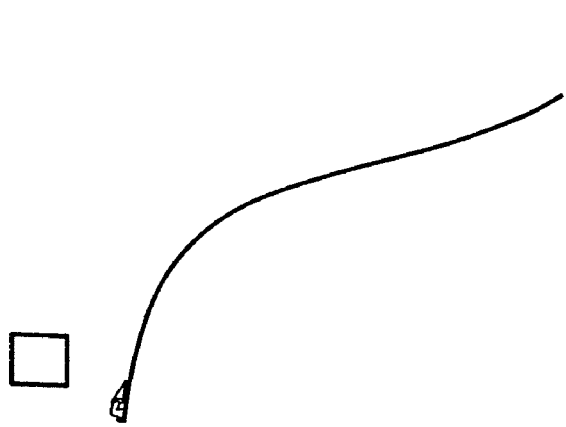 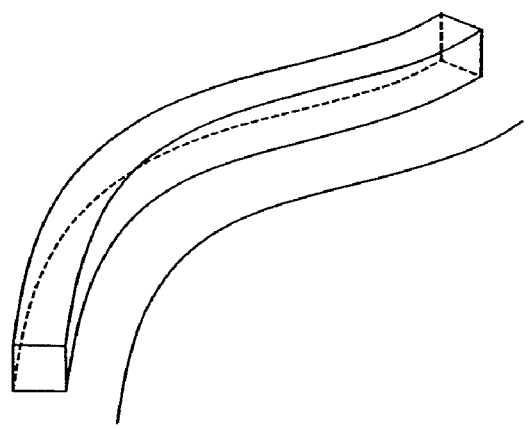
FIG. 26a    FIG. 26b
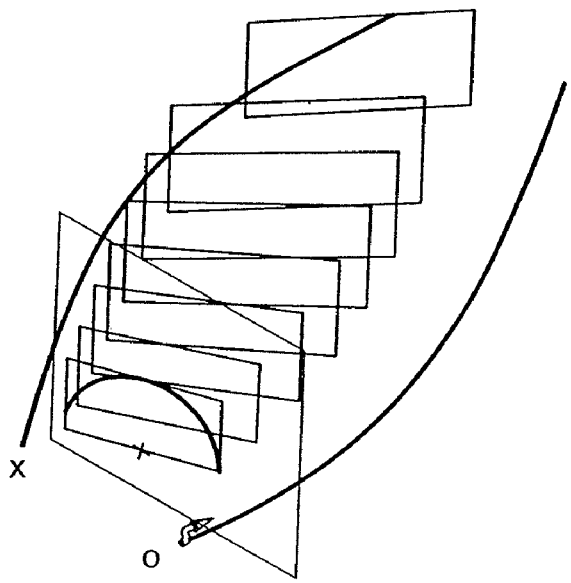 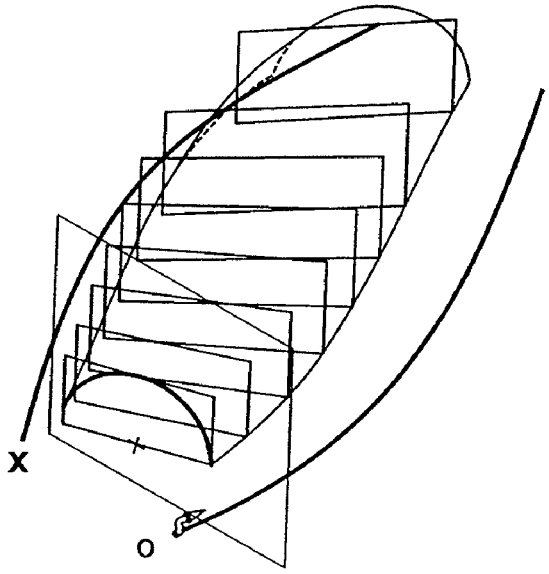
FIG. 26c    FIG. 26d
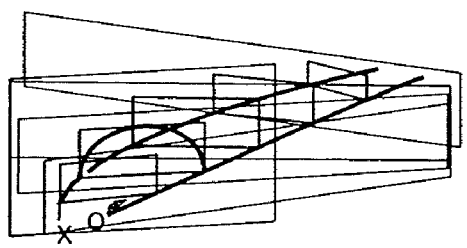 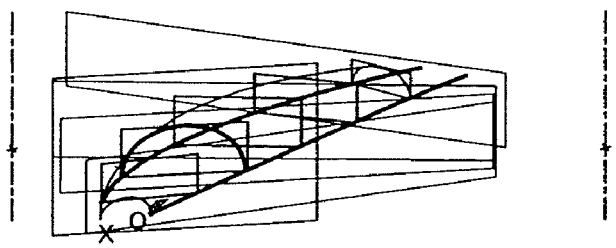
FIG. 26e    FIG. 26f

| Primary Selection → <br> Secondary Selection ↓ | 1 (or n) Face(s) | 1 Face + n Edges | n Edges | n Faces + m Edges | All Faces | Axis (of Hole/Shaft) | n Points |
|---|---|---|---|---|---|---|---|
| None | Offset (A) <br> Offset Copy (A) <br> Blend (B) <br> Thicken surfaces (A) <br> Full round (A) | Extrude (A) | Round (E) <br> Full Round (E) <br> Chamfer (E) <br> Copy edge (E) <br> Extend edge (E) <br> Trim (E) <br> Imprint edge (E) <br> Extrude edge (A) <br> Pivot edge (E) <br> Variable round (E) <br> Blend (B) | Blend (B) | Offset all (A) <br> Thicken surfaces (A) | Slot (F) | 3D Curve (B) |
| Direction | Extrude along (A) | Extrude along (A) | Extrude along (A) <br> Offset edge (E) | Extrude along (A) | *Move tool (direction)* | | |
| n Paths | Sweep (B) | Sweep (B) | Sweep (B) <br> Directional Sweep (B) <br> Rotational Sweep (B) <br> Boundary blend (B) | | *Move tool (sweep along)* | | |
| Axis | Revolve (D) <br> Rib (C) <br> Helix (C) | Rotate (C) <br> Rib (C) <br> Helix (C) | Rotate (C) <br> Helix (C) | Blend (B) | *Move tool (rotate)* | Slot (F) <br> Swept slot (F) | 3D Curve (B) |
| Hinge | Planar draft (D) <br> Edge-driven draft (D) <br> Drape draft (D) | | Pivot edge (E) | | *Move tool (adjust center, rotate handle)* | Circular slot (F) <br> Radially transform hole/slot (F) | |
| Reference Point | | | Extend (E) <br> Rotate edge (C) | | Scale all (A) | | |

FIG. 28

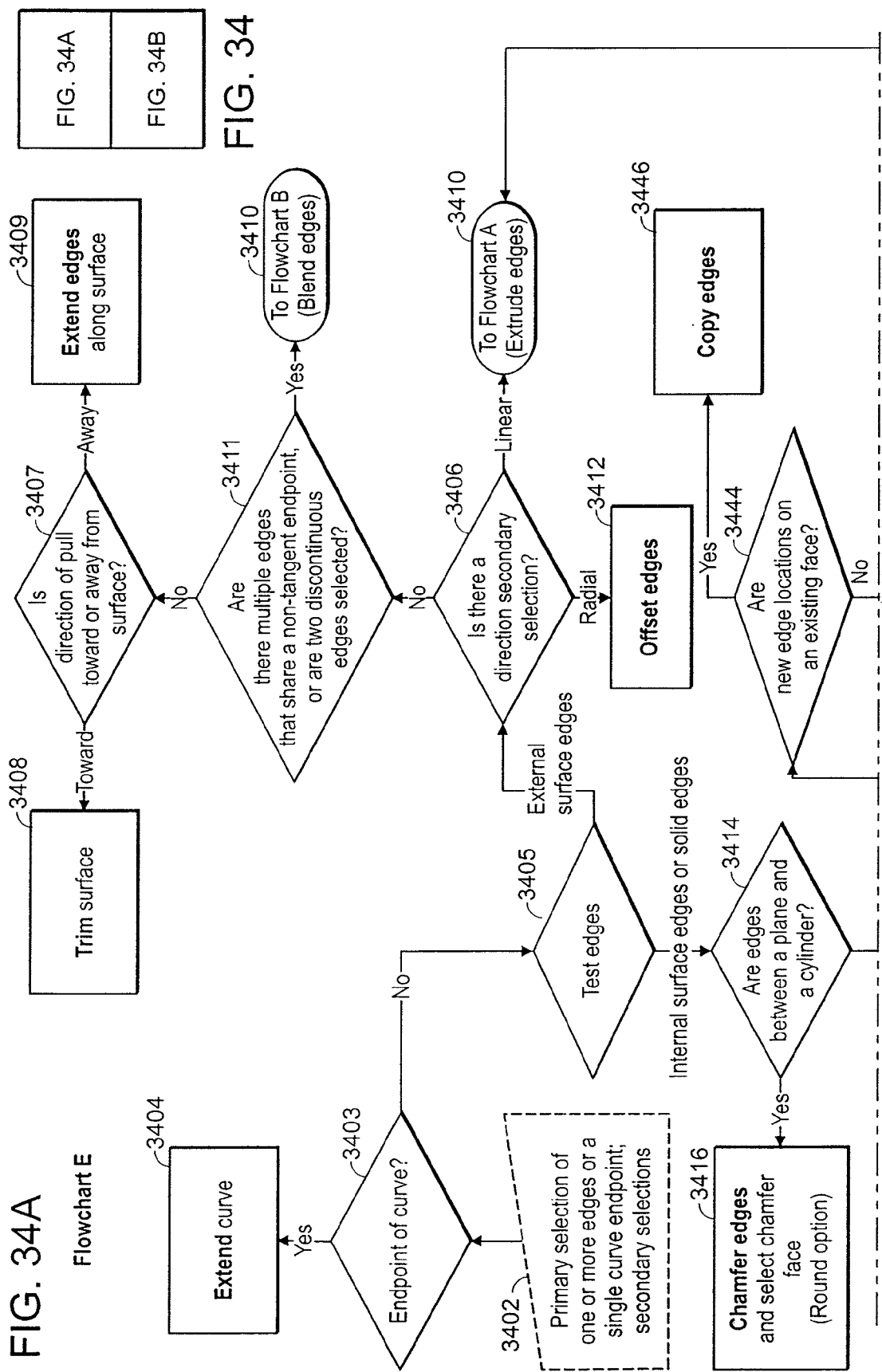

SYSTEMS AND METHODS FOR USING A SINGLE TOOL FOR THE CREATION AND MODIFICATION OF SOLIDS AND SURFACES

CROSS REFERENCE TO RELATED APPLICATIONS

This application claims the benefit of U.S. patent application Ser. No. 12/351,376 filed on Jan. 9, 2009, entitled "SYSTEMS AND METHODS FOR USING A SINGLE TOOL FOR THE CREATION AND MODIFICATION OF SOLIDS AND SURFACES," which claims the benefit under 35 U.S.C. 119(e) of U.S. Provisional Patent Application No. 61/020,076, filed on Jan. 9, 2008 entitled "SYSTEMS AND METHODS FOR USING A SINGLE TOOL FOR THE CREATION AND MODIFICATION OF SOLIDS AND SURFACES," each of which are hereby incorporated by reference herein in its entirety.

BACKGROUND OF THE INVENTION

1. Field of the Invention

Embodiments of the invention relate to creating and editing 3D solids and surfaces in an intuitive manner, using a single tool that infers the most-likely correct action based on its context when applied to a particular geometry case by the user.

2. Description of the Related Art

Objects in a CAD system can be represented in a parameter-based way or in a geometry-based way. In a parameter-based representation, the object is modeled as a geometric data object along with a set of features and history that define the object. In a geometry-based representation, the object is simply represented as a set of geometric data.

In modern CAD systems, geometry can be created in three basic ways: from manipulation of 2D sections, creation of edge features by modifications to the sharp boundaries between faces (e.g., a fillet), and combining and manipulating solid primitives using a set of Boolean operations. Over time, every major CAD tool has organized these "section-based" and "edge-based" features according to their inputs and desired output. This organization resulted in many separate workflows located within many separate features and tools to perform these functions. Moreover, since these CAD tools essentially force the user to make up a recipe of desired functions, and only then ask for the calculation to occur, the user does not know the result until the operation has concluded. Changes to a model that are made after a completed operation involve rolling the history of the model backwards and redefining the operation with different selections and/or options. This makes changing a model a frustrating and time-consuming endeavor.

When editing a previously created solid or surface in a parametric system, the process requires step-by-step re-creation of the original solids and/or surfaces. To modify the object, changes must be rolled back, and the new change must be made before a user can return to the current step. This is a consequence of parametric systems having added many history features on top of the actual geometry modeling functionality. These systems have interwoven these features into the software so that making changes requires a lot of effort and additional steps to maintain the information in the step-by-step history. Specifically, they require editing the particular historical step that parameterized the object instead of changing the object itself. These methods allow a user to modify a feature of an object only when the object is in the same state as it was when the feature was created.

Other systems provide creation and editing actions using many different tools. To select the correct tool, the user must know in advance what object they want to modify and what action they want to perform, and what restrictions or caveats the tool will place on their ability to change the model in the future. For example, one tool may allow tangency to be set while defining the feature, while another will not. Even worse, some features allow constraints to be set when the features are created but not allow these constraints to be changed later, necessitating a delete and re-create action by the user. Further, little logic is performed by the system to determine the user's intention, requiring every break in the system logic to ask the user for further instruction. In addition, the user must switch between tools frequently to complete a set of modifications. The entire action must be completed to see the expected result; there is no preview of the appearance of the final object before regions are deleted and the result of the action is merged into the rest of the geometry.

SUMMARY OF THE INVENTION

Embodiments of the invention are directed to systems and methods for creating and editing 3D solids and surfaces in an intuitive manner, using a single tool that infers the most-likely correct action based on its context when applied to a particular geometry case by the user. One embodiment of the invention is a method for interactively modifying the underlying geometry of at least one CAD object using a single modification tool capable of modifying the at least one CAD object in multiple ways. The single modification tool predicts a user's intended modification, and performs the predicted modification without recording related history information indicating historical changes made to the at least one CAD object as it has been changed and modified over time. The method includes using the underlying geometry of at least one CAD object to display it with a corresponding position and orientation within a three dimensional modeling space. The at least one CAD object is at least one of a solid object and a surface, and the at least one CAD object is displayed within a graphical user interface of a computer aided design modeling system. The method also includes receiving from a user, through the single modification tool, a selection of the at least one CAD object. The method also includes the single modification tool automatically predicting the user's intended type of modification to the at least one CAD object based on the type of the at least one CAD object and the at least one CAD object's relationships with the geometry of at least one surrounding CAD object. The single modification tool is capable of performing multiple types of modifications, and the predicted modification is selected from the multiple types of modifications, without explicit commands from the user directing the type of modification to be performed. The method also includes receiving, from the user, an amount of change for the predicted modification to the at least one CAD object. The method also includes the single modification tool modifying the at least one CAD object in accordance with the predicted type of modification and the amount of change. The modified at least one CAD object is redisplayed in real-time for further interactive modification by the user, and the method updates the underlying geometry of the at least one CAD object such that changes to the displayed at least one CAD object are reflected in the updated underlying geometry representation of the at least one CAD object stored within the computer aided design modeling system. The updates are performed without recording history information.

Embodiments of the invention further include from a user, through the single modification tool, a selection of at least one reference CAD object. The single modification tool automatically predicts the user's intended type of modification to the at least one CAD object based on the type of the at least one CAD object, the type of the at least one reference CAD object, and the at least one CAD object's relationships with the geometry of at least one surrounding CAD object.

BRIEF DESCRIPTION OF THE DRAWINGS

Various objects, features, and advantages of the present invention can be more fully appreciated with reference to the following detailed description of the invention when considered in connection with the following drawings, in which like reference numerals identify like elements.

FIG. 3 shows the detailed architecture of the components that contain the Pull tool.

FIGS. 26 a-f show a user creating swept surfaces with the Pull tool.

FIG. 28 describes the categorization strategy used to determine which action the Pull tool will perform based on the context provided by the geometry and the user.

DETAILED DESCRIPTION

Figure 1:
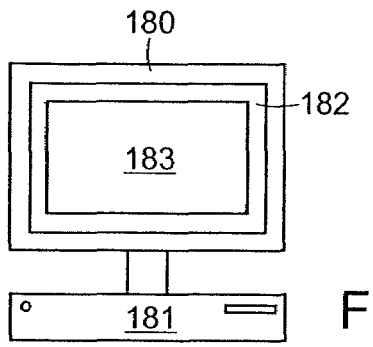
FIG. 1 shows a computer system on which the Pull tool in accordance with embodiments of the invention can be implemented.

Embodiments of the invention allow curves, surfaces, and solids to be edited in a simple and intuitive manner. Solids and surfaces can be modified regardless whether they were originally created in the embodiment's CAD system or imported from another CAD system.

In one embodiment, the invention is a tool within a three-dimensional modeling system, namely the Pull tool. The Pull tool can be used to perform actions on solids and surfaces, including (but not limited to) the following:

Offset and thicken
Extrude and extrude along a path
Revolve and helix
Rotate faces and edges
Sweep along, directional sweep, rotational sweep, and multi-trajectory sweep
Normal, rotational, periodic, and swept blend
Create 3D curves
Extend, extrude, extrude along a path, offset, trim, and imprint edges
Round, full round, and variable round
Chamfer
Draft solid faces, edge-driven draft, "drape" a surface over a body
Pivot edges
Scale
Create directional, radial, and swept slots and shafts
Create ribs and rotational ribs
Copy a face or edge These modifications can be made without the need to completely rebuild the object or deal with various constraints of the modeled object. The term "objects" refers to any geometric solid, surface, or curve represented within the CAD system. Solid objects are composed of a set of faces that enclose a volume.

To the user, the Pull operation is intended to be as simple as "Select and Pull." Without the user realizing it, dragging with the Pull tool is a three-step operation: (1) gathering references, (2) categorizing references and choosing a likely action, and (3) making the change to all related geometry in real-time as the user requests a pull amount. In the first step, objects are selected by the user, who gives the input to the tool as to their relative importance (primary selections of geometry for modification vs. secondary selections of geometry, or a minimal set of UI switches, to guide actions.) In the second step, the combination of primary and secondary references are categorized (see FIG. 28) and the user is placed into the most likely operation (and appropriate UI elements are displayed.) In the final step, a change is made to the geometry by some further user action (and related or associated geometry is automatically changed as appropriate.)

This simple and intuitive method of editing objects is possible because the modeling system used with the Pull tool maintains only the minimum level of history information on top of the geometry information and can therefore show geometry changes to objects and faces (and associated objects and faces) very quickly, so quickly that changes are perceived as occurring in real time by the user. The moment a user selects the objects to be edited, the program regenerates the object. The simplicity of this method is shown in FIGS. 5-27 and 36-52, which show the primary and secondary selections and the resulting solids and surfaces that are created when the user drags with the Pull tool. The user can use the Pull tool, along with the Select sub-tool to extrude a surface in a direction normal to the surface, or alternatively use the Revolve sub-tool to rotate or revolve faces (shown in FIG. 4), the Direction sub-tool to extrude in a particular direction, the Sweep sub-tool to extrude along a trajectory, or the Draft sub-tool to pivot faces. These processes are all done using the single Pull tool, along with the proper selections of objects using the sub-tools, or an alternative method (e.g., keyboard combined with mouse clicks). When the user invokes the keyboard to select these alternate references (i.e., a plane to form a draft hinge, an axis to revolve or rotate about, etc.) the inferencing engine of the Pull tool is invoked. While the user can be explicit in his choices of sub-tool, he can also rely on this inferencing engine to make the best guess of his intention, by simply selecting primary (clicks) and secondary (clicks modified with the Alt key) geometry references. As the assumptions made by the Pull tool are changed because of a combination of these automatic switches and explicit instructions, the user is made aware of the changed state of the Pull tool by way of on-screen handle icons. In the figures that show these actions, of particular note are these graphical icons, which show the user what state the Pull tool has been placed in as a result of their actions.

FIG. 1 shows a computer system capable of implementing embodiments of the invention. Further details of the overall system are given in the related applications entitled "Method for Modifying Any Modeled Surface As A Lofted Surface," filed Nov. 9, 2007, and with Ser. No. 11/937,926, "Systems and Methods For Merging and Splitting Intersecting Solids and Surfaces," filed Jan. 4, 2008, with Ser. No. 11/969,509, and "Systems and Methods for Modifying Three Dimensional Geometry Using an Arbitrary Cross-Section Plane," filed Jan. 9, 2008, with Ser. No. 11/971,756, all of which are herein incorporated by reference in their entirety.

The system includes a computer 181 containing memory and a processor running a standard operating system 182. Running within the operating system 182 with a graphical user interface is a user-level application 183, such as a modeling system that includes geometry creation and editing tools in accordance with embodiments of the invention. The operating system and the modeling system are displayed on the monitor 180.

Computer 181 can also have a network interface card and be connected to other computers, servers, and/or storage services. To interface with modeling system 183, a mouse and keyboard (not shown) or other input device can be used. In detail, one example of a computer system capable of running the Pull tool is a computer system running Microsoft Windows XP with Service Pack 2 or Windows Vista operating systems. The computer system has a video card, such as those provided by Radeon, NVIDIA, or AMD, with full DirectX 9c hardware support and 64 MB or more of graphics memory, Pixel Shader 2.0 hardware support, 32 bits/pixel, and 1024× 768 minimum resolution. The computer system can have a Pentium 4 2.0 GHz or Athlon 2000+ or faster processor, a 32-bit (x86) or 64-bit (x64) processor. The computer system can have between 512 MB and 4 GB of RAM. The system can also have 2 GB of available disk space, a CD/DVD drive, Microsoft Internet Explorer 5.5 or higher, and a 2 button+ wheel mouse.

Figure 2:
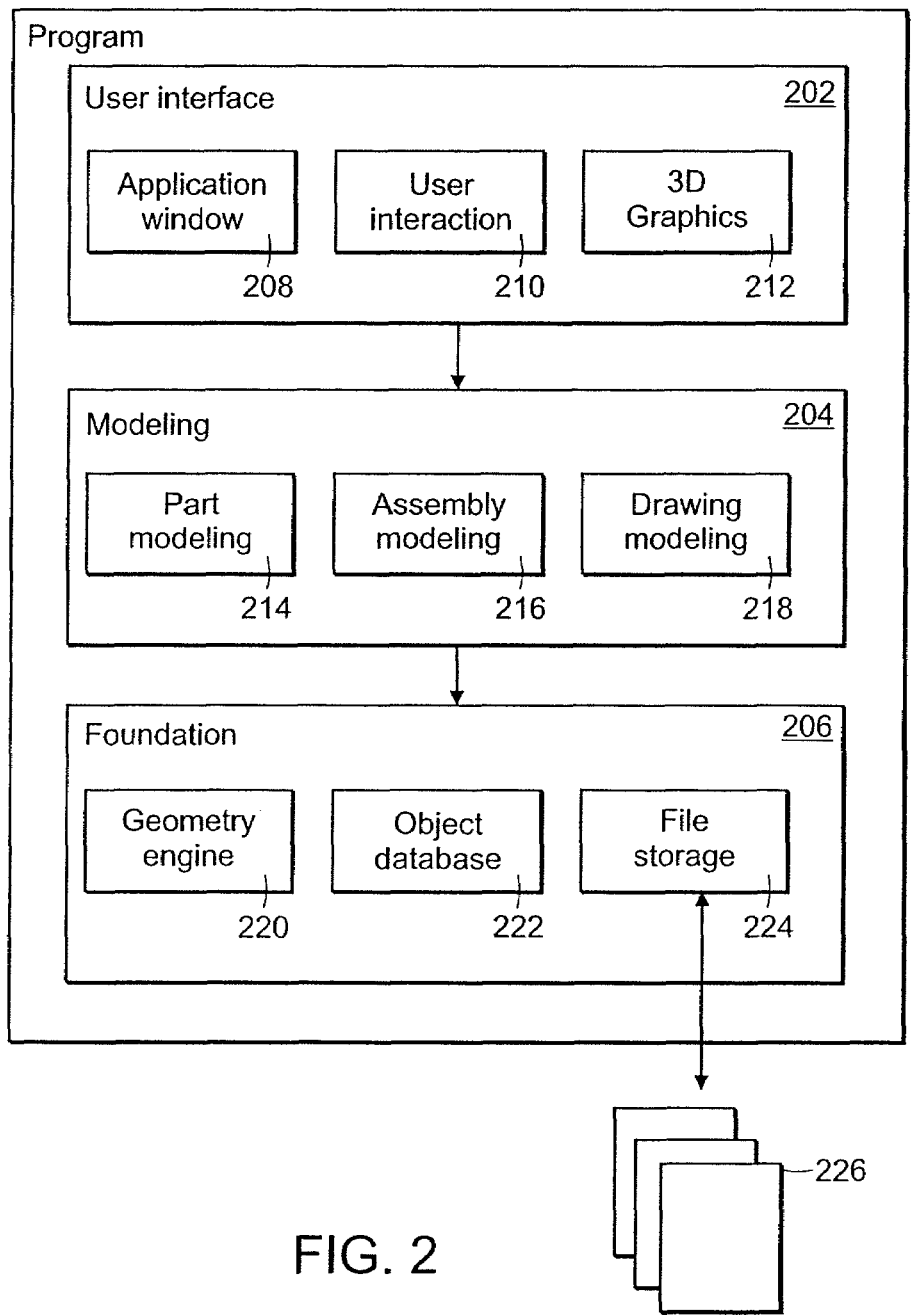
FIG. 2 shows the overall architecture of the modeling system and Pull tool.

FIG. 2 is an overall architecture diagram of the structure of the Pull tool within the modeling system in accordance with embodiments of the invention.

The modeling system 183 is made up of a user interface layer 202, a modeling layer 204, and a foundation layer 206. The user interface layer interacts with the user, the modeling layer embodies logic associated with the Pull tool and other tools of the modeling system, and the foundation layer provides geometry modeling and other file services.

The user interface layer 202 is made of an application window 208, which contains the Pull tool widgets, and other interface components common to modeling tools that allow a user to interact with the modeling system. It also contains the standard window manipulation features.

User interaction component 210 includes the Pull tool widgets, and other standard tools for selecting objects, viewing objects in different ways, or obtaining information about objects. Essentially, the user interface layer provides a way for the user to work with the geometry model and the geometry engine, the output of which is displayed on the monitor 180 using a 3D graphics engine 212. 3D graphics engine 212 renders geometry models to the application window 208 for interaction and manipulation by the user. This functionality can be provided by DirectX.

The modeling layer 204 provides the logic and algorithms that underlie the commands and tools in the user interface. It communicates with the geometry engine 220 based on user actions to display the geometry created by the user actions. The geometry engine is a known component capable of performing calculations on objects. One geometry engine compatible with embodiments of the invention is the ACIS geometry engine from Spatial Corporation, although other geometry engines with similar capabilities may also be used. Further details of the ACIS geometry engine are provided in Corney, J and Lim, T, 3D Modeling with ACIS, Stirling, UK, which is hereby incorporated by reference in its entirety.

The modeling layer is made up of part modeling component 214, assembly modeling component 216, and drawing modeling component 218. The part modeling component 214 manages CAD objects and houses creation and manipulation algorithms in the area of 3D solids and 2D sections and sketches.

The assembly modeling component 216 manages CAD objects and algorithms for assembly component instantiation and placement, mating conditions, and the ability to do part modeling in the context of an assembly. Assemblies are user-created collections of parts.

The drawing modeling component 218 manages CAD objects and algorithms for creating multi-sheet drawings, drawing views, and drawing annotations. Drawings are 2D representations of 3D objects meant to be printed on paper in standard engineering sizes and formats.

The foundation layer 206 provides a software platform used to support higher-level layers of the application. The geometry engine 220 supports the creation and modification of geometry and topology, and provides algorithms for solid modeling and geometric solving. The object database component 222 manages the temporary, in-memory representation of CAD objects, providing a unified framework for inter-object references, undo actions, and associative updates. The file storage component 224 provides persistent storage of CAD objects within document files 226, along with inter-document relationships, such as assembly-component relationships or drawing-format relationships.

FIG. 3 shows the hierarchy of object modeling components in accordance with the design of the Pull tool.

In the CAD program, multiple solids and surfaces are modeled in the part modeling component 214 which has the necessary algorithms for management and manipulation of 3D solids as well as 2D sections and sketches.

Within the part modeling component is the solid and surface modeling component 302 which is responsible for the management and manipulation of solid objects and surfaces. Unlike parametric, feature-based CAD systems, which make up the majority of the current systems, embodiments of the invention work directly in real time on the solid and surface geometry, as opposed to forcing the user to set up each individual object in a particular feature and then requiring a calculation at the end of the operation. Further, unlike parametric, feature-based CAD systems, which make up the majority of the current systems, the modeling system works directly on the face geometry in the face modeling component 304. Finally, the pull component 306 is a subset of the face modeling component and contains the algorithms, including embodiments of the invention, for editing solids and surfaces based on the changes made to their edges and faces.

Figure 4:
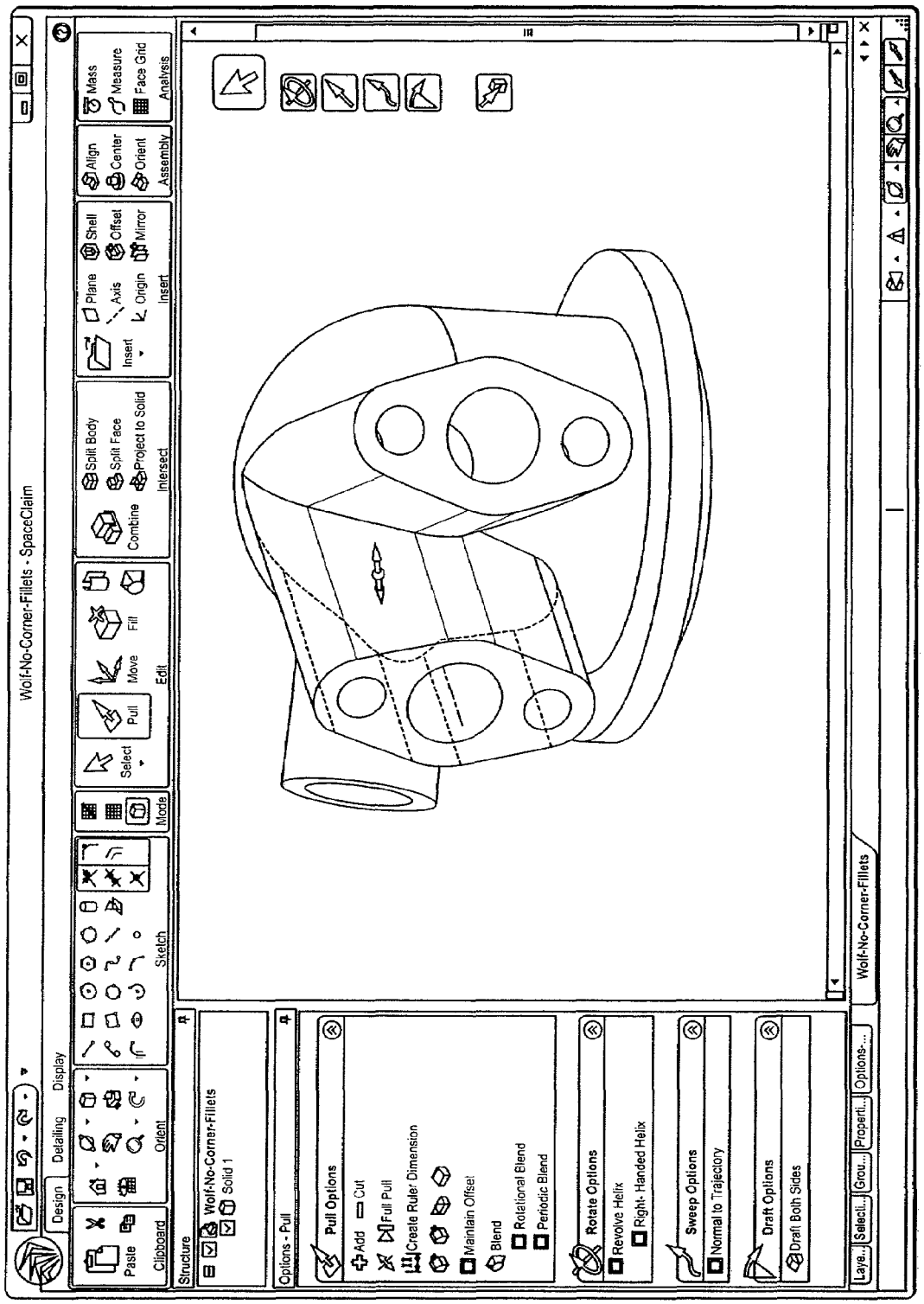
FIG. 4 shows a three-dimensional modeling software application containing the Pull tool and displaying geometry that can be modified with the tool.

Operation of the Pull tool by a user will now be described with respect to FIGS. 4-27 and 36-52. FIG. 4 shows the Pull tool and its sub-tools, FIGS. 5-14 show the offset and extrude functions of the Pull tool, FIGS. 16-19 show the blend functions, FIGS. 20 and 21 show the rotate functions, FIGS. 22 and 23 show the rib functions, FIG. 25 shows the helix function, FIG. 26 shows the sweep function, FIGS. 27 and 36-40 show the draft functions, FIGS. 41-46 show the edge-related functions, and FIGS. 47-52 show slot-related functions.

FIG. 4 shows a three-dimensional modeling software application containing the Pull tool and displaying geometry that can be modified with the tool.

The Pull tool can be accessed through many methods, including the use of a toolbar button within the application window of the overall CAD system. The Pull sub-tools are also shown. Alternatively, as described earlier, keyboard combinations with the mouse or the keyboard alone could be used instead of these sub-tools.

Some example geometry modifications that can be made with the Pull tool will now be described with respect to FIGS. 5-27, and FIGS. 36-52.

Figure 5B:
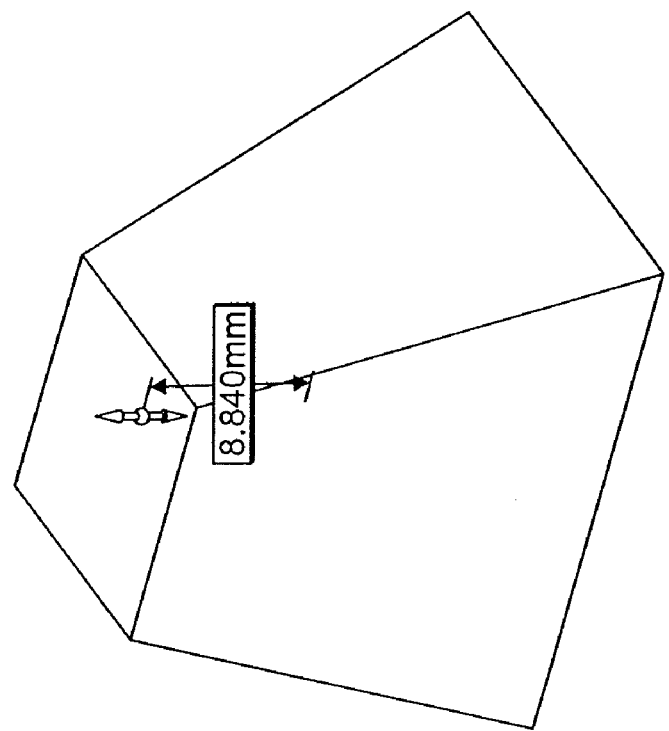
FIGS. 5 a-b show a user modifying a solid by pulling a face with the Pull tool.
Figure 5A:
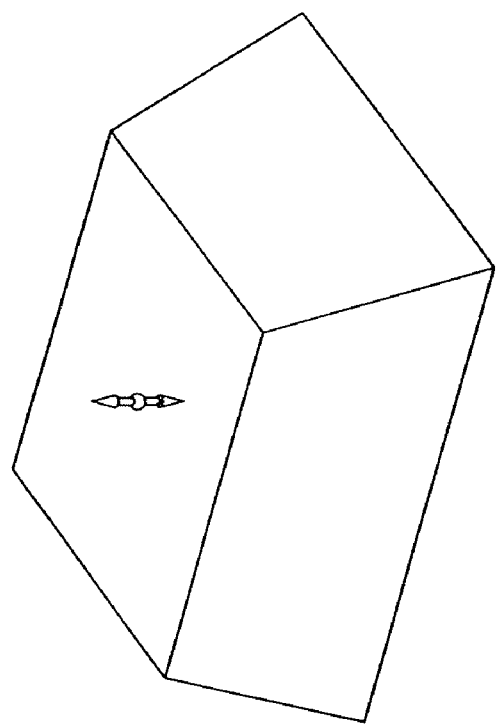

FIG. 5*a* shows a solid, with the top face selected using the Pull tool. FIG. 5*b* shows the solid after the user has modified the solid by dragging the top face using the Pull tool. The side faces maintain their influence as the face is pulled.

Figure 6B:
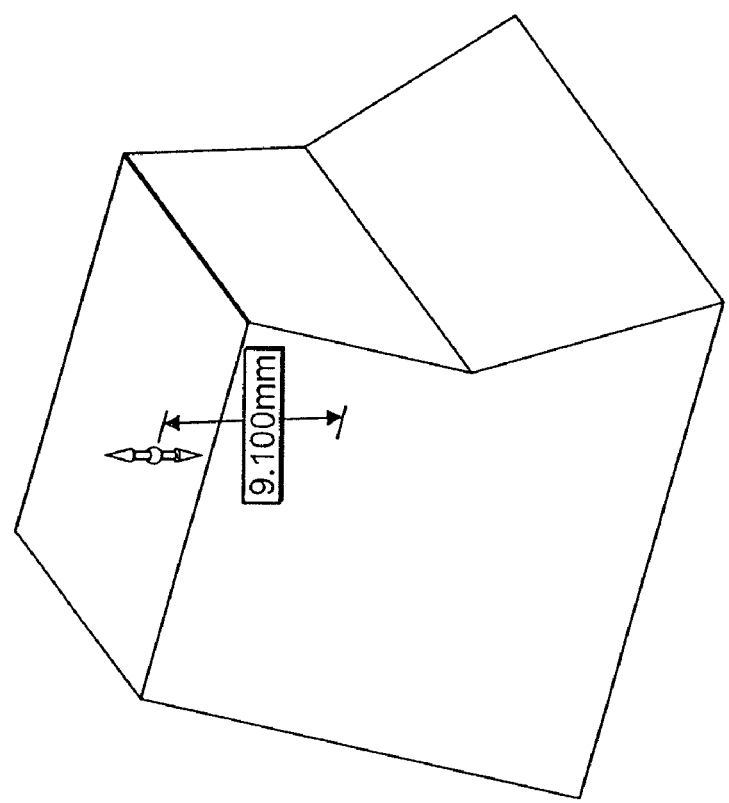
FIGS. 6 a-b show a user modifying a solid by pulling a face and edge with the Pull tool.
Figure 6A:
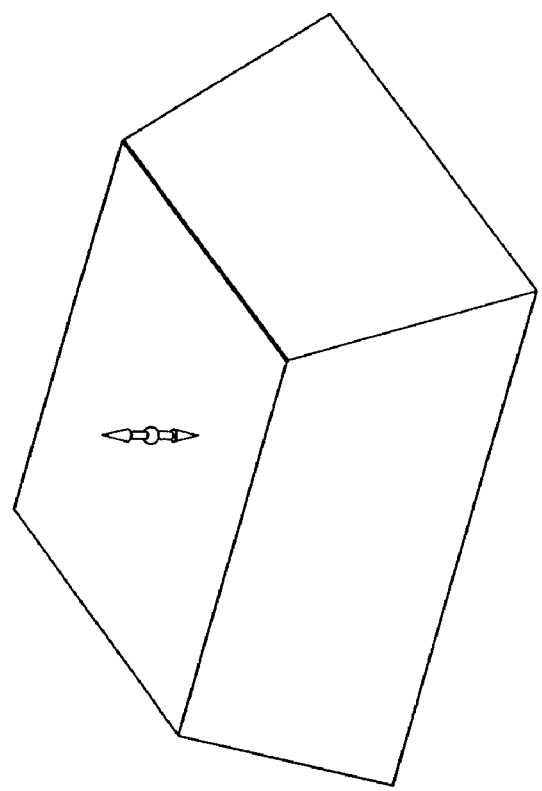

FIG. 6*a* shows a solid with the top face and one edge of the face selected using the Pull tool. FIG. 6*b* shows the solid after the user has modified it by dragging the top face using the Pull tool. The influence of the face that shares the selected edge is ignored, and a new face is generated with a normal perpendicular to the pull direction.

Figure 7B:
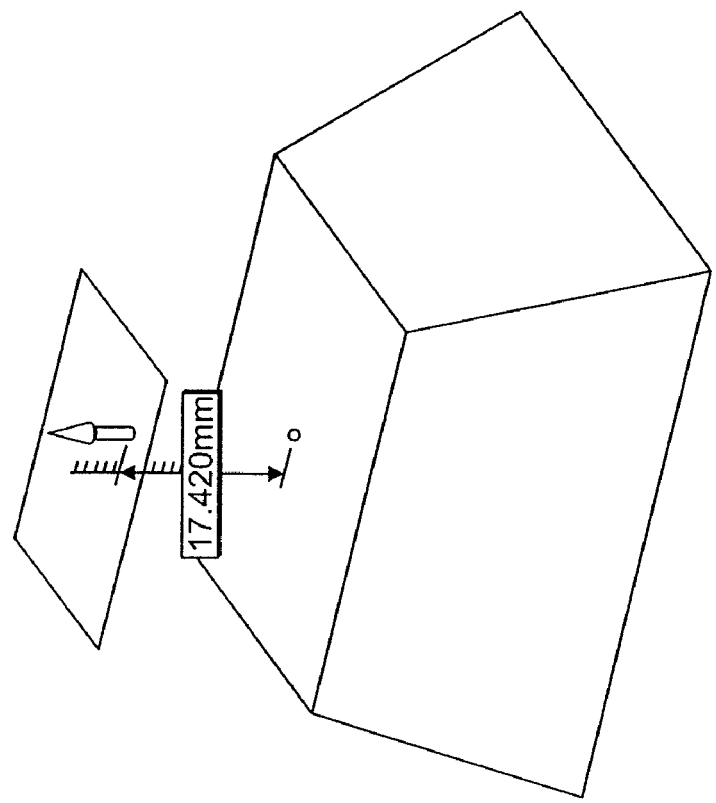
FIGS. 7 a-b show a user copying a face to create a surface with the Pull tool.
Figure 7A:
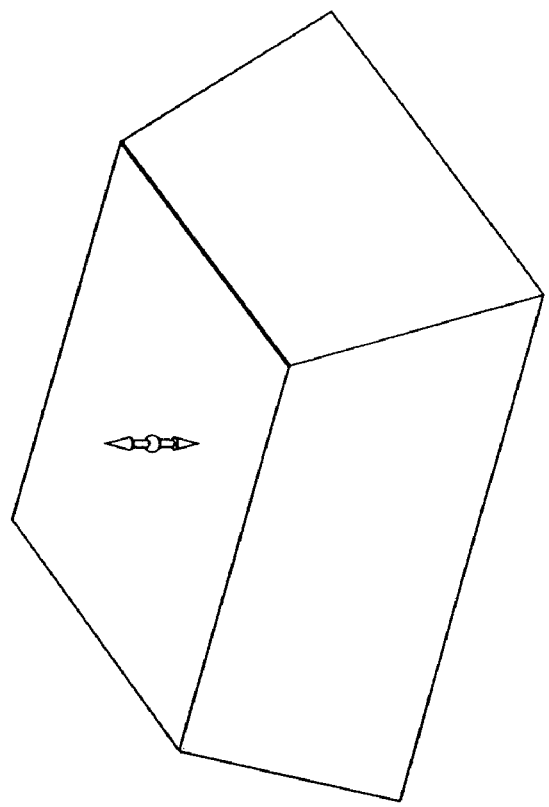

FIG. 7a shows a solid with the top face and one edge of the face selected using the Pull tool 412. FIG. 7b shows the surface created when the user drags with the Ctrl key to copy the selected face. As in FIGS. 6 a-b, the influence of the face that shares the selected edge is ignored, so that the new surface appears just as it would have if the face had been pulled instead of copied.

Figure 8B:
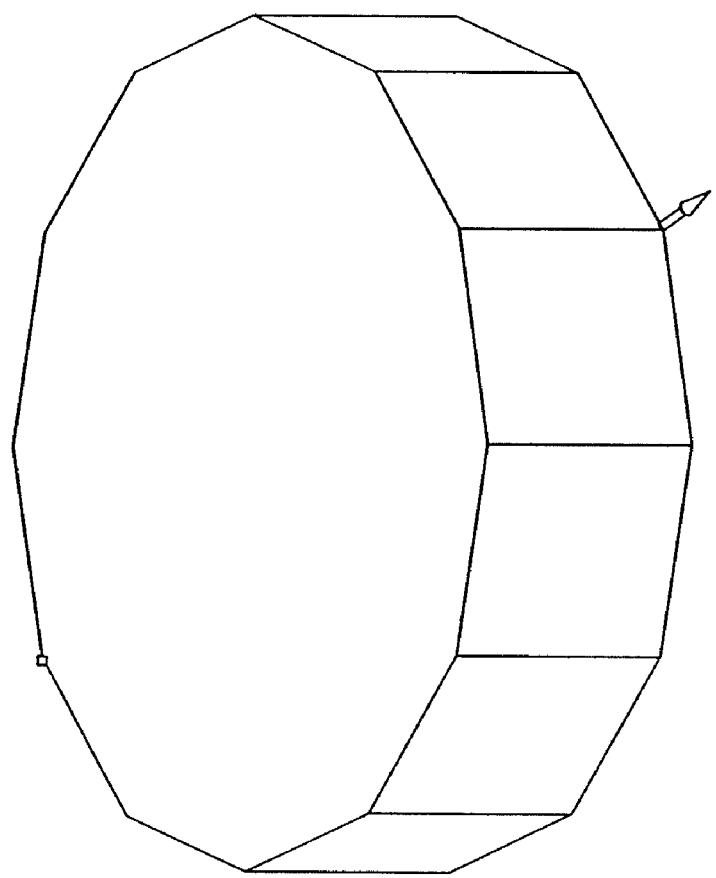
FIGS. 8 a-b show a user scaling a solid with the Pull tool.
Figure 8A:
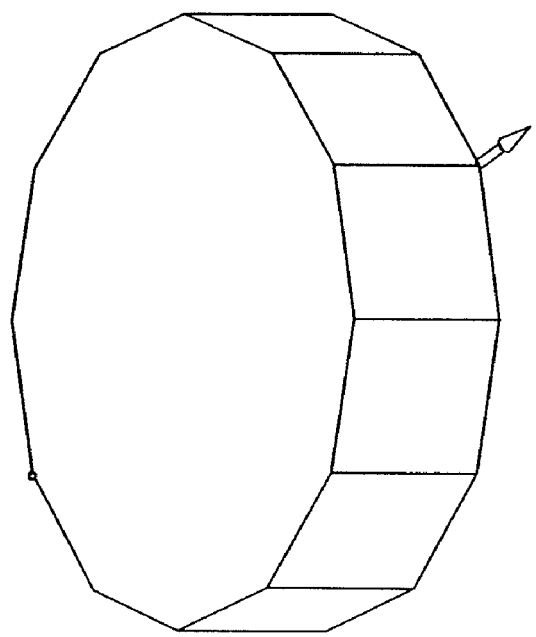

FIG. 8a shows all the faces of a solid selected and a vertex secondary selected for use as an origin using the Pull tool. FIG. 8b shows the solid scaled around the origin when the user drags with the Pull tool.

Figure 9B:
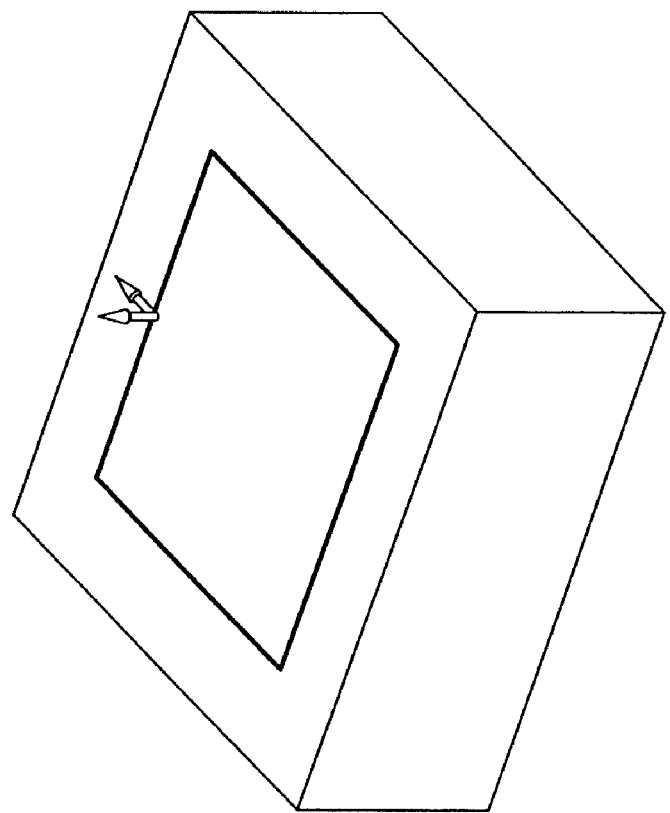
FIGS. 9 a-b show a user offsetting edges with the Pull tool.
Figure 9A:
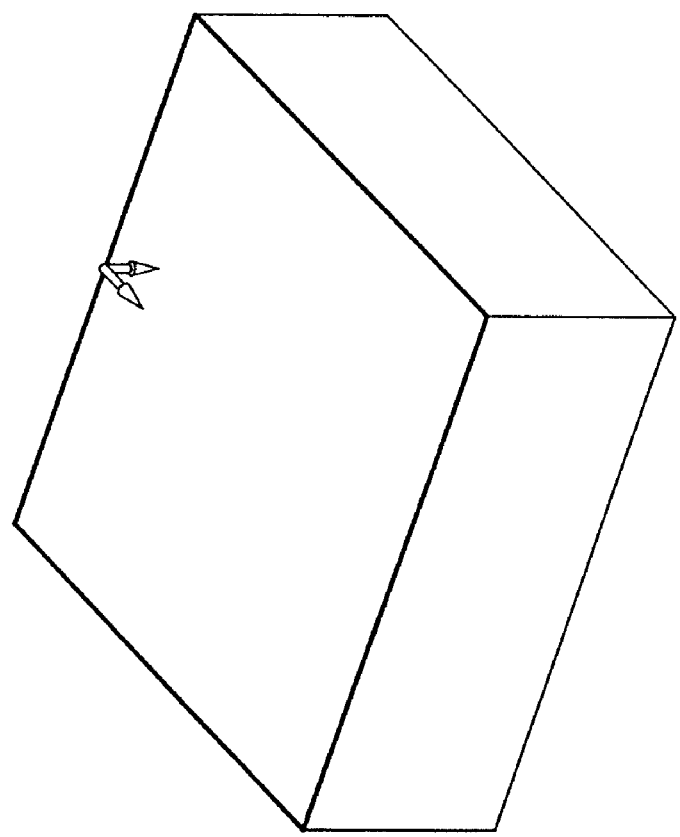

FIG. 9a shows a solid with all the edges of the top face selected using the Pull tool. FIG. 9b shows the new edge created after the user drags the edge toward the center of the face using the Pull tool. This action offsets the edge.

Figure 10B:
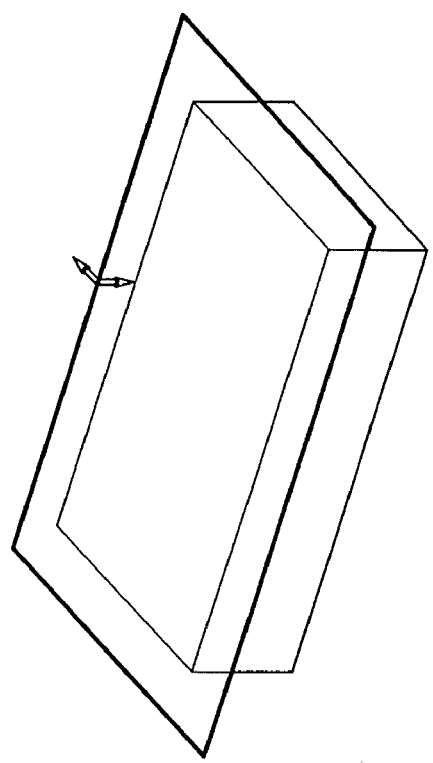
FIGS. 10 a-b show a user extruding an edge with the Pull tool.
Figure 10A:
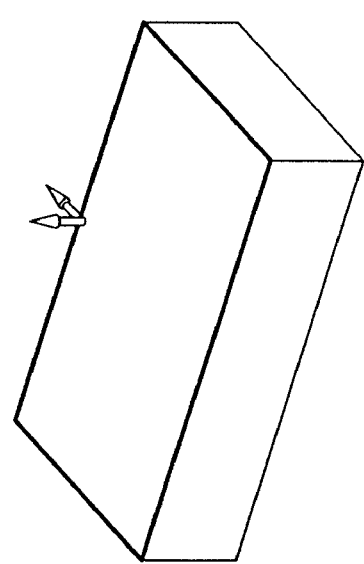

FIG. 10a shows a solid, with all the edges of the top face selected using the Pull tool. FIG. 10b shows the new edge created after the user drags the edge away from the face using the Pull tool. This action results in a new surface (an extruded edge).

Figure 11B:
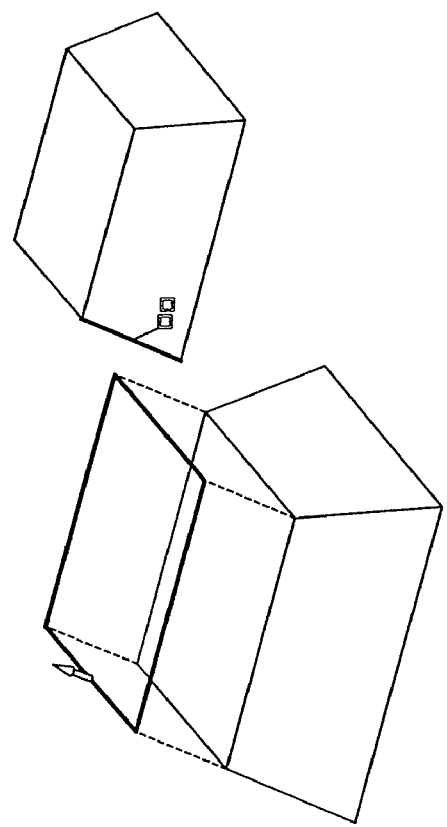
FIGS. 11 a-b show a user extruding an edge in a selected direction with the Pull tool.
Figure 11A:
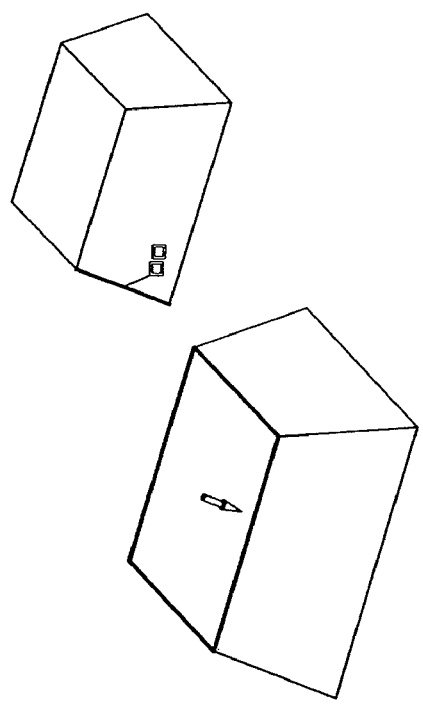

FIG. 11a shows a solid, with all the edges of the top face selected, and the edge of a second solid secondary selected as a direction using the Pull tool. FIG. 11b shows the new edge created after the user drags the edge in the selected direction using the Pull tool. This action results in a new surface (an extruded edge).

Figure 12B:
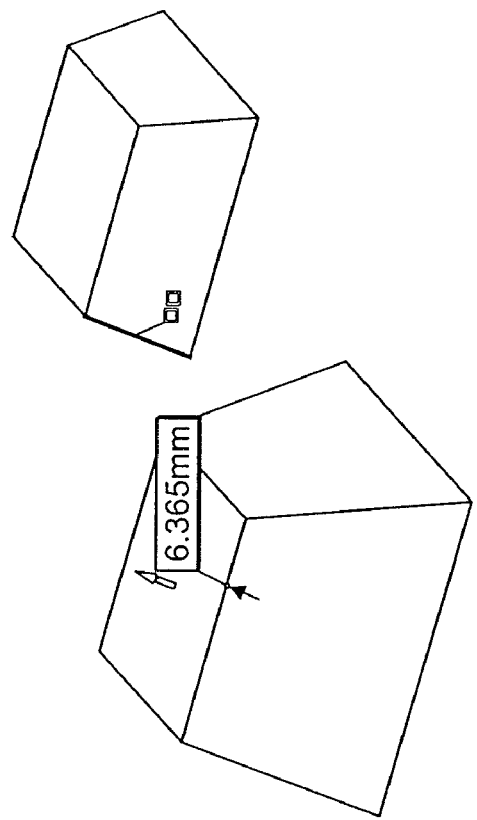
FIGS. 12 a-b show a user extruding a face in a selected direction with the Pull tool.
Figure 12A:
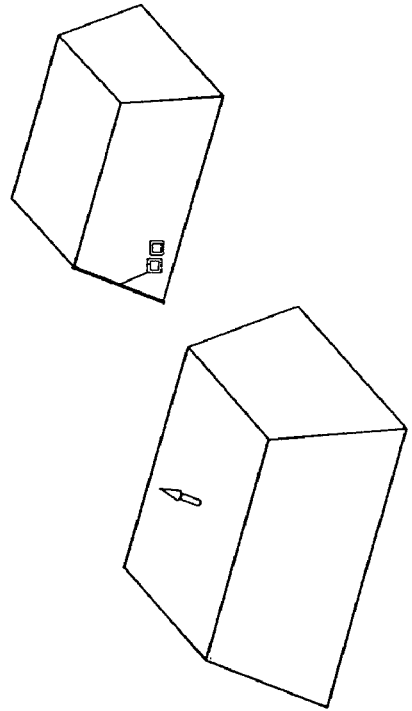

FIG. 12a shows a solid with the top face selected, and the edge of a second solid secondary selected as a direction using the Pull tool. FIG. 12b shows the change to the solid created when the user drags the face in the selected direction using the Pull tool. Note that this action creates a similar result as a standard offset because although the geometry is created in the dimension, it is trimmed by the neighboring faces. However, the dimension is measured along the selected direction.

Figure 13B:
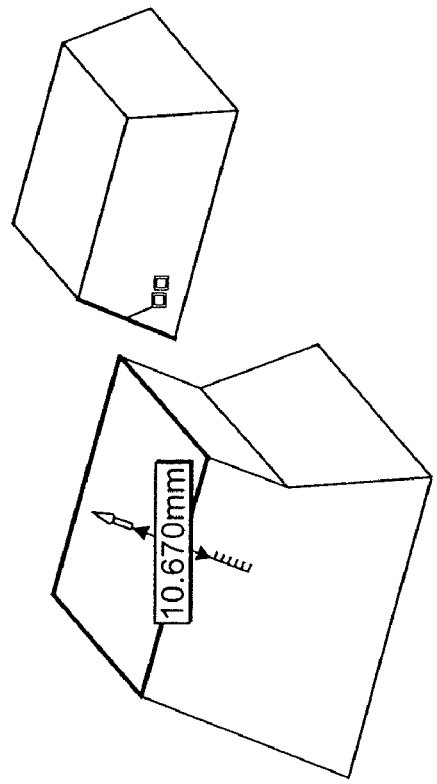
FIGS. 13 a-b show a user extruding a face and edges in a selected direction with the Pull tool.
Figure 13A:
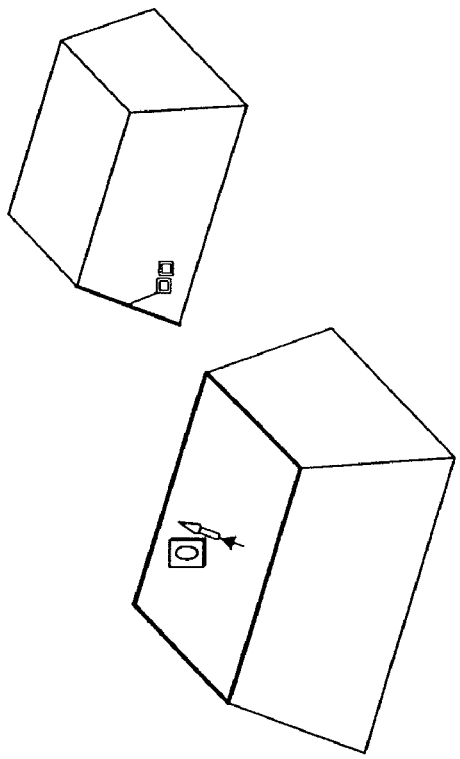

FIG. 13a shows a solid with the top face and all the edges of that face selected, and the edge of a second solid secondary selected as a direction using the Pull tool. FIG. 13b shows the change to the solid created when the user drags the face in the selected direction using the Pull tool. Selecting the edges causes the influence of the neighboring faces to be ignored, resulting in an extrusion along the selected direction. The dimension is also measured along the selected direction.

Figure 14A:
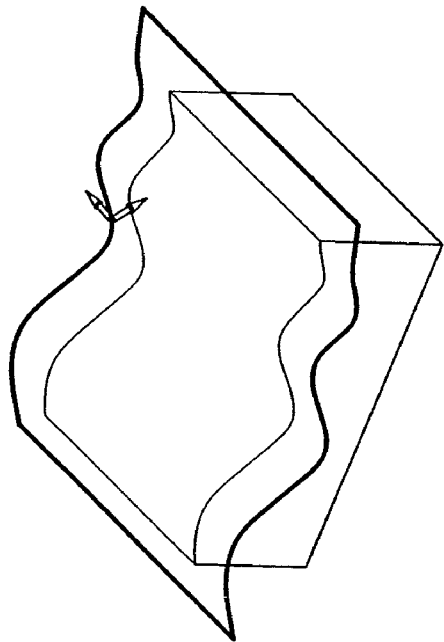
FIGS. 14 a-d show a user extending edges with the Pull tool.
Figure 14B:
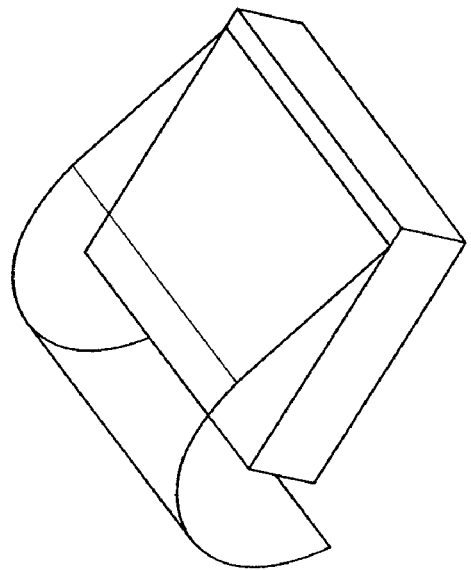
Figure 14C:
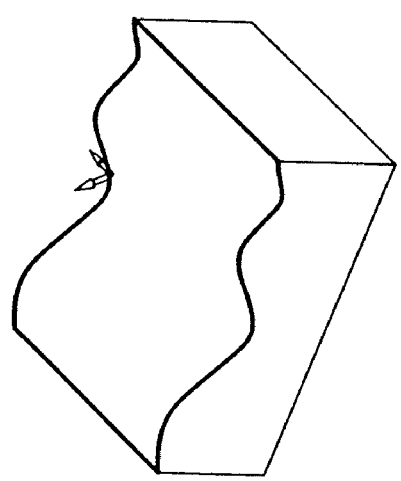
Figure 14D:
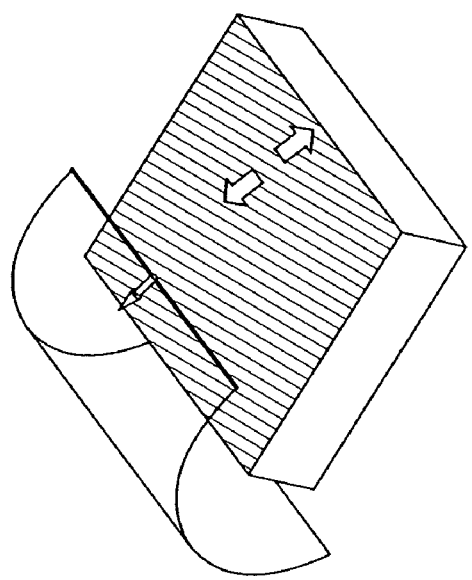

FIG. 14a shows a solid, with all the edges of the top face selected using the Pull tool. FIG. 14b shows the new edges created after the user dragged the edges away from the face using the Pull tool. This action results in a new surface (an extended edge). FIGS. 14c and 14d show an example of the extension of surface edges tangent to a solid face using the Up To sub-tool.

Figure 15B:
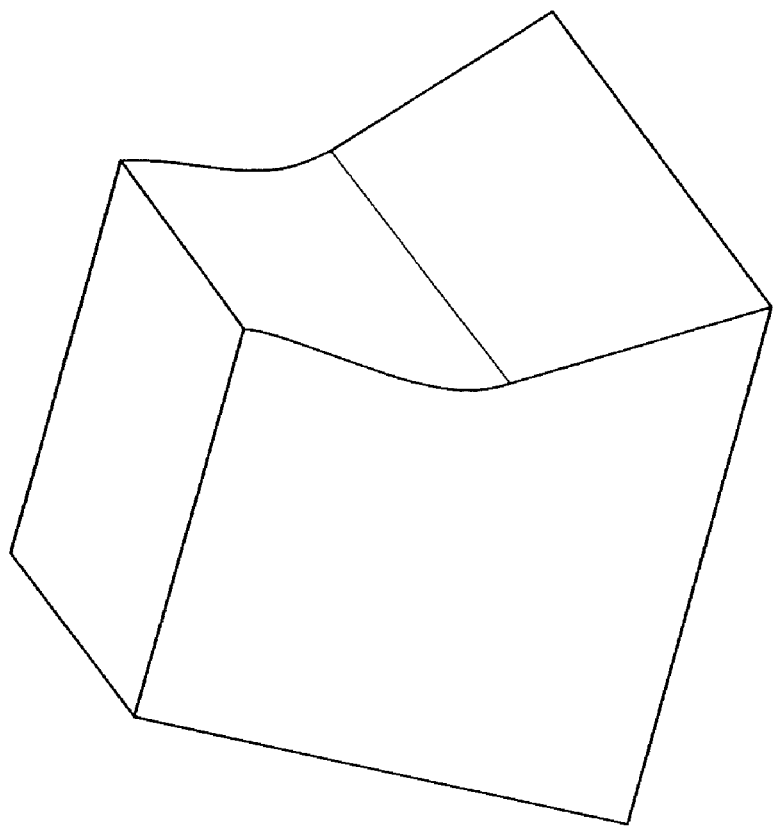
FIGS. 15 a-b show a user creating a new face with the Pull tool's blend function.
Figure 15A:
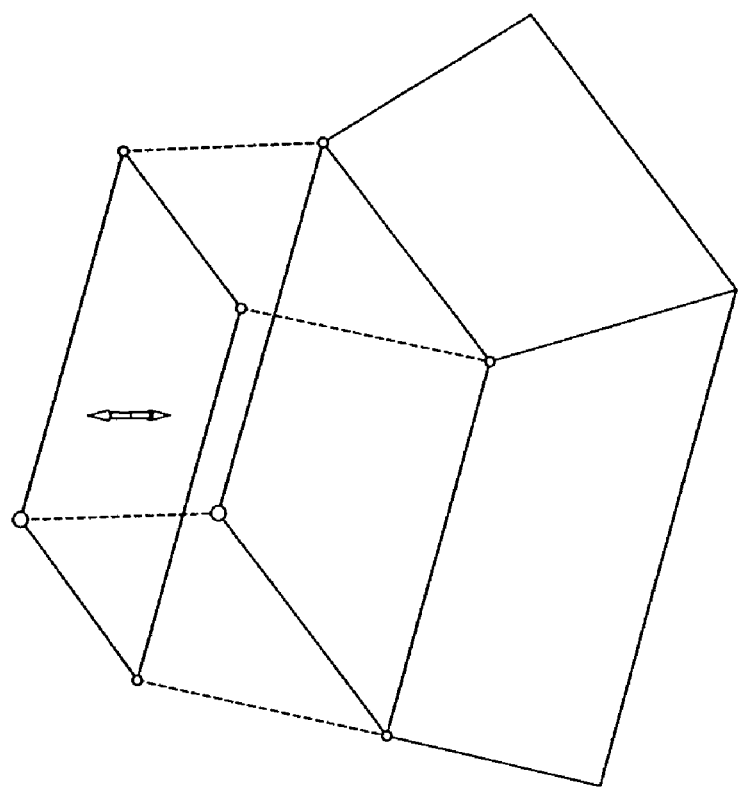

FIG. 15a shows the top face of a solid and a surface face selected using the Pull tool. FIG. 15b shows the new faces created when the user completes the blend operation with the Pull tool, including a smoothly blended face influenced by the neighboring faces.

Figure 16B:
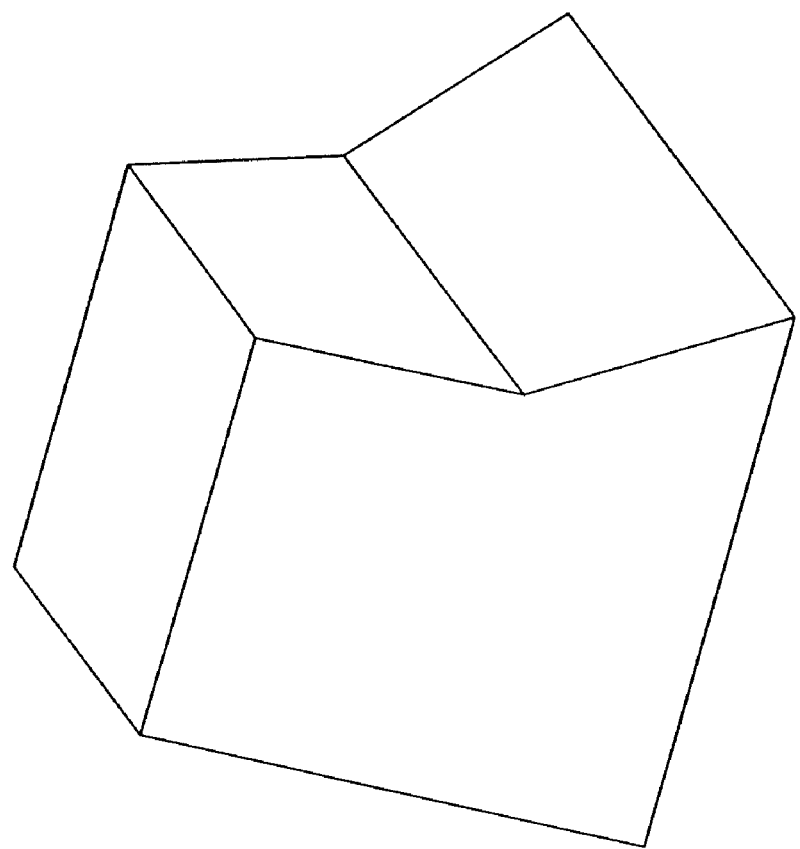
FIGS. 16 a-b show a user creating a blend when a face and edge are selected with the Pull tool.
Figure 16A:
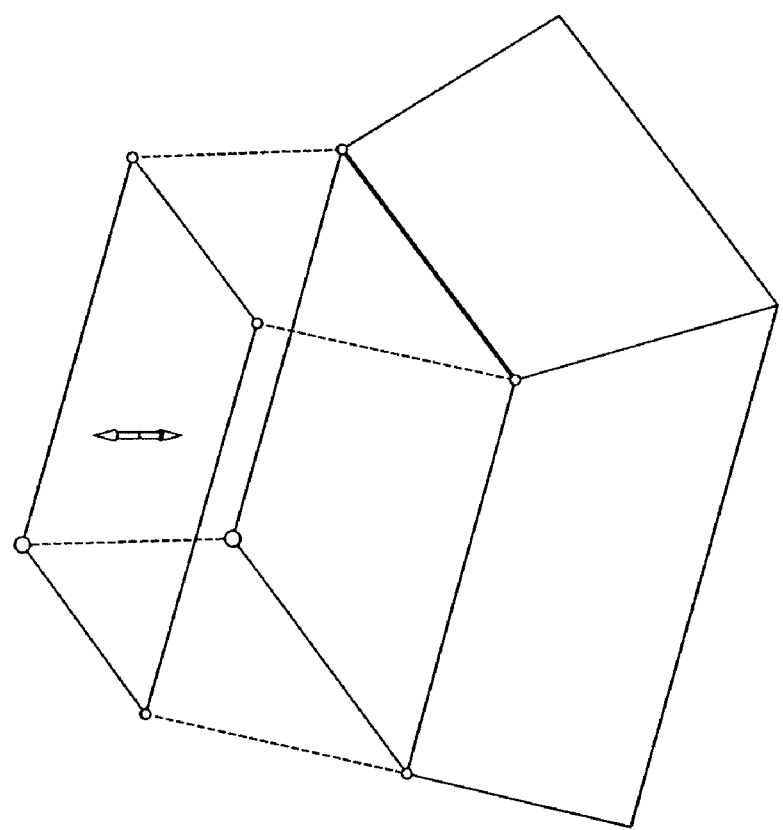

FIG. 16a shows the top face of a solid, one edge of that face, and a surface face selected using the Pull tool. FIG. 16b shows the new faces created when the user completes the blend operation with the Pull tool. A sharp break has been created in the face that shares the selected edge, but all other neighboring faces exert an influence on the faces that were created by the blend function.

Figure 17B:
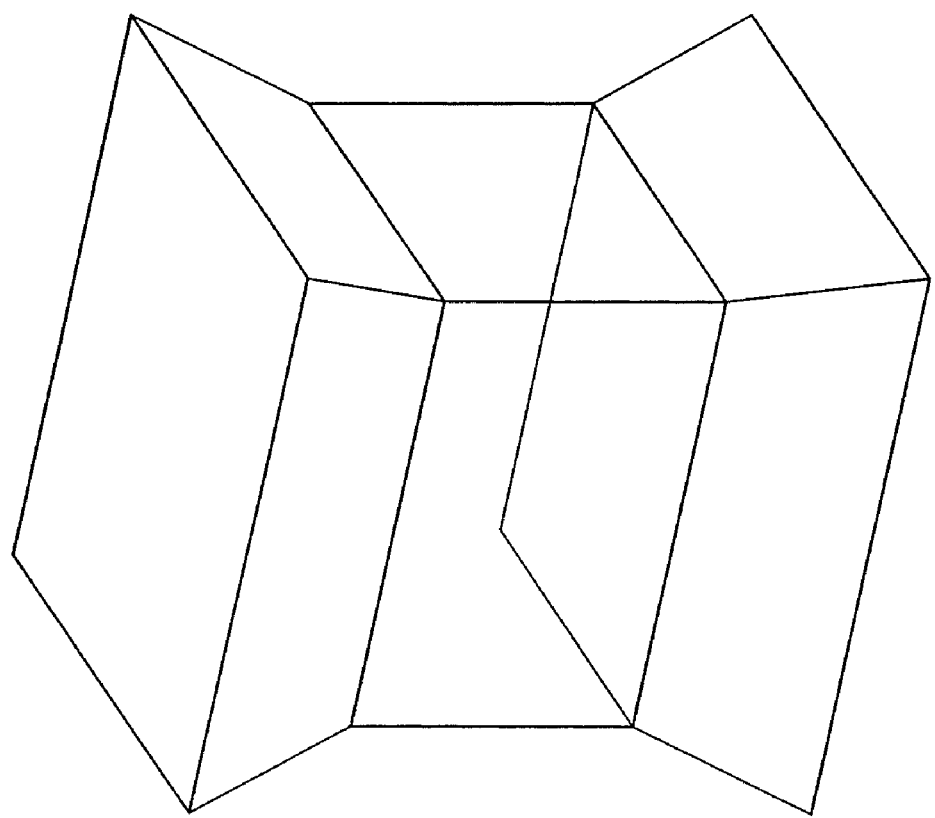
FIGS. 17 a-b show a user creating surfaces by blending between edges with the Pull tool.
Figure 17A:
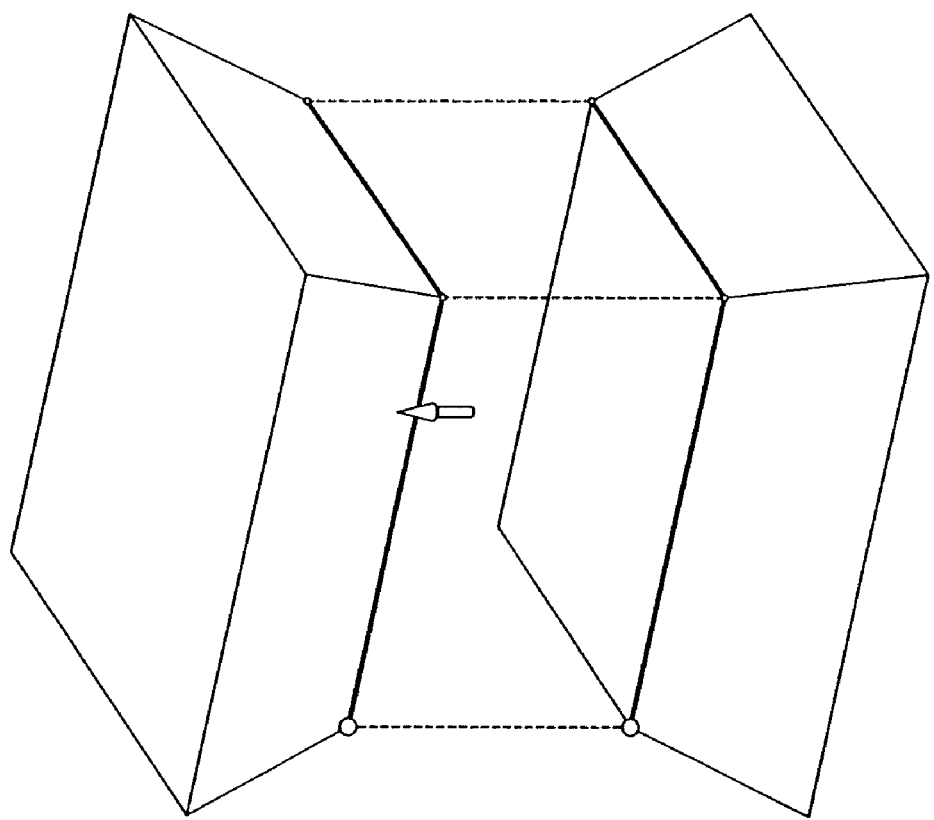

FIG. 17a shows two edges on one face and two edges on another face selected using the Pull tool. FIG. 17b shows the new surfaces created when the user completes the blend operation with the Pull tool.

Figure 18B:
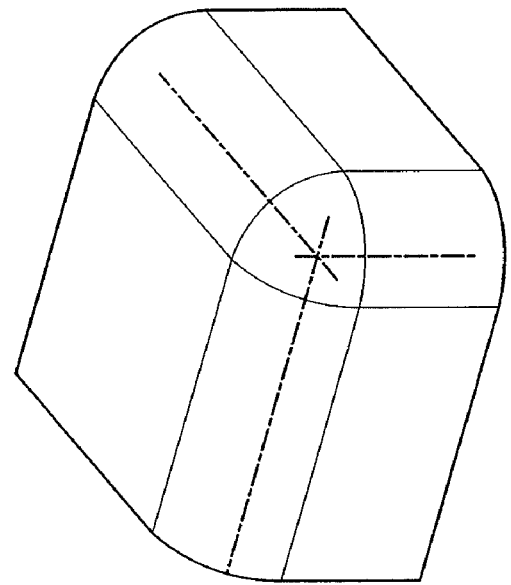
FIGS. 18 a-d show a user creating a surface by blending between edges that form a loop with the Pull tool.
Figure 18D:
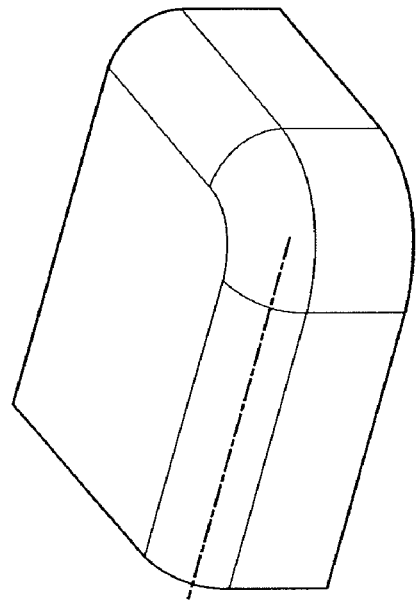
Figure 18A:
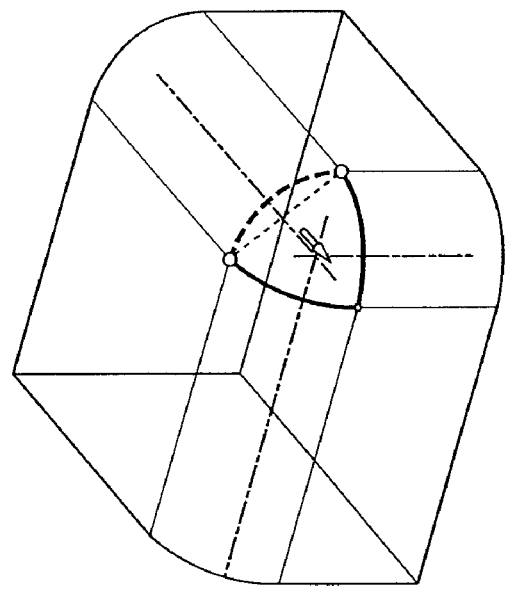

FIG. 18a shows two edges primary selected and one edge secondary selected for use as a blend guide using the Pull tool.

Figure 18C:
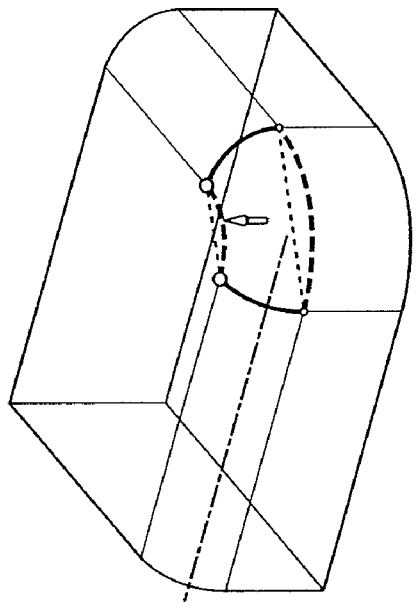

FIG. 18b shows the new face created when the user completes the blend operation with the Pull tool. FIG. 18c shows two edges primary selected and two edges secondary selected for use as blend guides. FIG. 18d shows the resulting blended face.

Figure 19B:
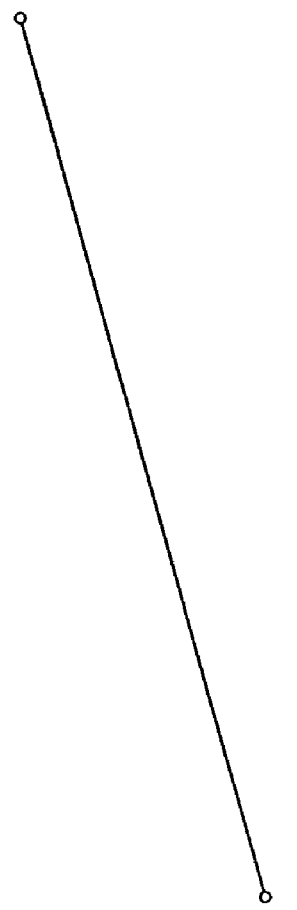
FIGS. 19 a-b show a user creating a 3D curve by blending between points with the Pull tool.
Figure 19A:
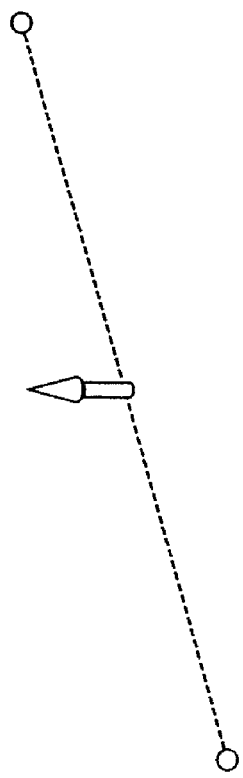

FIG. 19a shows two points selected using the Pull tool. FIG. 19b shows the new 3D curve created when the user completes the blend operation with the Pull tool.

Figure 20A:
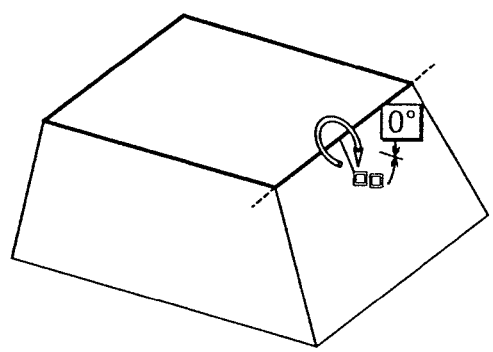
FIGS. 20 a-d show a user creating a rotated solid with all side influences ignored and rotating edges to form surfaces with the Pull tool.
Figure 20B:
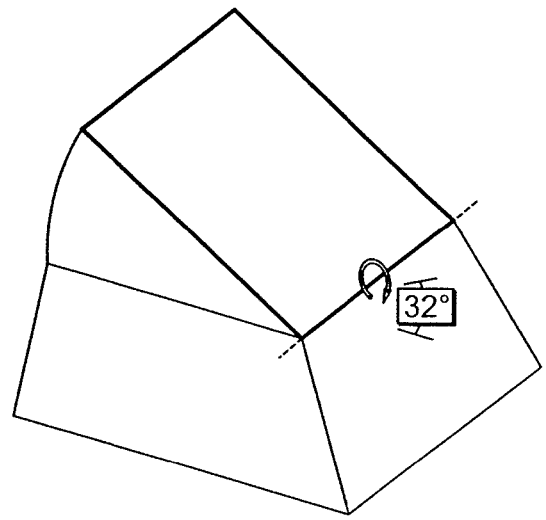
Figure 20C:
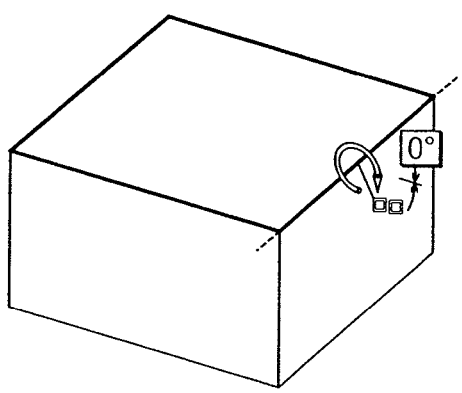
Figure 20D:
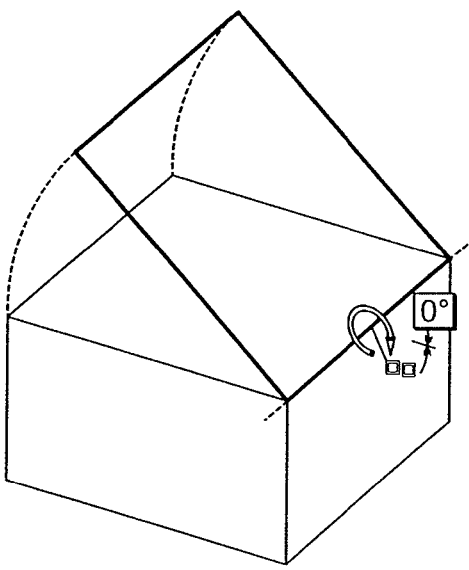

FIG. 20a shows a solid with the top face and all edges of the face selected for modification, and a straight edge selected as a rotation axis using the Pull tool. FIG. 20b shows a rotationally-symmetric solid added to the previous model by the Pull tool, with no influence from the neighboring faces. This action can also be performed on only edges to form surfaces, as shown in FIGS. 20c and 20d.

Figure 21B:
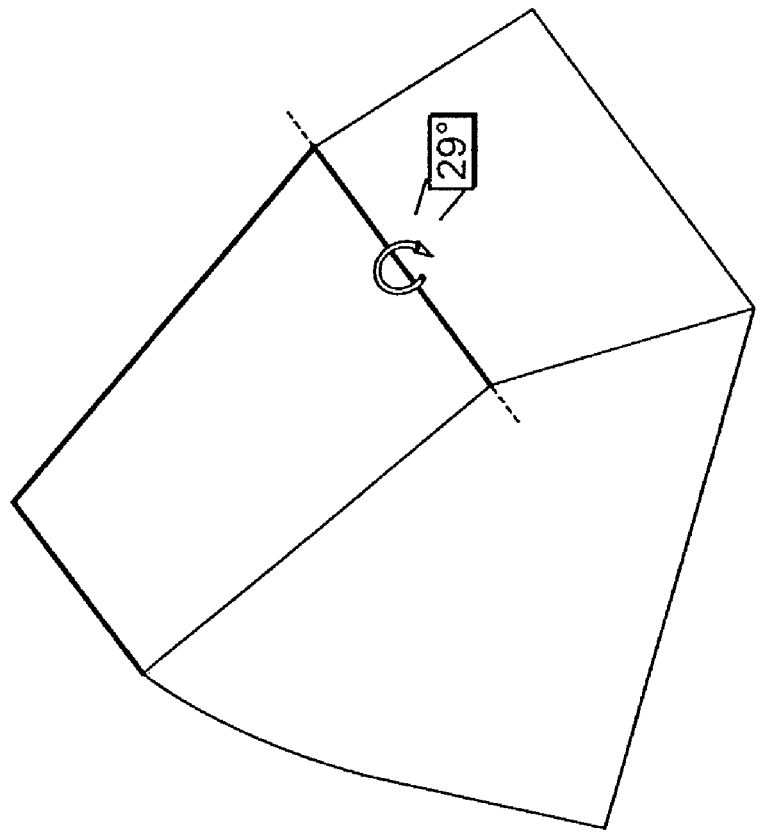
FIGS. 21 a-b show a user creating a rotated solid that keeps the influence of one side using the Pull tool.
Figure 21A:
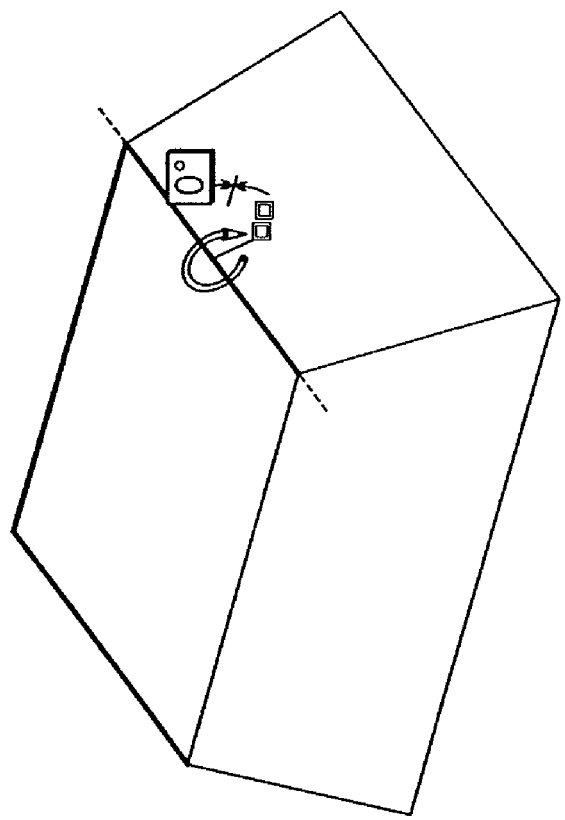

FIG. 21a shows a solid with the top face and all but one edge of the face selected for modification, and a straight edge selected as a rotation axis using the Pull tool. FIG. 21b shows a rotated solid added to the previous model by the Pull tool. The new side face that shares the unselected edge with the top face is determined by the influence of the original side face.

Figure 22B:
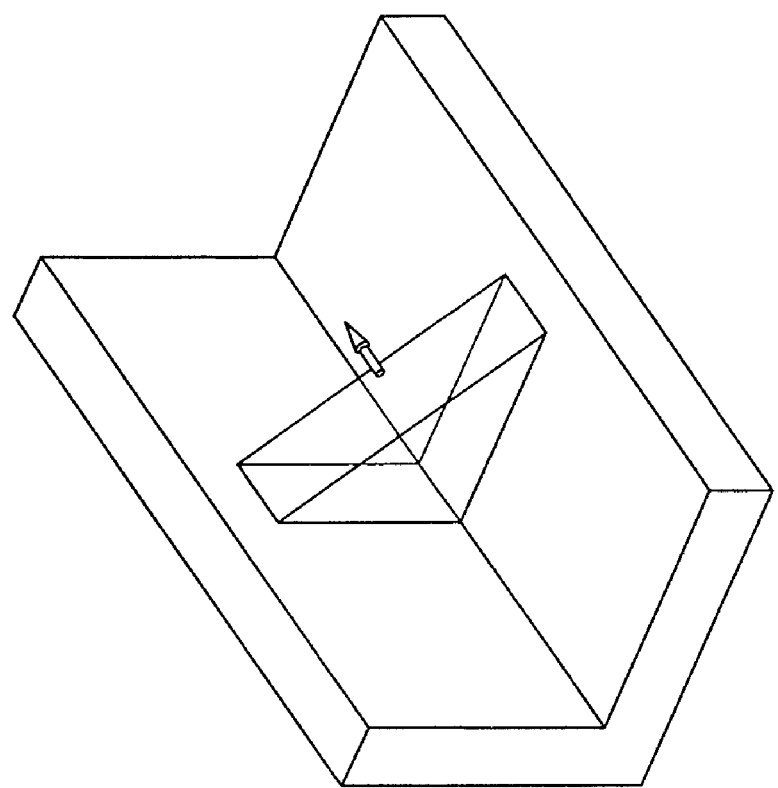
FIGS. 22 a-b show a user creating a planar rib using the Pull tool.
Figure 22A:
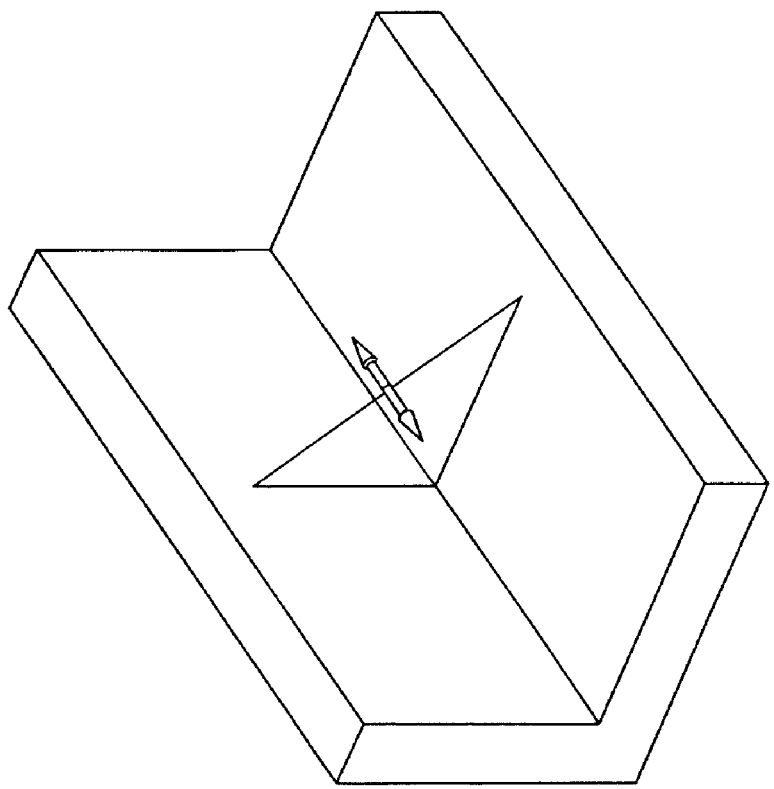

FIG. 22a shows a triangular planar surface selected for modification using the Pull tool 412. FIG. 22b shows the planar offset rib created when the user drags with the Pull tool.

Figure 23B:
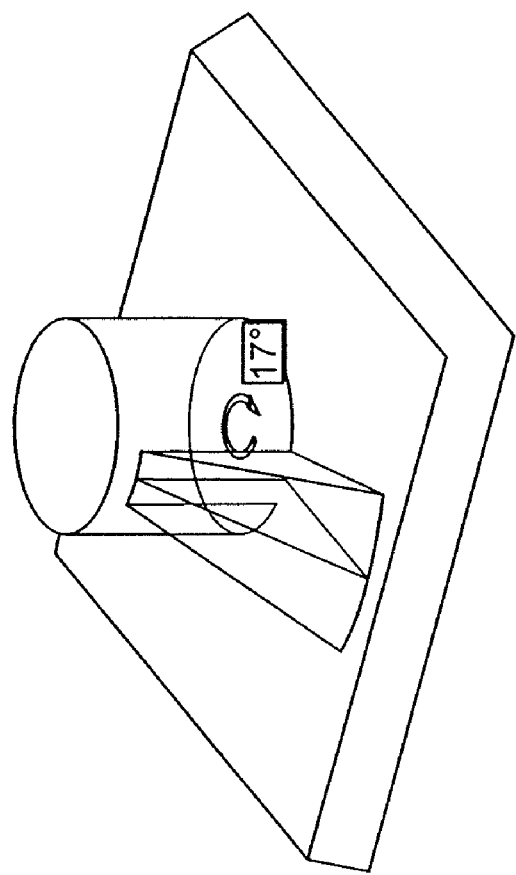
FIGS. 23 a-b show a user creating a rotational rib with the Pull tool.
Figure 23A:
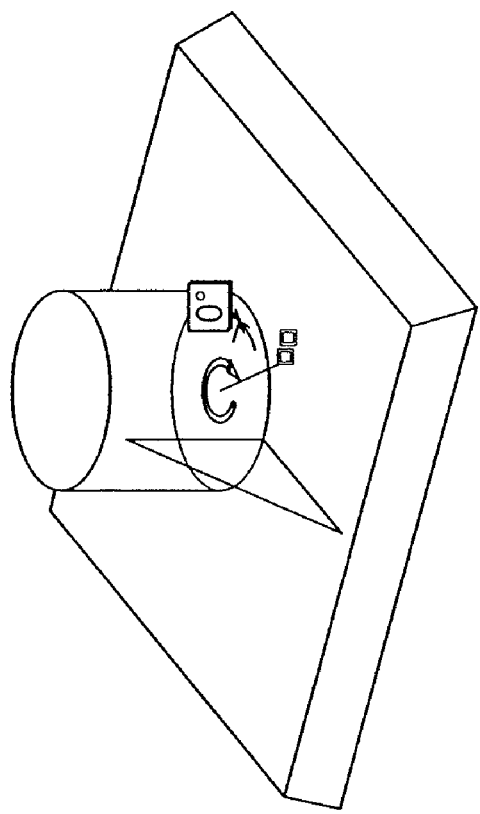

FIG. 23a shows a triangular planar surface selected for modification, and a cylindrical surface selected as a rotation axis using the Pull tool. FIG. 23b shows the solid created when the user drags with the Pull tool. The opposing faces of the new solid form the angle requested by the user during the drag.

Figure 24B:
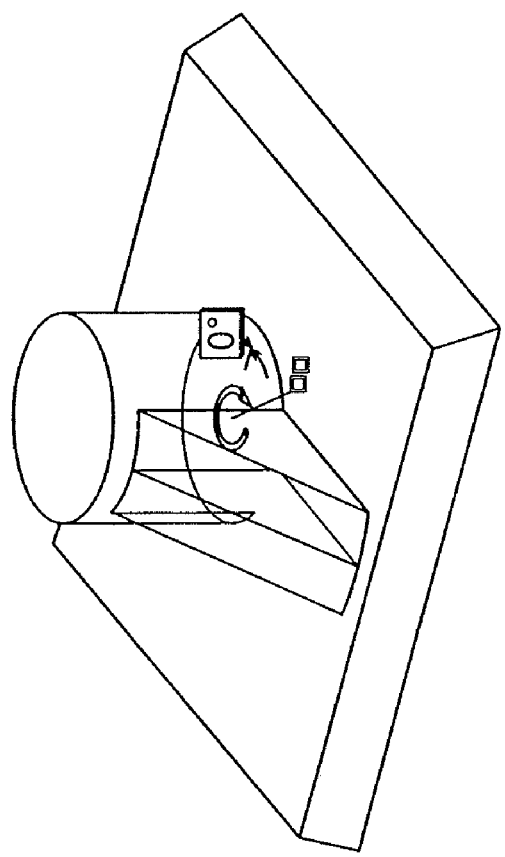
FIGS. 24 a-b show a user creating an angular rib with the Pull tool.
Figure 24A:
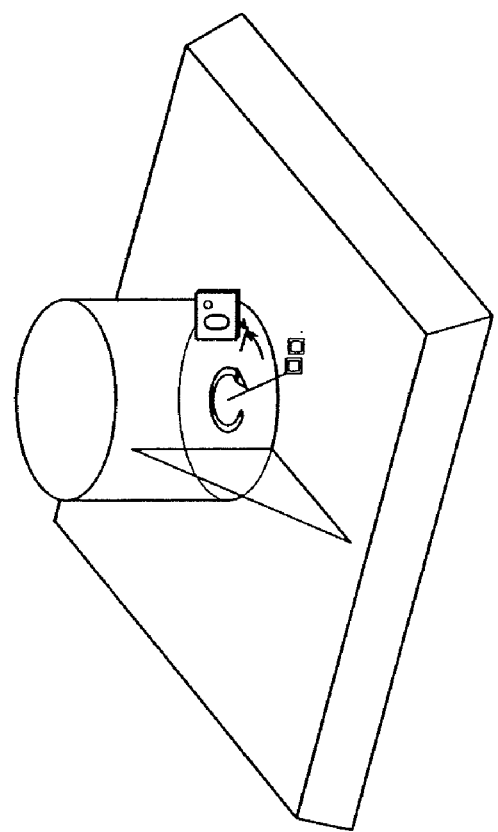

FIG. 24a shows a triangular planar surface selected for modification, and a cylindrical surface selected as a rotation axis using the Pull tool 412. FIG. 24b shows the solid created when user drags with the Both Sides option to keep the opposite faces of the new solid parallel to each other.

Figure 25A:
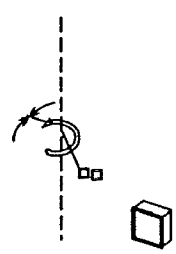
FIGS. 25 a-f show a user creating helices with the Pull tool.
Figure 25B:
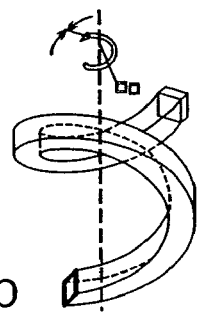
Figure 25C:
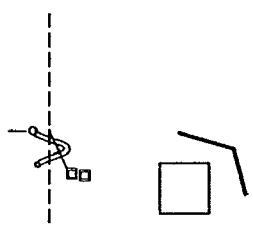
Figure 25D:
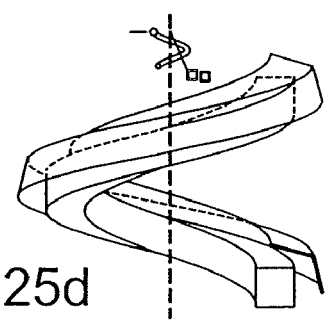
Figure 25E:
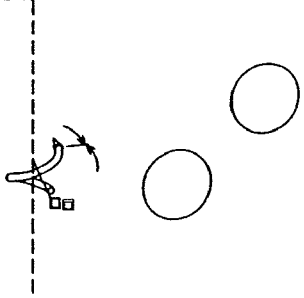
Figure 25F:
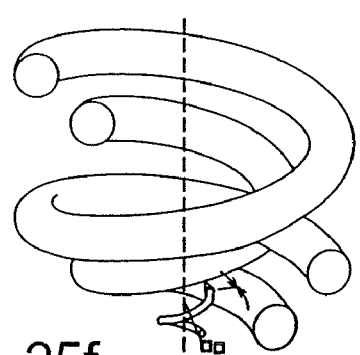

FIG. 25a shows an edge loop selected and an axis secondary selected using the Pull tool. When the Helix option is selected, FIG. 25b shows the helix created with the height and pitch specified by the user. The user can also dynamically create the helix by dragging with the Pull tool. FIGS. 25c and 25d show the solid and surface helices created when a face and two edges are selected, and FIGS. 25e and 25f show the helices created when multiple faces are selected.

FIG. 26a shows an edge primary selected and a path secondary selected using the Pull tool. FIG. 26b shows the swept surface created when the user drags with the Pull tool. FIGS. 26c and 26d show the swept surface created when a second path is secondary selected. FIGS. 26e and 26f show the swept surface created with the when a second path and an axis (to be used as a rotational reference) are secondary selected.

Figure 27B:
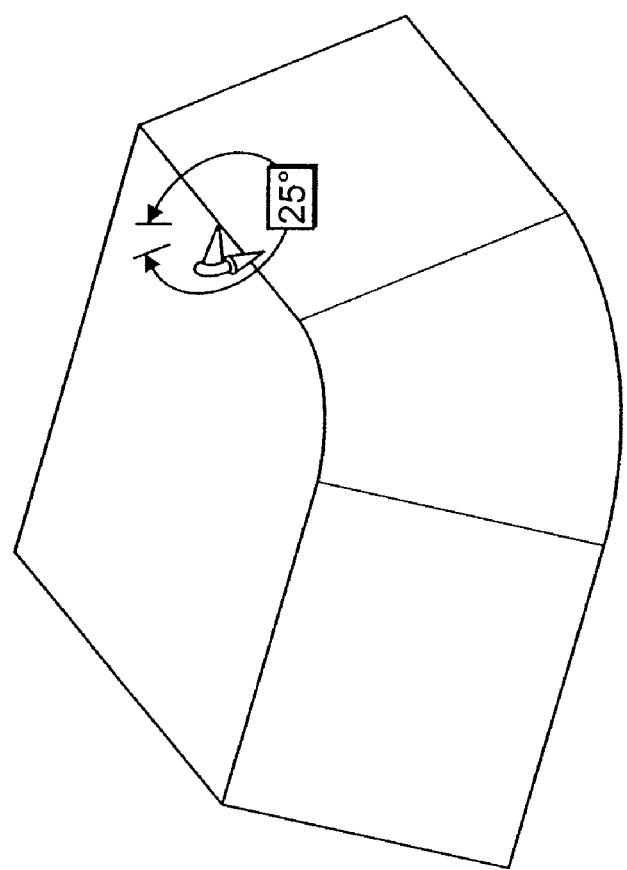
FIGS. 27 a-b show a user pivoting faces about a planar hinge created by a face with the Pull tool.
Figure 27A:
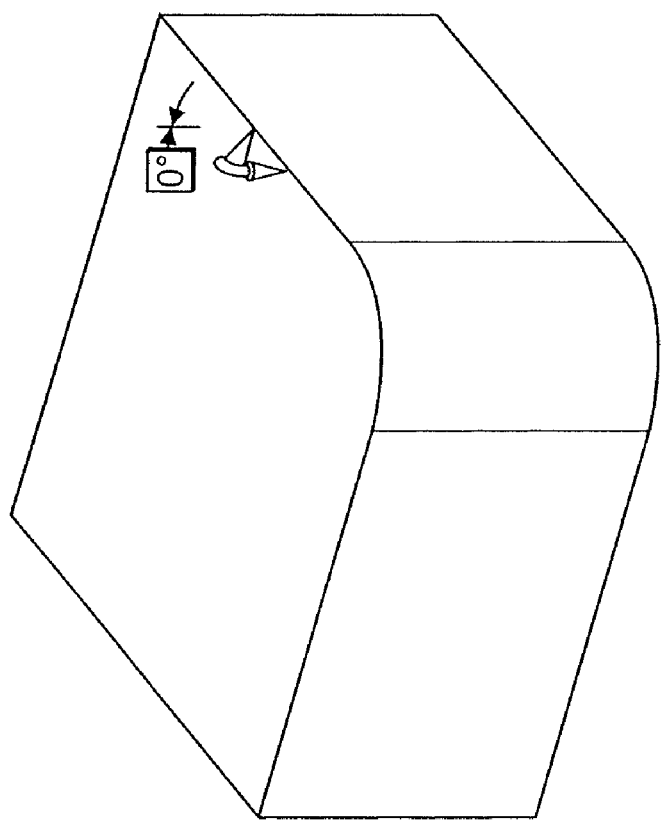

FIG. 27a shows three tangent faces selected for modification, and a planar face selected as a planar hinge using the Pull tool. FIG. 27b shows the selected faces pivoted about the line formed where each face intersects the planar hinge.

Figure 36B:
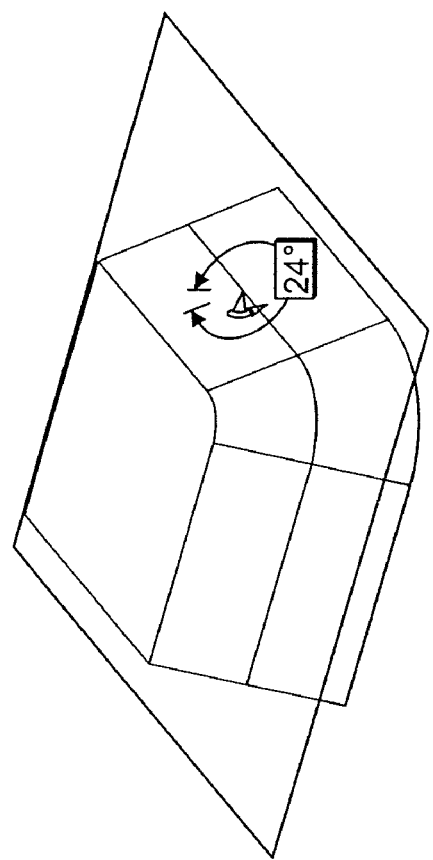
FIGS. 36 a-b show a user pivoting faces about a planar hinge created by a plane that intersects the solid using the Pull tool.
Figure 36A:
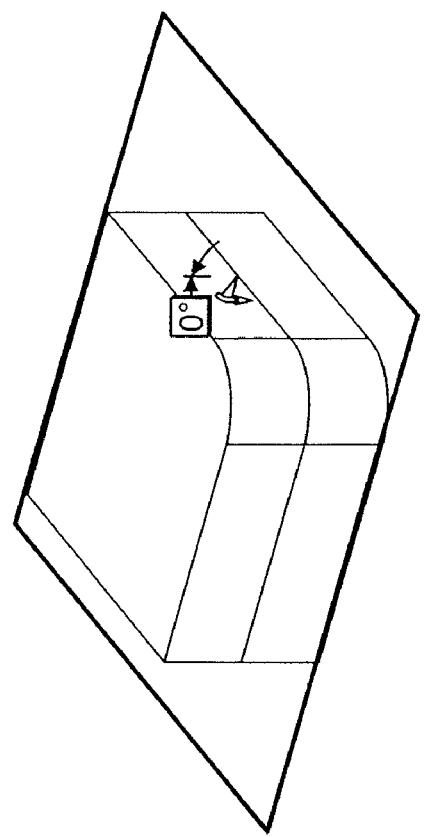

FIG. 36a shows three tangent faces selected for modification, and a plane that intersects the solid selected as a planar hinge using the Pull tool. FIG. 36b shows the selected faces pivoted about the line formed where each face intersects the planar hinge.

Figure 37B:
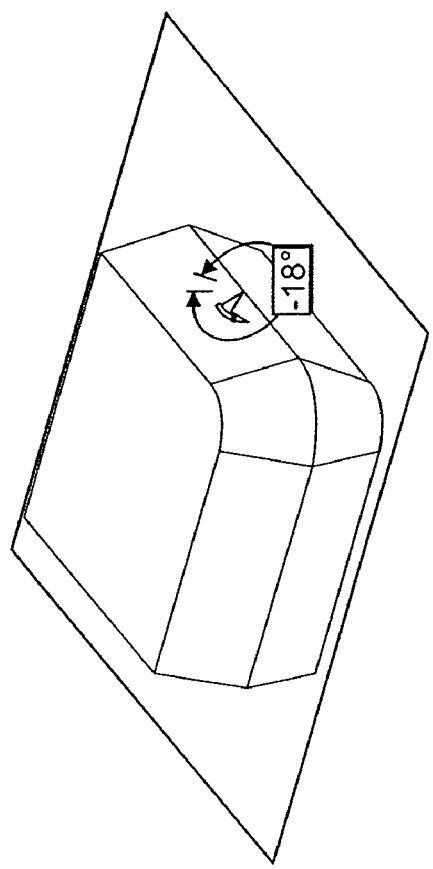
FIGS. 37 a-b show a user pivoting faces with the Pull tool when the Split Faces option is selected.
Figure 37A:
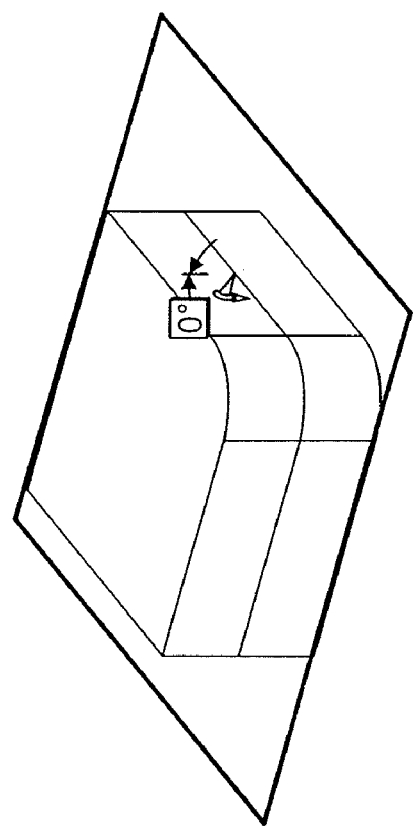

FIG. 37a shows three tangent faces selected for modification, and a plane that intersects the solid selected as a planar hinge using the Pull tool. In this case, the user also selects an option to split the result of the pull action. FIG. 37b shows the selected faces pivoted about the line formed where each face intersects the planar hinge.

Figure 38:
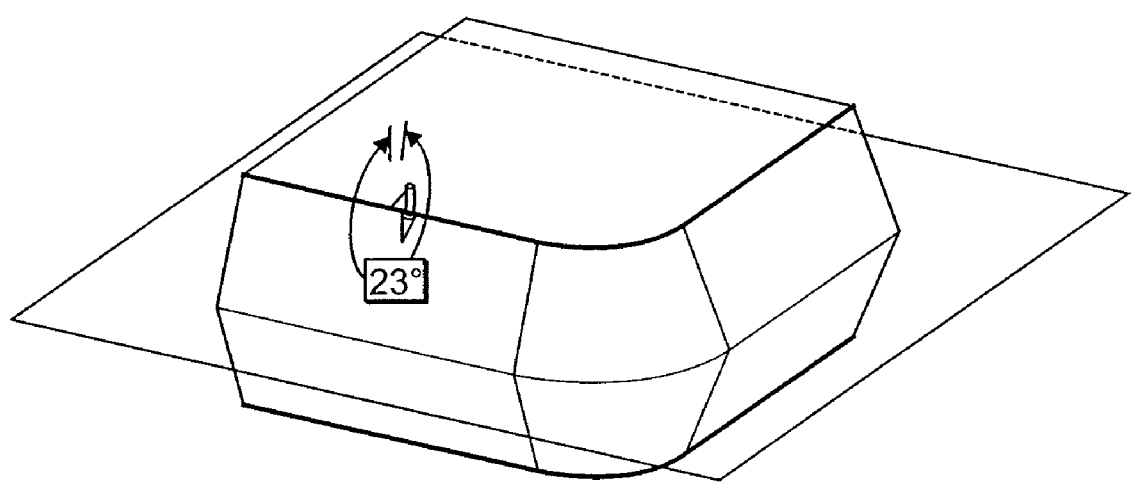
FIG. 38 shows a user pivoting faces about a planar hinge and two 2D edge hinges using the Pull tool.

FIG. 38 shows three tangent faces selected for modification. A plane that intersects the solid is selected as a planar hinge and the top and bottom three tangent edges are also selected as 2D hinges using the Pull tool. FIG. 38 shows the selected faces pivoted about the lines formed where each face intersects the planar hinge and the 2D hinges.

Figure 39:
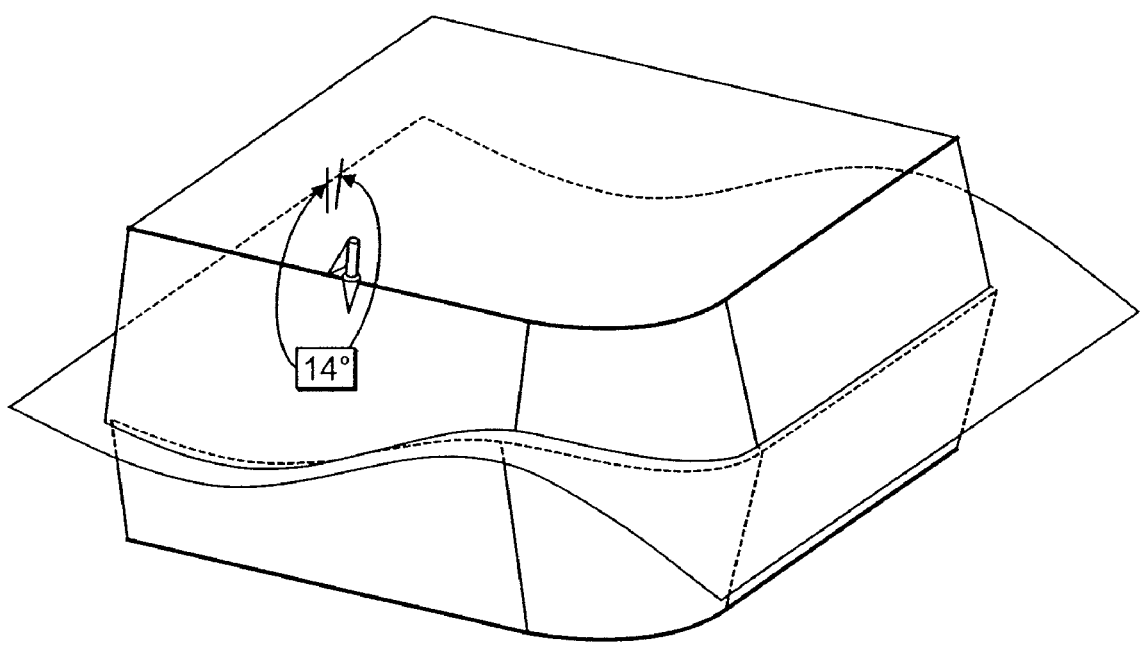
FIG. 39 shows a user pivoting faces about a split surface which defines the area in which discontinuities between the differently-angled faces are resolved because of the two 2D edge hinges having been selected using the Pull tool.

FIG. 39 shows three tangent faces selected for modification. A non-planar surface that intersects the solid is selected to define the area in which discontinuities between the differently-angled faces will be resolved and the top and bottom three tangent edges are also selected as 2D hinges using the Pull tool. FIG. 39 shows the selected faces pivoted about the lines formed where each face intersects the 2D hinges and diverging at the surface.

Figure 40B:
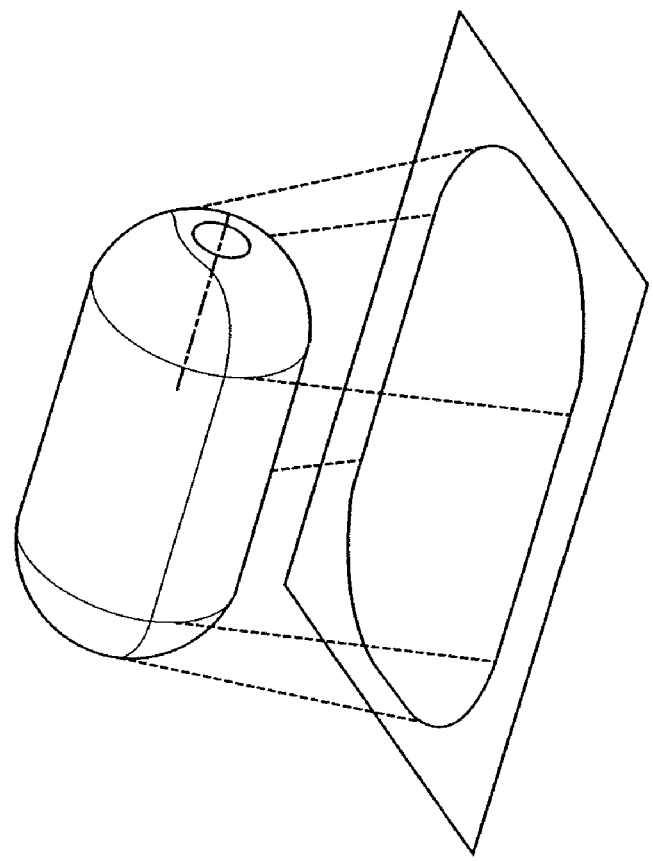
FIGS. 40 a-b show a user draping a surface over a solid using the Pull tool.
Figure 40A:
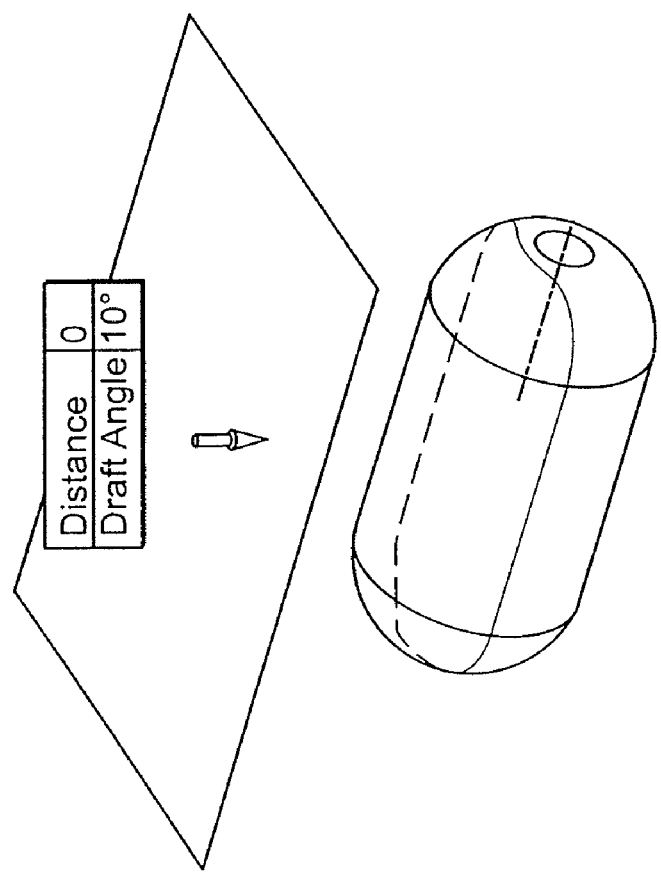

FIG. 40a shows a surface primary selected for modification and a solid secondary selected with the Pull tool. FIG. 40b shows the surface created when the user drags with the Pull tool to drape the surface over the solid.

Figure 41B:
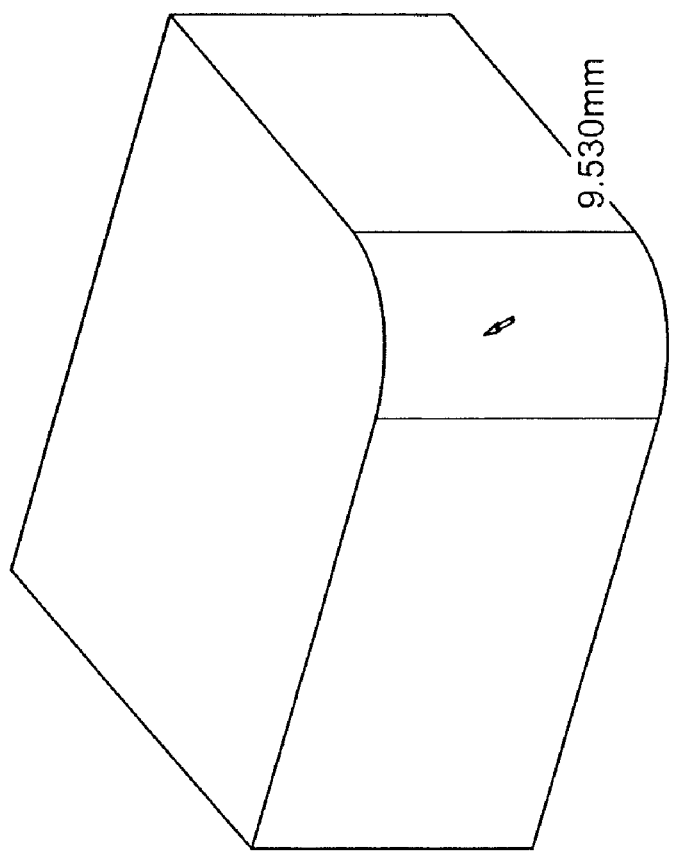
FIGS. 41 a-b show a user rounding an edge with the Pull tool.
Figure 41A:
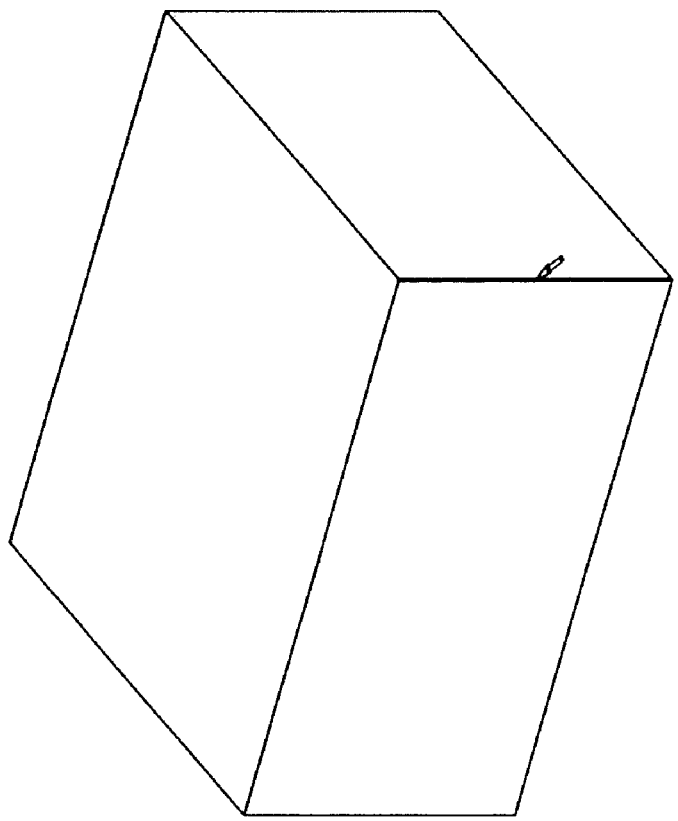

FIG. 41a shows the edge of a solid selected for modification with the Pull tool 412. FIG. 41b shows the round created when the user drags with the Pull tool with the Round option enabled.

Figure 42B:
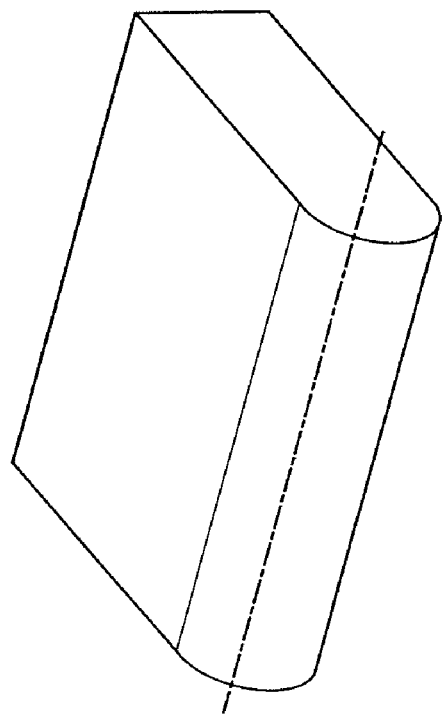
FIGS. 42 a-b show a user creating a full round using the Pull tool.
Figure 42D:
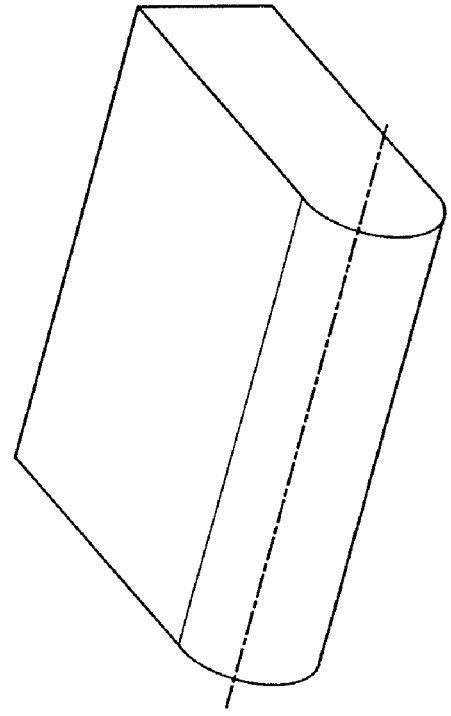
Figure 42A:
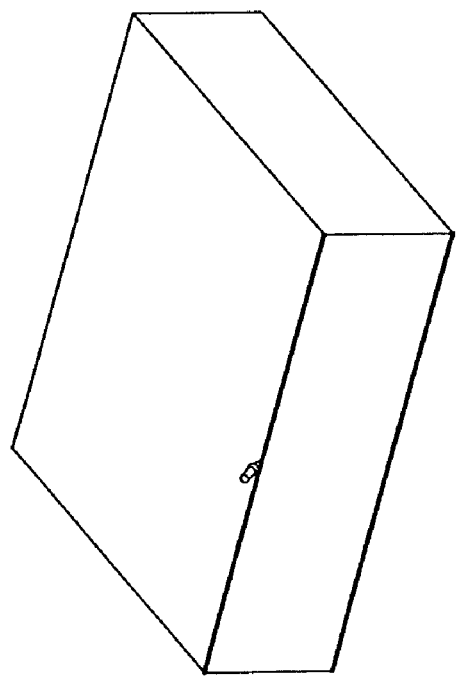
Figure 42C:
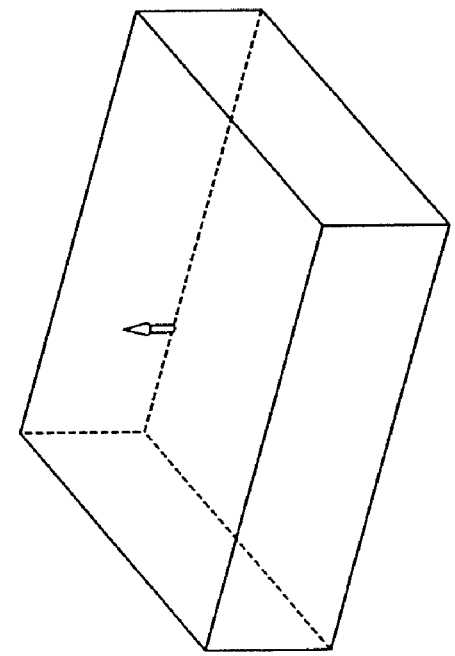

FIG. 42a shows two parallel edges of a solid face selected for modification with the Pull tool 412. FIG. 42b shows the full round created when the user drags using the Pull tool with the Round option enabled until the two round faces meet. FIGS. 42c and 42d show an alternate method of creating a full round. Three neighboring faces are selected for modification with the Pull tool, then the user selects the Full Pull option to create the full round.

Figure 43B:
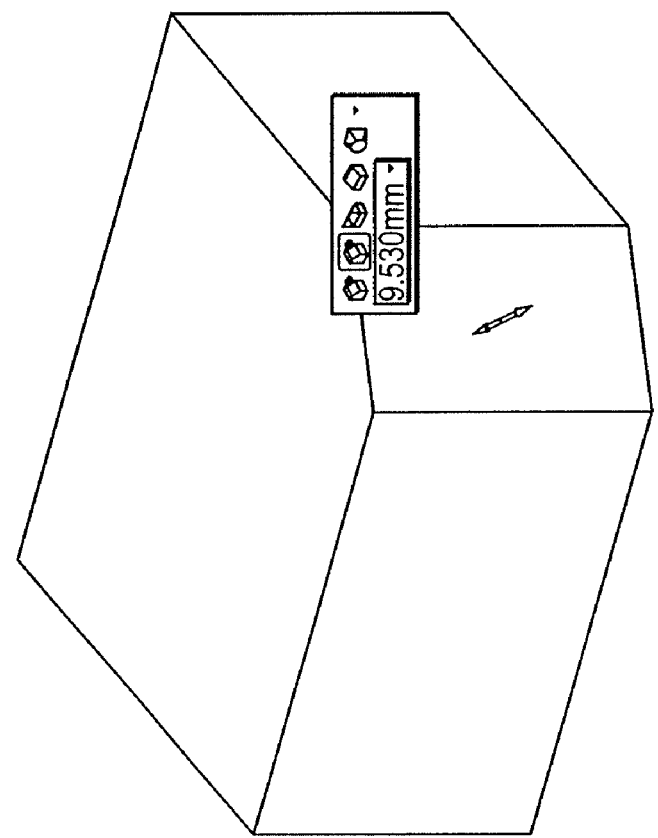
FIGS. 43 a-b show a user creating a chamfered edge with the Pull tool.
Figure 43A:
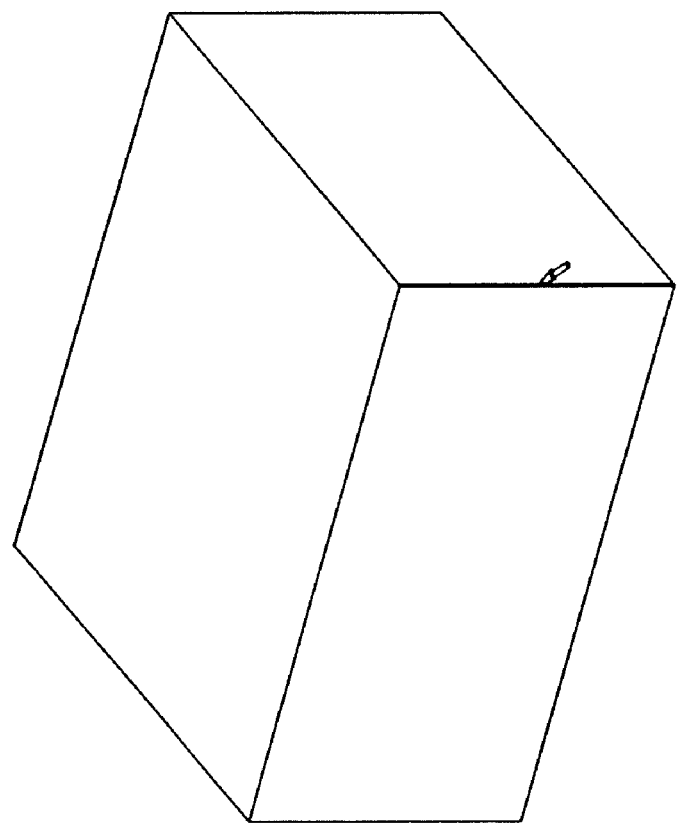

FIG. 43a shows the edge of a solid selected for modification with the Pull tool 412. FIG. 20b shows the chamfer created when the user drags with the Pull tool with the Chamfer option enabled. Alternatively, the round face in FIG. 41b can be switched to a chamfer with a setback equal to the round's radius by selecting the round face and enabling the Chamfer option.

Figure 44B:
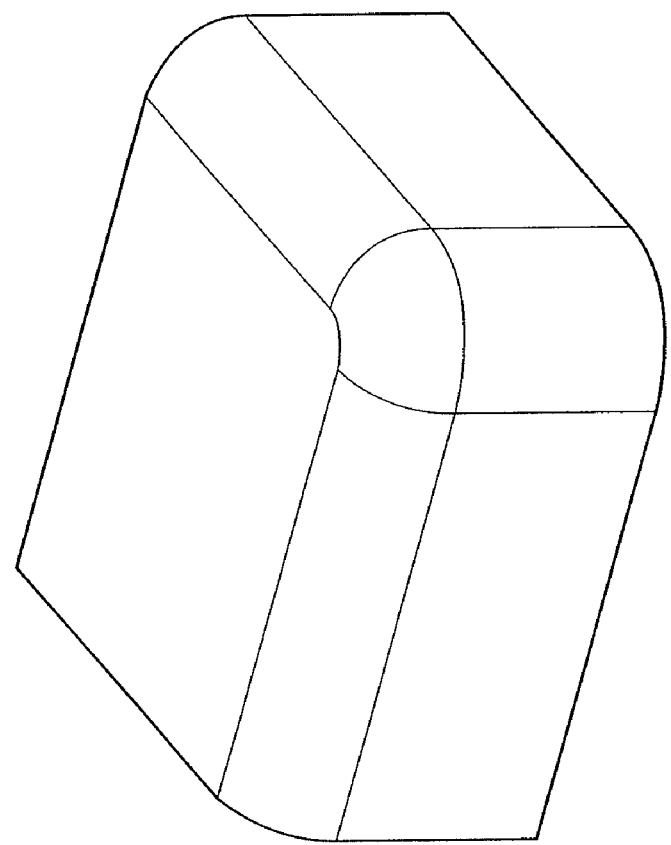
FIGS. 44 a-b show a user creating multiple rounded edges with the Pull tool.
Figure 44A:
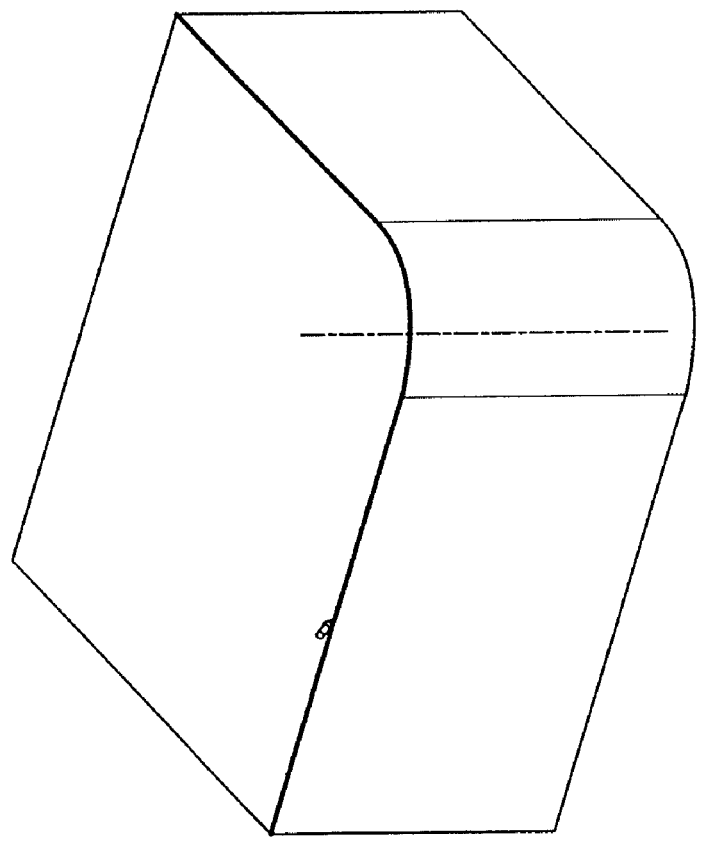

FIG. 44a shows a tangent chain of edges of a solid selected for modification with the Pull tool 412. FIG. 44b shows the tangent set of cylindrical and toroidal round faces created when the user drags with the Pull tool with the Round option enabled.

Figure 45B:
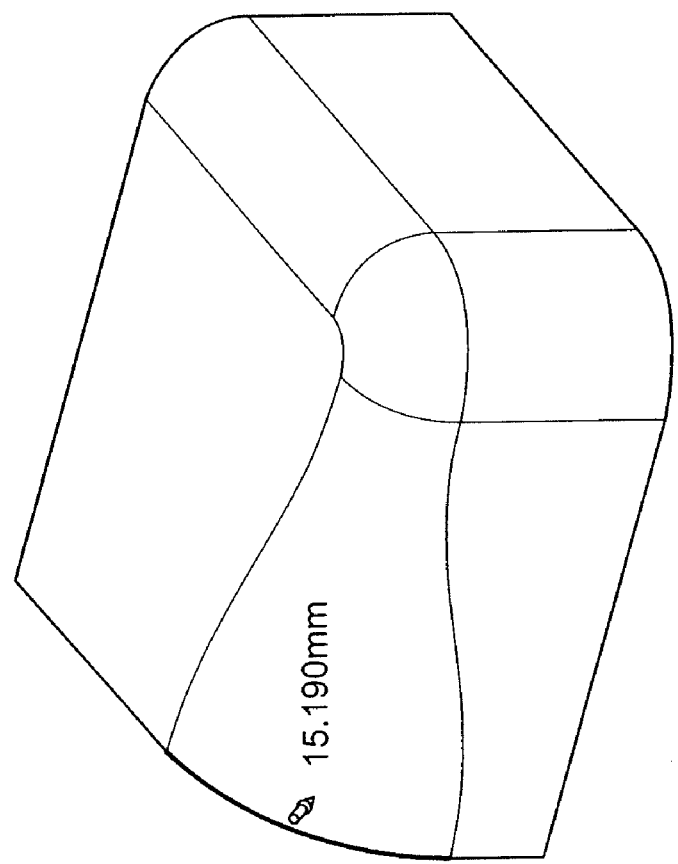
FIGS. 45 a-b show a user creating a variable-radius round with the Pull tool.
Figure 45A:
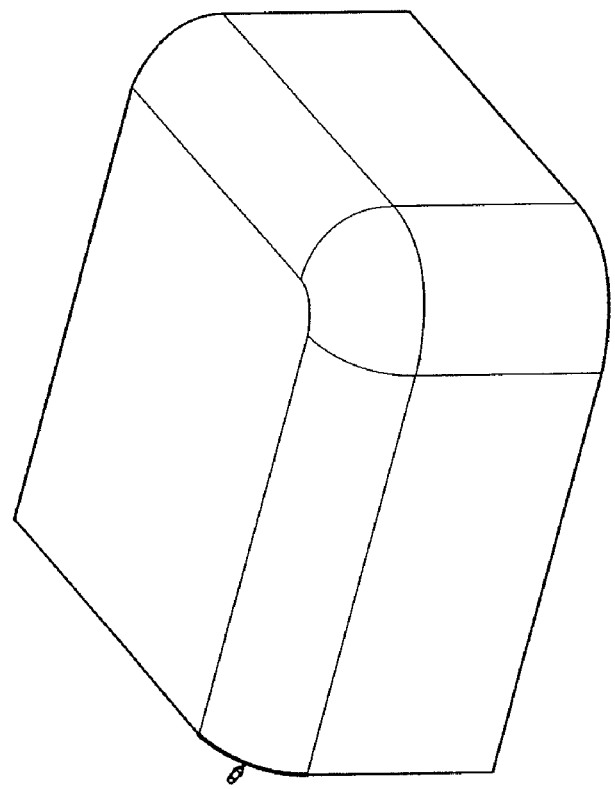

FIG. 45a shows a single edge of a round face selected for modification with the Pull tool. FIG. 45b shows the cylindrical face of the round transformed into a spline surface whose radii smoothly vary from the fixed (unselected) edge of the round to the radius created when the user drags with the Pull tool.

Figure 46B:
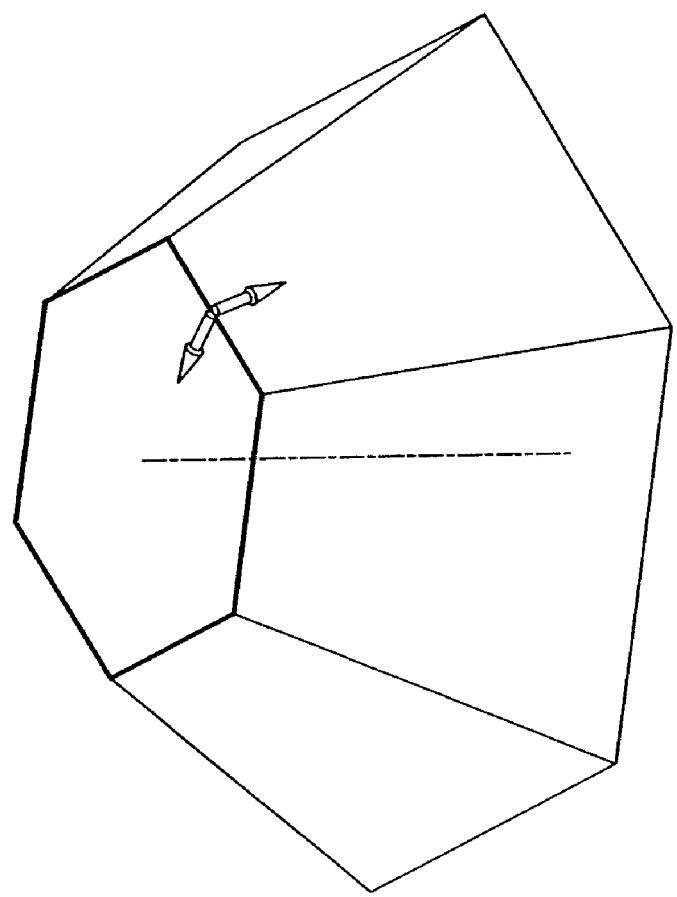
FIGS. 46 a-b show a user modifying a solid by pivoting its edges with the Pull tool.
Figure 46A:
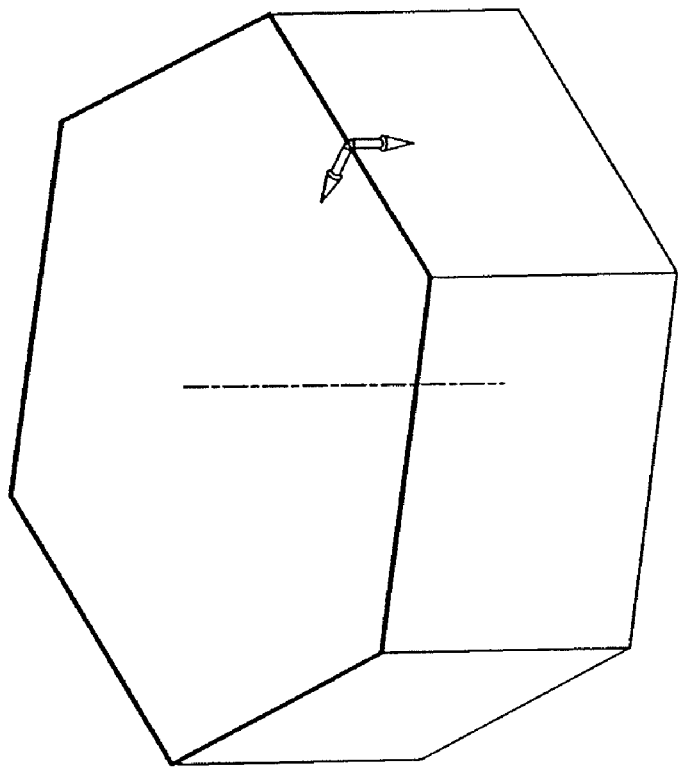

FIG. 46a shows all the edges of the top face of a solid selected with the Pull tool. FIG. 46b shows how the solid is modified when the user selects the Pivot option and drags with the Pull tool.

Figure 47B:
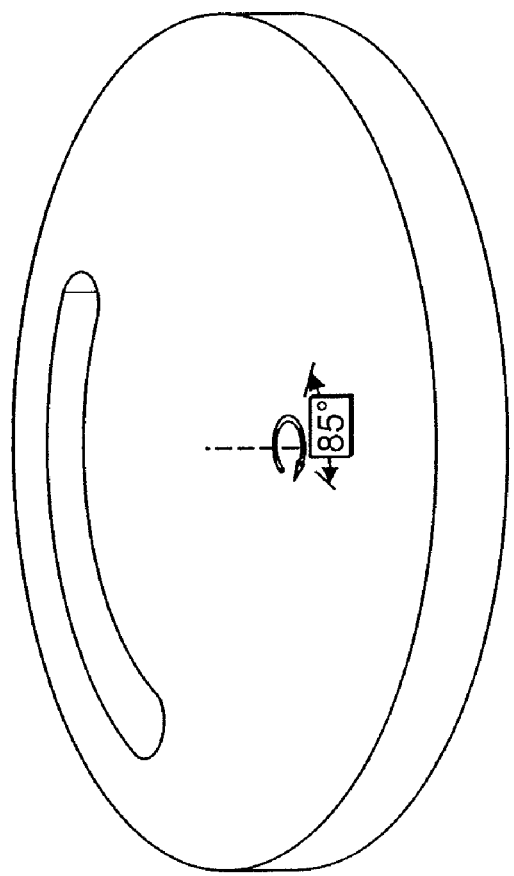
FIGS. 47 a-b show a user creating a slot with the Pull tool.
Figure 47A:
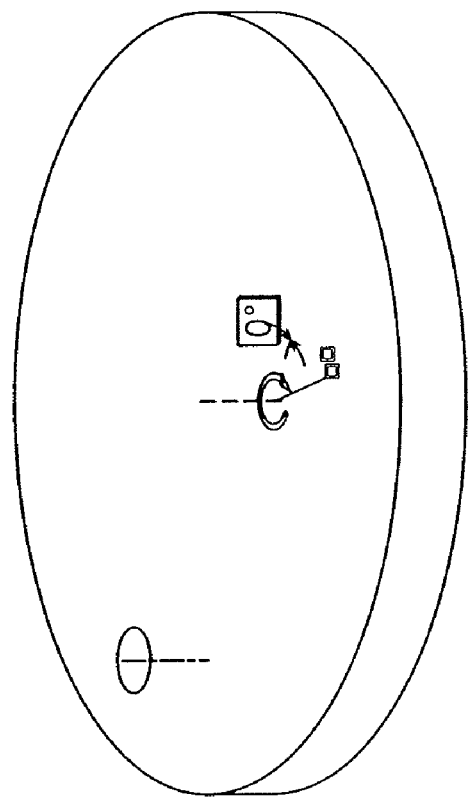

FIG. 47a shows the axis of a hole selected for modification and another axis secondary selected as the rotational axis with the Pull tool. FIG. 47b shows the transformation of the hole to a circular slot created when the user drags with the Pull tool.

Figure 48B:
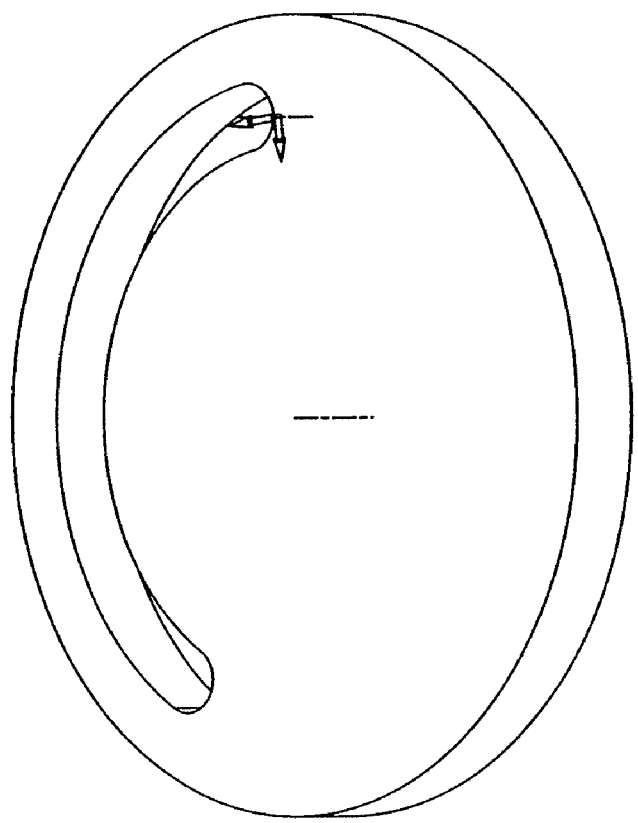
FIGS. 48 a-b show a user lengthening a circular slot with the Pull tool.
Figure 48A:
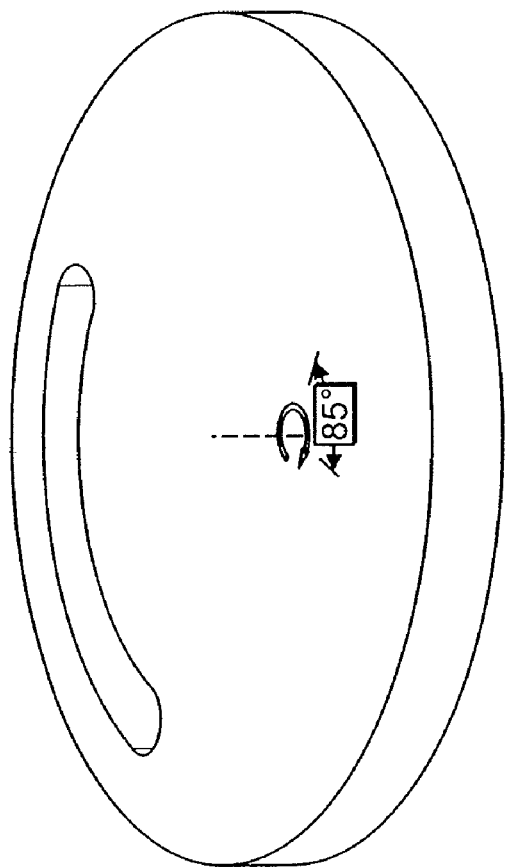

FIG. 48a shows the axis of a slot selected for modification and another axis selected as the rotational axis with the Pull tool. FIG. 48b shows how the circular slot is extended when the user drags with the Pull tool.

Figure 49B:
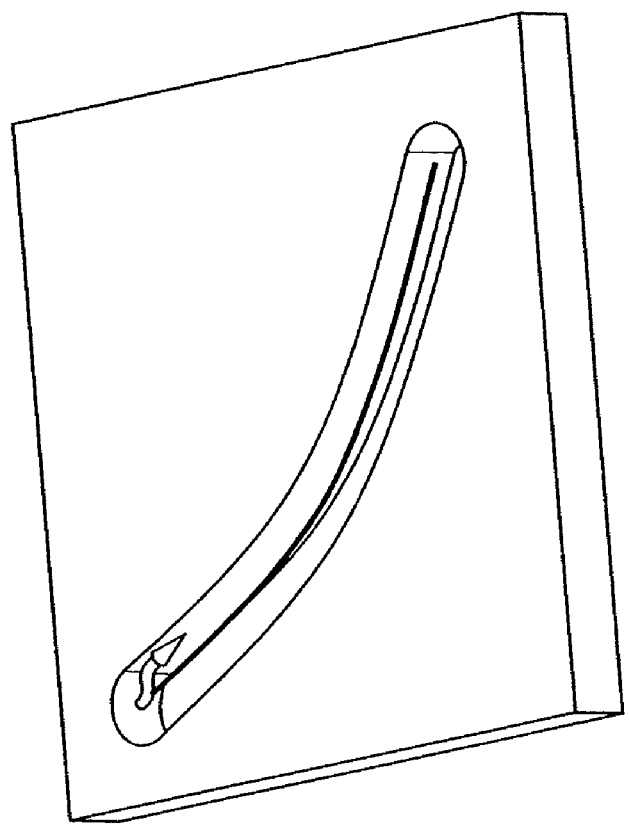
FIGS. 49 a-b show a user creating a swept slot using the Pull tool.
Figure 49A:
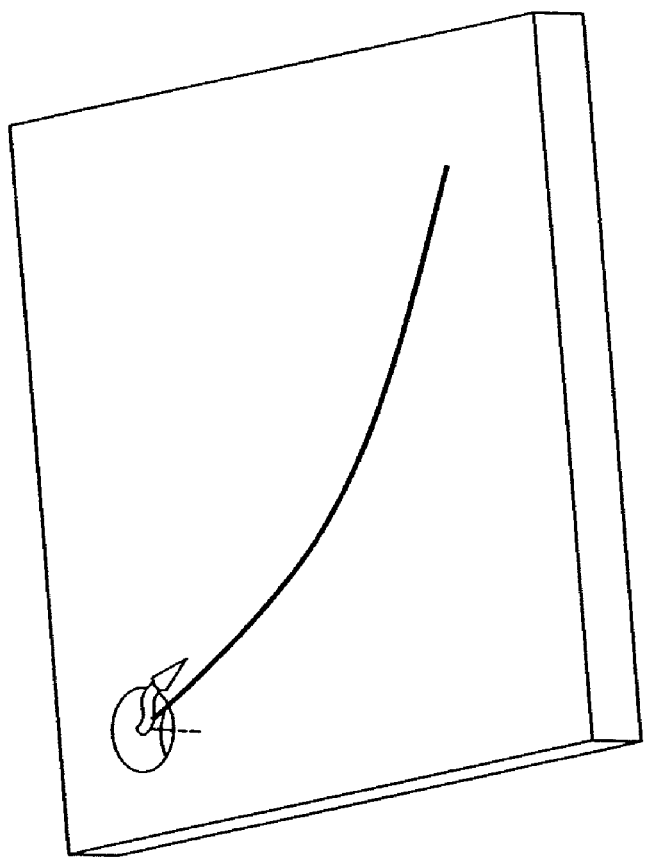

FIG. 49a shows the axis of a hole primary selected and a curve secondary selected to act as a path with the Pull tool. FIG. 49b shows how the hole is swept to create a slot when the user drags with the Pull tool.

Figure 50:
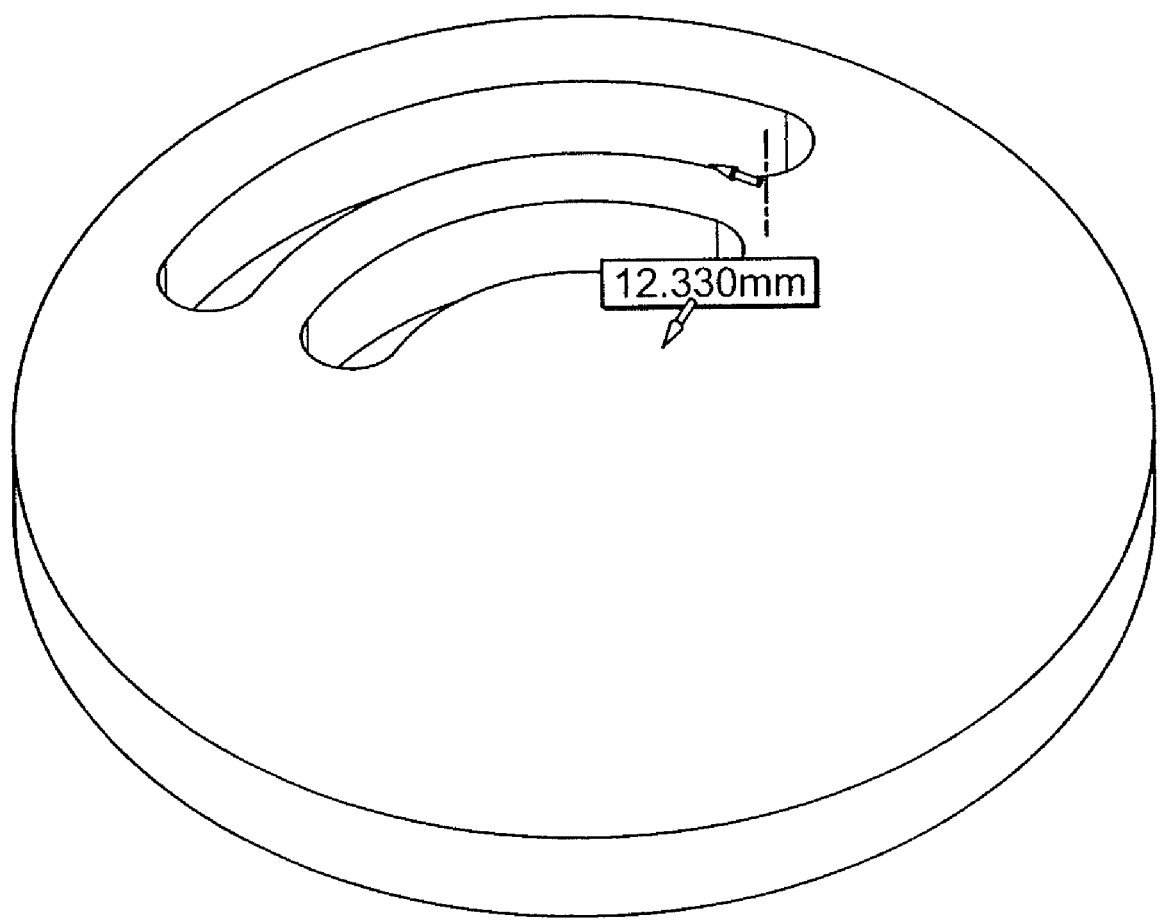
FIG. 50 shows a user radially copying a circular slot with the Pull tool.

FIG. 50 shows the circular slot created when the user selects the radial direction and uses the Ctrl key to copy a slot with the Pull tool.

Figure 51B:
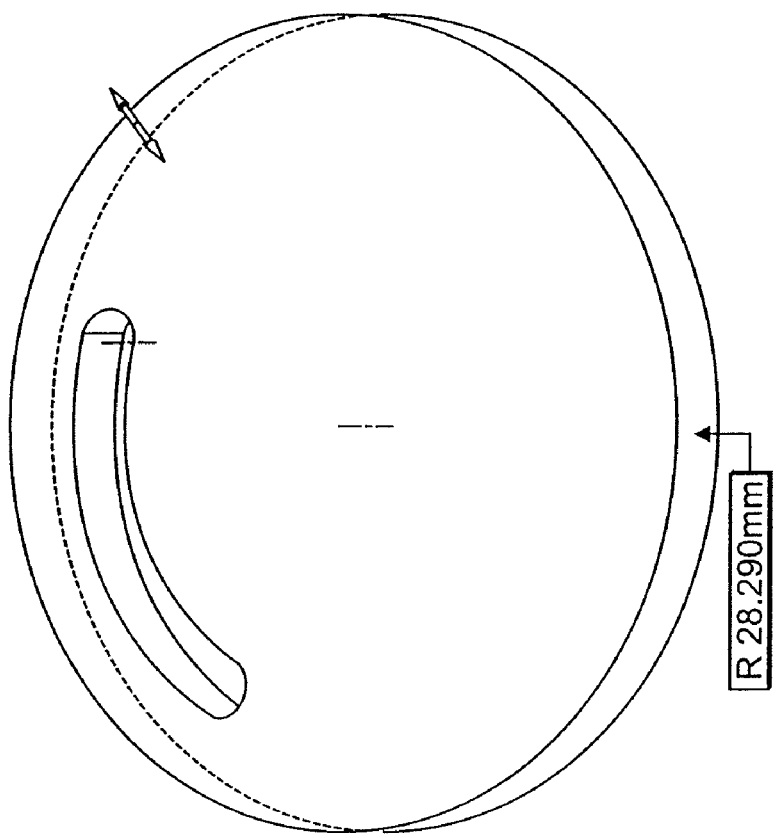
FIGS. 51 a-b show a user simultaneously modifying a slot and the solid that contains the slot (radially transforming the slot) with the Pull tool.
Figure 51A:
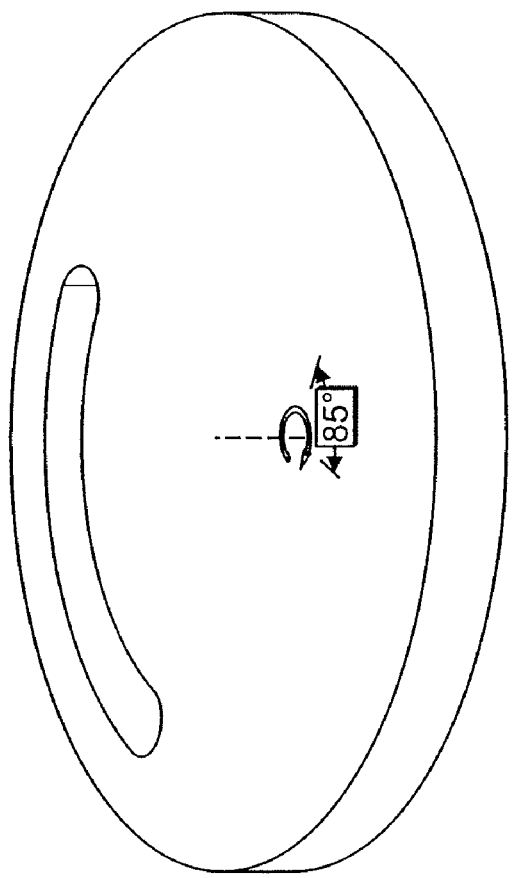

FIG. 51a shows the axis of a slot and the outer cylindrical surface of a solid selected for modification. The cylindrical face of the solid is also secondary selected as the direction with the Pull tool. FIG. 51b shows the increase in radius of both the slot and cylindrical solid when the user drags with the Pull tool.

Figure 52:
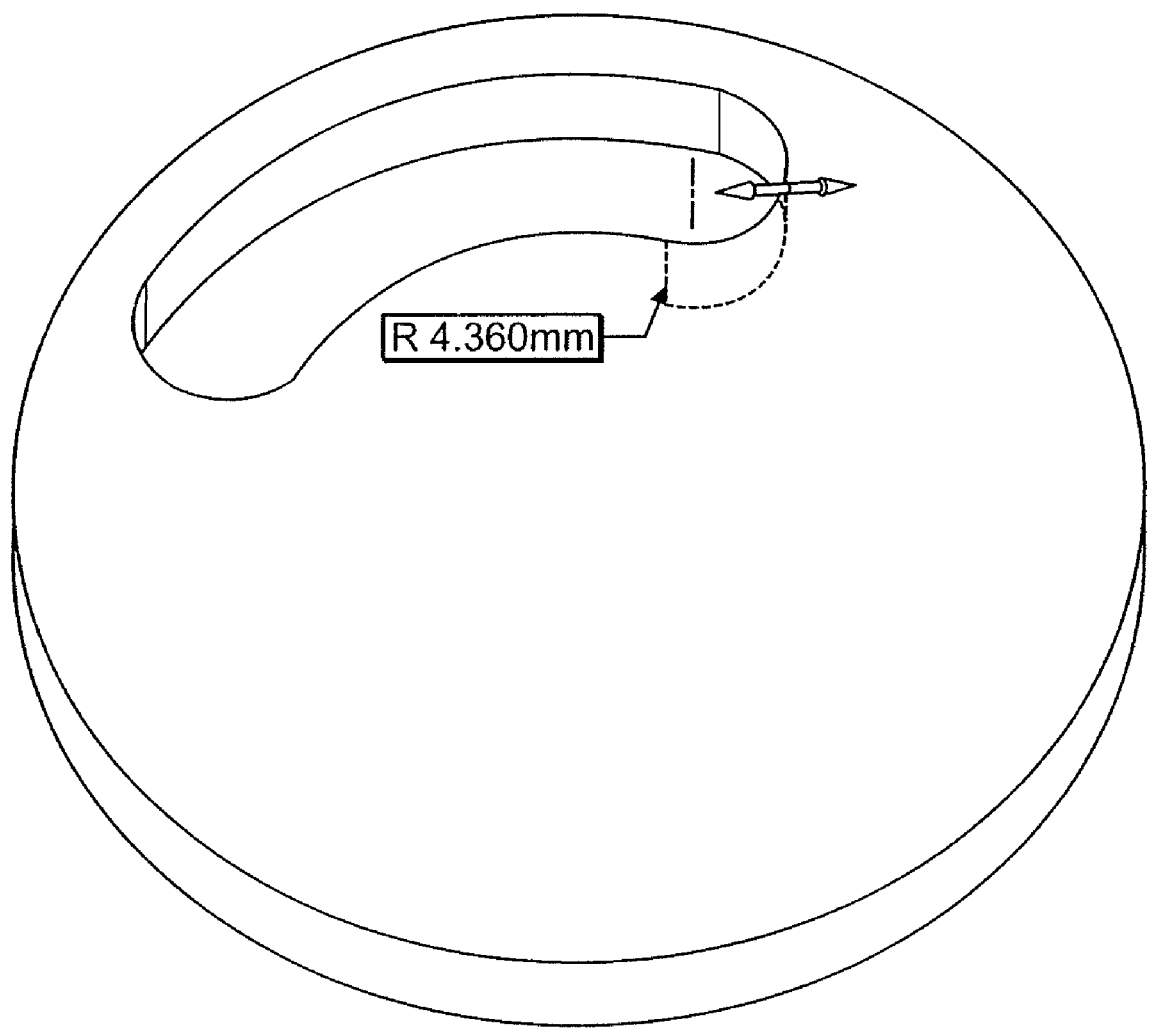
FIG. 52 shows a user modifying all the faces of a slot as a group by dragging one face of the slot with the Pull tool.

FIG. 52 shows a slot being modified with the Pull tool. The user is dragging one of the faces of the slot, and all the faces of the slot are expanding together when the user drags with the Pull tool, showing the relationship made automatically when a slot is created, so that later modifications do not have to involve the user selecting all the faces of the slot every time they want to adjust it.

All Pull tool actions can also be used on the faces and edges of the geometry when viewed in cross-section. In cross-section mode, a face is displayed as an edge and an edge is displayed as a vertex. Further details are provided in related application "Systems and Methods for Modifying Three Dimensional Geometry Using an Arbitrary Cross-Section Plane," which is incorporated by reference above.

Regardless of whether the Pull tool is being used to modify a newly created object, an existing object, or an object from another CAD system; the modeling system uses the foundation layer's geometry engine 220 to convert the imported data from the originating application into a geometry-only format.

This process involves stripping all history and feature data, so that the source of the geometry data has no influence. The geometry engine also performs all conversion, checking, and geometry calculation functions. On import, the CAD system retrieves only the final definition of the geometry, and places it into the object database 222. The CAD system creates a new, persistent file with the file storage component 224. If the geometry was imported from another system, the history and parameters used to create the final geometry in that software are ignored.

Importing and translation of outside geometry can be performed by the geometry engine through its built-in translators. After importing outside geometry, the geometry-only data is provided to higher-level layers of the system. Although history information and other data from parametric systems has been removed, the geometry still retains information about primitives and relations between objects in the imported geometry.

The logic of the Pull tool will now be described with respect to FIGS. 28-35. FIG. 28 describes the categorization strategy used to determine which action the Pull tool will perform based on the context provided by the geometry and the user via UI switches, FIG. 29 describes an overview of the back-end logic for implementation of the Pull tool, and FIGS. 30-35 show the detailed logic that implements the individual functions of the Pull tool. The same logic is used when modifying geometry in cross-section mode. In cross-section mode, a face is displayed as an edge and an edge is displayed as a vertex. Further details are provided in related application entitle "Systems and Methods for Modifying Three Dimensional Geometry Using an Arbitrary Cross-Section Plane," which is incorporated by reference above.

FIG. 28 describes the categorization strategy used to determine which action the Pull tool will perform based on the context provided by the geometry and the user.

Along the top of the table are the types of objects that can be selected as Primary references. (Where the word "face" is used, it can be assumed unless counter-indicated, that it could be a solid or surface face, since the Pull tool can act on both solids and surfaces. This is also true for edges.) Along the left side are objects that can be selected as Secondary references. A secondary-selected face can act to set a direction, as can a plane, a linear axis of an origin, a straight line or edge, etc. Where an object can function in more than one manner, a choice is made for the user based on surrounding geometry, but the user can override this choice with a UI switch. An example of this is an axis of a cylinder, which can act as an axis of revolution or direction along the height of the cylinder.

Based on the combination of Primary and Secondary references, the user is placed into the state (of UI and workflow) as indicated by the cells in the table. The letters A-F in the table refer to further diagrams that explain this progression (and interaction with the UI) in more depth. (The detailed logic used to implement each action is described in figures based on the following key: A-F maps to FIGS. 30-35, respectively.) The user can choose (via UI options) between other common workflows in the same cell, or he can progress to other cells by selecting further primary and/or secondary references. Modifications of the resulting geometry will also be presented where applicable. The crossed-out cells denote areas where no functionality exists; and the cells with dashed crosses denote other tools in the software that perform the listed function (and therefore are not presented in this patent.)

Once the pull action is set by categorization and optional user choice of UI switches and/or further selections, the user's next step is to indicate the amount to change the geometry. There are four ways to accomplish this: the full amount (all the way along a path, all the way around an axis, blend fully between selected ends, etc.), a drag (indicated by a LMB-down-and-drag in the direction of the arrow in the screen to indicate an amount in system-defined units), a precise dimension (invoked by clicking the dimension field or pressing the space bar then entering a value), or by clicking the Up To tool guide and selecting another geometry reference. An Up To reference can also be dynamically grabbed while dragging by holding down the Shift key as a shortcut and releasing the drag over an object (making the whole operation more interactive to the user.)

Simultaneous to the change to the original geometry, surrounding geometry is analyzed to determine its relationship to the moving face, edge, or vertex. The following relationships are potentially caught by the system, unless overridden by the user (if that is the desired outcome)—for that is the essence of the system. While a suggestion will be made to the user and is likely the desired one, the user ultimately is in control of these associations connected to the selected face(s).

Mirror (if a face is modified then the other half of the mirrored pair will attempt to undergo the same modification)

Offset (if a face is offset from another face then the user controls whether to change that offset distance, or move the faces together and hold the offset distance fixed)

Pattern (if geometry is part of a pattern, then changing any face of a pattern member will change the corresponding face in all other pattern members)

Round (if the geometry is part of a set of faces that are tangent to each other and all sharing the same radius value, then any change to the radius of one face will affect all the other faces in that set of related round faces)

Chamfer (same as for rounds, chamfer sets are faces that are tangent to each other and having the same setback and 45-degree-angled faces as each other)

Coaxial (if the geometry is all revolved around the same axis then it will move attempting to stay related to that central axis)

Slot (if a hole was turned into a slot—an elongated hole—then the slot can be extended along its line of definition or pulled back into a hole. Circular slots go around a central axis, and linear slots extend in one direction.)

This all happens so fast that the user perceives it to be instantaneous, and the system is only burdened with watching for events additional to dragging, like a Shift key being pressed to allow selection of a snap reference, or the space bar being pressed to grab the dimension for modification. Also, dimensions are presented to show the drag distance, as appropriate.

To the user, the Pull operation is intended to be as simple as "Select and Pull." Without the user realizing it, dragging with the Pull tool is a three-step operation: gathering references, categorizing references and choosing a likely action, and making the change to all related geometry in real-time as the user requests a pull amount. In the first step, objects are selected by the user, who gives the input to the tool as to their relative importance (primary selections of geometry for modification vs. secondary selections of geometry, or a minimal set of UI switches, to guide actions.) In the second step, the combination of primary and secondary references are categorized (see FIG. 28) and the user is placed into the most likely operation (and appropriate UI elements are displayed). In the final step, a change is made to the geometry by some further user action (and related or associated geometry is automatically changed as appropriate.)

While the Pull tool is in use, scores of geometry engine functions are invoked. For example, let's review a commonly-used pull function, Extrude Faces, as shown in FIG. 6 *a-b*. In the course of performing the Extrude Faces function (once the Pull action has been classified and a change has been requested by the user, by dragging, dimension entry, etc.), the following geometry engine functions are called. First, we copy the selected face to create a new face by calling the geometry engine's (220) api_unhook_faces function. Then the copied face is extruded to make a solid by calling the geometry engine's api_sweep_with_options function. The sides of this extruded solid are then aligned with the source body by calling the geometry engine's api_tweak_extend_faces and api_tweak_faces functions. The resulting solid is then fused to or subtracted from the source body by calling the geometry engine's api_boolean function.

Resultant ACIS body/bodies are tessellated by calling the geometry engine's api_facet_entities function for rendering.

We also use the following categories of the ACIS API:

Geometry creation/deletion/query functions

Geometry evaluators

Topology creation/deletion/query functions

Model validity check/repair functions

Ray test functions for selection

Figure 29:
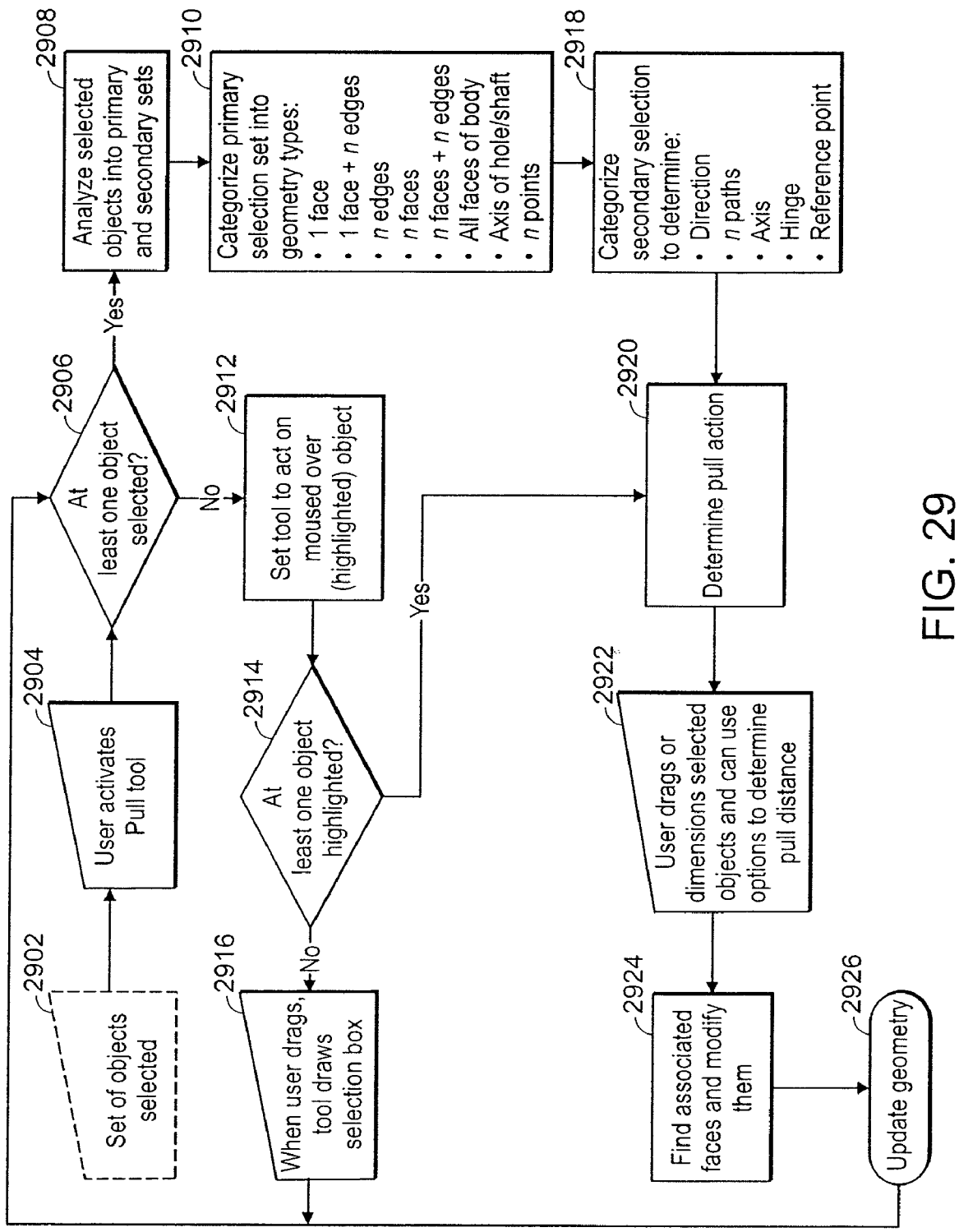
FIG. 29 describes an overview of the back-end logic for implementation of the Pull tool.

History/Bulletin board mechanism for tracking changes to model and to implement Undo/Redo Attribute creation/deletion/query functions FIG. 29 describes an overview of the back-end logic for implementation of the Pull tool. (More detailed logic appears in FIGS. 30 through 36.) The user may select a set of objects before activating the Pull tool, select objects after activating the Pull tool, or initiate the Pull tool without any objects selected at all. If objects are selected, they are analyzed and categorized as types of primary and secondary selections. Based on the primary and secondary selections and based on the context of the selected objects within the whole design, the tool determines the most appropriate action to occur when the user drags with the Pull tool. If no objects are selected, the tool is set to work on the highlighted object at the current mouse location. When the user drags the primary selection or highlighted object, the tool modifies that object and finds and modifies all associated faces as well. Interactively, this action occurs for each mouse movement made with the Pull tool, which makes the geometry appear to change seamlessly during the entire user operation.

At step 2902, the user may have selected a set of objects. The user can also select objects after the Pull tool is activated using the Select sub-tool. At step 2904, the user activates the Pull tool. At step 2906, the tool checks to see if any objects are selected. To do this, it queries the Selection list (for primary selections) and the SecondarySelection list (for secondary selections) in the Object Database 222 (shown in FIG. 2). If the list is empty, the tool proceeds to step 2912. If the array has at least one object, the tool proceeds to step 2908.

At step 2908, the tool determines whether each selected object can be categorized as a primary selection or a secondary selection. A primary selection is an object that will change during the pull action and is selected by the user using the standard method. A secondary selection is an object used to guide the type of change made by the Pull tool and is selected by the user via an alternative method of selection. For example, if a planar face is selected as the primary selection, and a straight edge is selected as the secondary selection, then when the user drags with the Pull tool, the selected face will be offset in the direction indicated by the edge. (The complete logic for determining the pull action from the primary and secondary selections is shown in FIG. 28 and detailed in FIGS. 30 through 36.) Once categorized, each object is placed either in the Selection list (for primary selections) or the SecondarySelection list (for secondary selections) in the Object Database 222.

At step 2910, the tool further categorizes the primary selection set by looking at the object type of each primary object in the Selection list. At step 2918, the tool further categorizes the secondary selection set by the type of objects it contains. At step 2920, from the type of the Selection and SecondarySelection objects, as well as the context of the objects within the whole design, the tool determines whether to use the secondary selected object(s) as a direction, path, axis, hinge, or reference point for the pull action. Note that, although actions are determined automatically, the user can always override them manually.

Figure 53B:
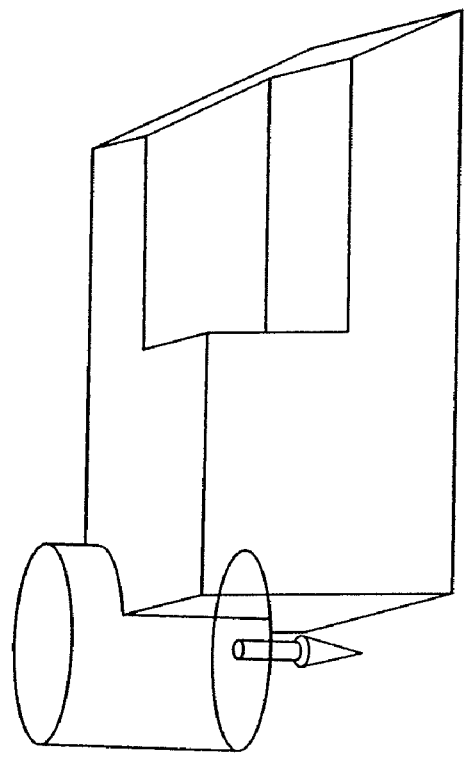
FIGS. 53 a-b show how default Pull options are selected dynamically based on the geometry.
Figure 53A:
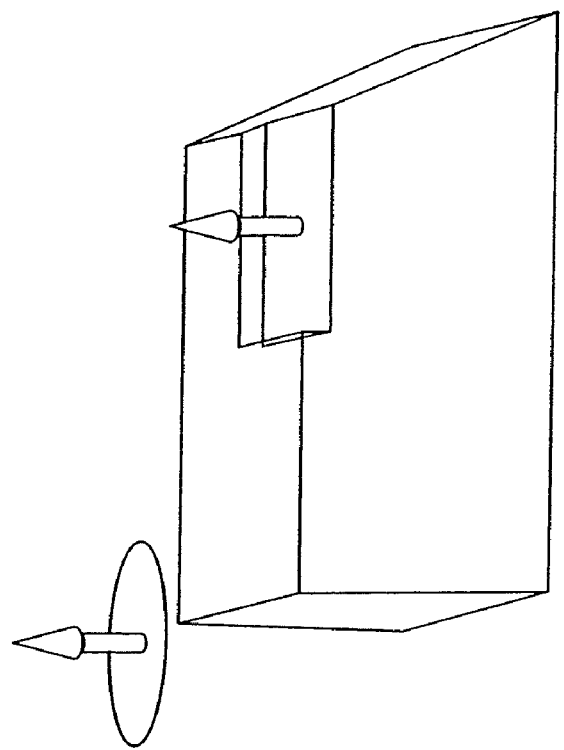

At step 2922, the user usually drags the mouse to perform the action determined by the Pull tool. (The complete logic for determining the pull action from the primary and secondary selections is shown in FIG. 28.) For example, if the object is a face, the pull action is to offset the face. If the object is a round face, the pull action is to modify the round radius. If the object is an edge, the pull action is to round or chamfer the edge. The user can drag to the correct distance, enter a dimension for the action, or use options to modify the pull distance. Available options are determined automatically by the Pull tool (but can be overridden by the user) and include pulling the entire distance (such as revolving a 360 degree rotation or sweeping a face over the entire selected path), offsetting a surface equally in opposite directions, pulling the distance specified by another object, only adding material during the pull, and only removing material during the pull. The default options are chosen automatically by the Pull tool based on the context of the primary and secondary selections and the type of objects selected. For example, when a planar surface is the primary selection, and an axis is the secondary selection, the option for the revolve distance is set to 360 degrees by default. Or, the Add option is selected by default unless the entire area of the selected face is going to pass inside a solid on the face's first interaction with the solid. In this case, the Cut option is selected by default. In FIG. 53*a*, the user has selected two faces to pull. In FIG. 53*b*, the Add option is selected by default for the circle, creating a cylinder, and the Cut option is selected by default for the rectangle, deepening the cutout.

With the Pull tool, any automatic option choice can be undone or overridden by the user at any time. The result of all categorization and contextual tests is shown to the user with an onscreen icon change at the primary selection site.

At step 2924, all the faces associated with the change to the primary selection set are changed as necessary by calling a combination of the geometry engine's (220) api_offset_faces function and other functions, passing them the faces. Step 2924 occurs for each mouse movement made with the Pull tool, which makes the geometry appear to change seamlessly during the entire user operation.

If the user did not select any objects, then at step 2906, the tool receives an empty list when it queries the Selection and SecondarySelection lists in the Object Database 222 (shown in FIG. 2). In this case, the tool proceeds to step 2912. At this step, the tool is set so that the object over which the mouse cursor is placed is automatically determined to be the primary selected object. This object is displayed in a highlighted state to the user. If there is no object under the cursor, the tool proceeds to step 2916, where the next time the user drags, a selection box is drawn instead. If there is an object under the cursor, then the tool proceeds to step 2920 to determine the pull action using the highlighted object and any objects in the SecondarySelection list in the Object Database 222. If an action cannot be determined from the primary object and any secondary selections, nothing happens when the user drags with the Pull tool in the next step.

Figure 30A:
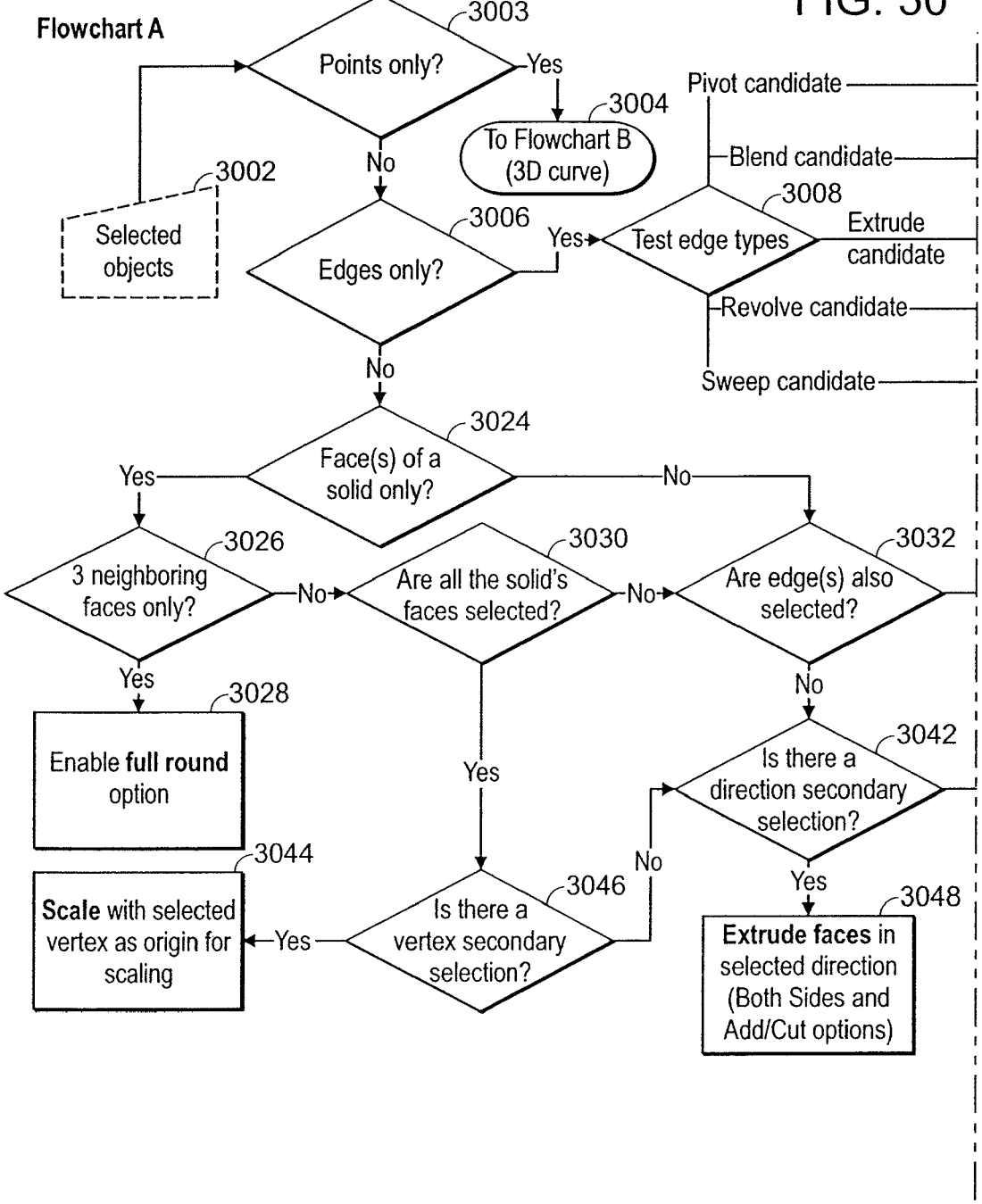
FIG. 30 (Flowchart A) describes detailed back-end logic for implementation of the offset, thicken surfaces, extrude edges and faces, extrude along a direction, full round, and scale functions of the Pull tool.
Figure 30B:
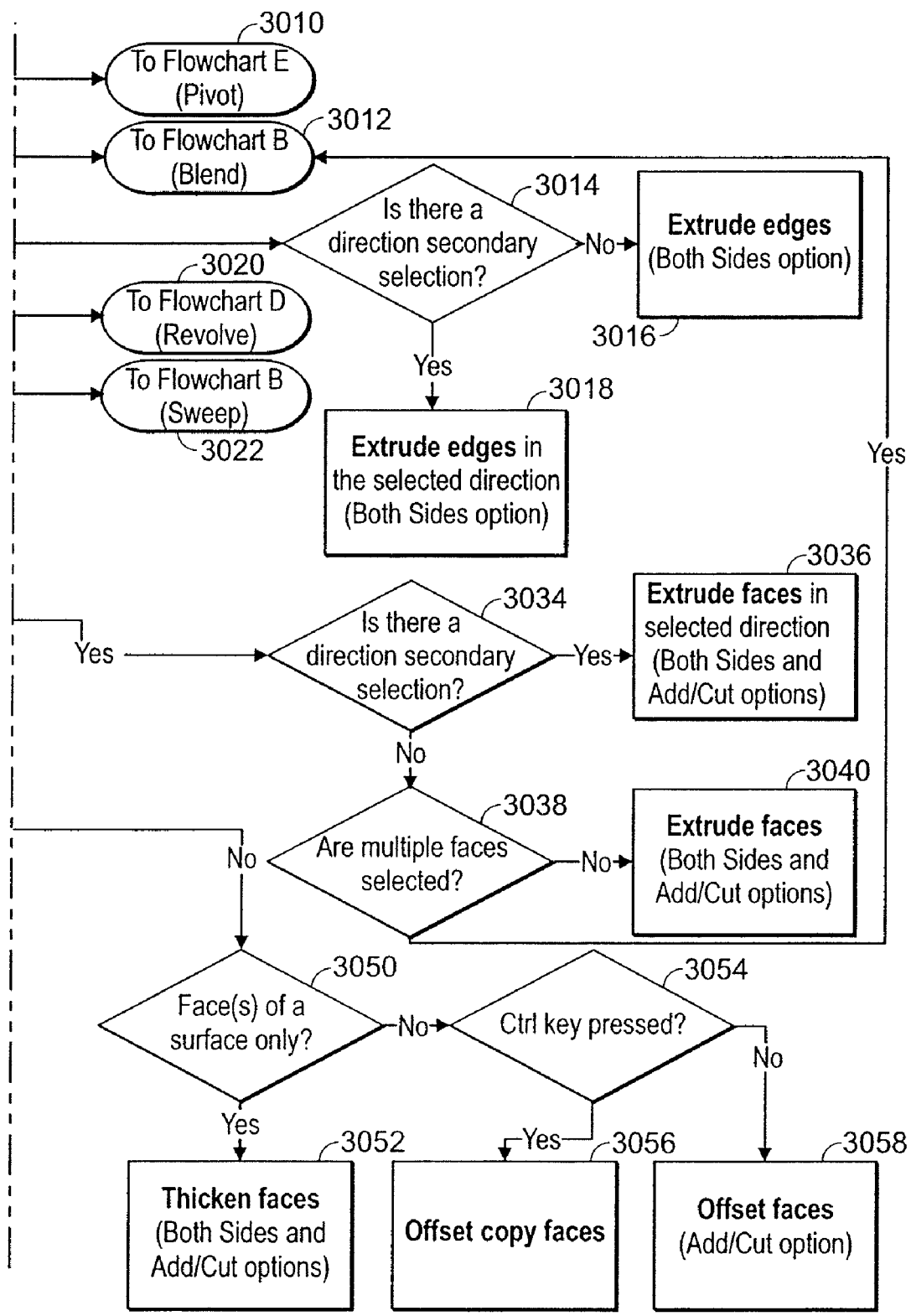

FIG. 30 (Flowchart A) describes the detailed back-end logic for implementation of the offset, thicken surfaces, extrude edges and faces, extrude along a direction, full round, and scale functions of the Pull tool. Once the user selects objects, the objects are analyzed and categorized by the Pull tool. (The complete logic for determining the pull action from the primary and secondary selections is shown in FIG. 28.) If the selected objects are only points, the Pull tool switches to the appropriate workflow for creation of a 3D curve.

If the selected objects are only edges, then the Pull tool further determines whether the selected edges are candidates for a pivot, blend, revolve, or sweep and switches to the appropriate workflow for those functions. If the analysis determines that the edges are extrude candidates, the Pull tool extrudes the edges in the natural direction or in the direction chosen by the user as a secondary selection, offering the Both Sides option to the user to extrude the edges in both directions.

If the selected objects are only the faces of a solid, and the selection set includes only three neighboring faces, then the Pull tool offers the Full Round option, which, if chosen, replaces the middle face with a full round. If the selection set includes all the faces of a solid and the secondary selection is a vertex, the Pull tool scales the solid.

If some faces are selected and there is a secondary direction selection, then the Pull tool extrudes the faces in the selected direction, offering options to the user to extrude the faces in both directions with the Both Sides option, and/or add or remove material with the Add and Cut options. If there is no secondary direction selection, then the tool checks to see if the selected faces are on a surface, and thickens those faces, offering the Both Sides, Add, and Cut options to the user. If the faces are not on a surface, and the user presses the Ctrl key, the faces are copied at the new location. If the user does not press the Ctrl key, then the Pull tool offsets those faces, offering the Add and Cut options to the user.

If both faces and edges are selected and there is a secondary direction selection, then the Pull tool extrudes the faces in the selected direction, offering the Both Sides, Add, and Cut options to the user. If there is no secondary direction selection, the Pull tool checks for the selection of multiple faces. If multiple faces on different bodies are selected, then the Pull tool switches to the appropriate workflow for a blend. If a single face is selected the Pull tool offsets the faces in their "natural" direction, which is perpendicular to the plane of the face. How the extrusion is performed is dependent upon the edges that are also selected.

At step 3002, the user has selected an object or objects. At step 3003, the Pull tool analyzes the selected object set to determine if it contains only points by querying the Selection list in the Object Database 222 (shown in FIG. 2) and checking if all the objects in the list are of type Point. If the list contains other object types, then the tool proceeds to step 3006. If the list contains only points, the tool switches to Flowchart B for 3D curves (step 3004).

At step 3006, the Pull tool analyzes the selected object set to determine if it contains only one or more edges by querying the Selection list in the Object Database 222 and checking if all the objects in the list are of type Edge. If the set contains other object types, then the tool proceeds to step 3024.

If the list contains only edges or only endpoints of edges, then at step 3008, the Pull tool checks to see if the Extrude option was selected by the user. If the selected edge is internal to a planar face, or if the edge's endpoint is also selected. It also checks to be sure that any secondary selected edge, curve, or axis is not being treated as a rotation axis or sweep trajectory, and that the Blend option is not selected. If the Pivot option is selected, and all the edges are in the same plane, the Pull tool switches to Flowchart E for pivot (step 3010). If the secondary selected edge is a rotation axis or circular edge or line, the Pull tool switches to Flowchart D for revolves (step 3020). If the secondary selected edge or curve is endpoint-coincident and normal to the selection, then it is guessed to be a sweep trajectory, and the Pull tool switches to Flowchart B for sweeps (step 3022). If the Blend option is selected, or if there is a single, non-linear, non-circular secondary edge selection, the Pull tool switches to Flowchart B (step 3012) for blends and sweeps.

If the case is not identified as a blend, sweep, pivot, or revolve, then the pull action is to extrude the edges. At step 3014, the tool checks whether there is a secondary direction selection. If no direction is selected, then at step 3016, the Pull tool extrudes the edges normal to the plane in which they were created. If a direction is selected, then at step 3018, the Pull tool extrudes the edges in the selected direction. In both cases, the Both Sides option is offered to the user. If selected, this option extrudes each edge in two opposite directions. (In the case of a solid, the edge is only extended in one direction—away from the solid face.) To extrude the edges, each edge is extruded to make a surface by calling the geometry engine's (220) api_make_edge-from_curve function and the api_sweep_with_options function, passing it an edge. The resulting surface is then tessellated using the geometry engine's (220) api_facet_entities function for rendering. If the edge is already the edge of a surface and the direction to extrude the edge is along the surface, the geometry engine's (220) api_separate_body function is called, passing it the initial surface. Then the api_extend_sheetbody function is called to extend the surface.

At step 3024, the Pull tool analyzes the selected objects to determine if the set consists only of one or more faces of a solid by querying the Selection list in the Object Database 222 (shown in FIG. 2) and checking if each object is of type Face. If the list contains other objects, the Pull tool proceeds to step 3032. If it contains only solid faces, then the tool checks if the list contains a single face. If that face is non-planar (for example, a cylinder, torus, sphere, cone, or spline face) then the tool offsets it. If the face is planar, the tool extrudes it. At step 3026, the tool checks whether the list contains only three neighboring faces. If they are neighboring faces, then at step 3028, the Full Round option is enabled. If the user selects the option, the tool replaces the middle face with a full round. To create the full round, the tool calls the geometry engine's (220) api_blend_three_ent function to assign round attributes and calls the api_fix_blends function to create the round, passing it the three faces. If the faces are not three neighboring faces, the tool proceeds to step 3030.

At step 3030, the Pull tool analyzes the selected objects to determine if the selection set contains all of the faces of a solid by querying the Selection list in the Object Database 222 (shown in FIG. 2) and getting the parent body of each of the selected faces. For each body, all of the faces are then collected and checked to make sure that they are all contained in the Selection list. If all the faces of a solid are not selected, the tool proceeds to step 3032. If they are selected, then at step 3046, the tool checks to see if the secondary selection set also includes a vertex by querying the SecondarySelection list in the Object Database 222 (shown in FIG. 2) and checking if any of the objects in the list are of type Vertex. If there is no secondary selection, or if the secondary selection is not a vertex, the tool proceeds to step 3042. If the secondary selection is a vertex, then at step 3044, the Pull tool scales the solid, using the vertex as the origin for scaling. It does this by calling the geometry engine's (220) api_apply_transf and api_change_body_trans functions, passing them the body and the transformation.

At step 3032, the Pull tool analyzes the selected objects to determine if any edges are included by querying the Selection list and checking if any of the objects are of type Edge. If edges are included, the tool proceeds to step 3034. If no edges are included, the tool checks at step 3042 to see if the data array also includes a direction secondary selection by querying the SecondarySelection list in the Object Database 222 (shown in FIG. 2) for a secondary selection that is a straight line, edge, or direction vector. If there is no direction secondary selection, the tool proceeds to step 3050. If there is, the tool offers the Both Sides, Add, and Cut options to the user and extrudes the primary selection faces in the selected direction by copying the selected faces to create new faces by calling the geometry engine's (220) api_offset_faces and api_separate_body functions.

At step 3050, the Pull tool analyzes the selected objects to determine if only surface faces are included by querying the Selection list in the Object Database 222 (shown in FIG. 2) and checking to see if all of the included objects are of type Face and all have a parent of type SolidBody. If none of the objects in the list meet this criteria, then there are only surface faces, and at step 3052, the tool offers the Both Sides, Add, and Cut options to the user, and thickens the primary selection faces in the selected direction by copying the selected faces to create new faces. It does this by calling the geometry engine's (220) api_unhook_faces function. Then the copied faces are thickened to make a solid by calling the api_sweep_with_options or api_sheet_thicken function. The resulting solid is then fused to or subtracted from the source body by calling api_boolean. If there are not only surface faces, but also some solid faces, then at step 3030, the tool offers the Add and Cut options to the user, but not the Both Sides option. The tool offsets the faces using the same set of calls to the geometry engine (220) as in step 3050.

At step 3034, the Pull tool knows that the primary selection includes one or more faces and edges, and checks to see if there is a direction secondary selection by querying the SecondarySelection list in the Object Database 222 (shown in FIG. 2) for a secondary selection that is a straight line, edge, or direction vector.

Figure 54C:
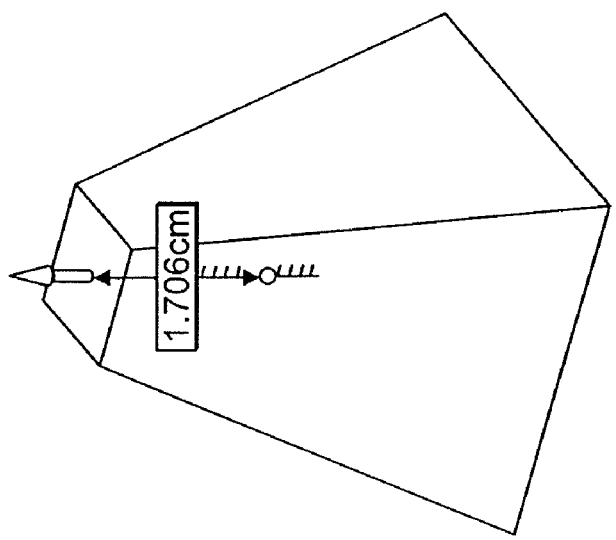
FIGS. 54 a-c show how secondary selections modify an offset pull action.
Figure 54B:
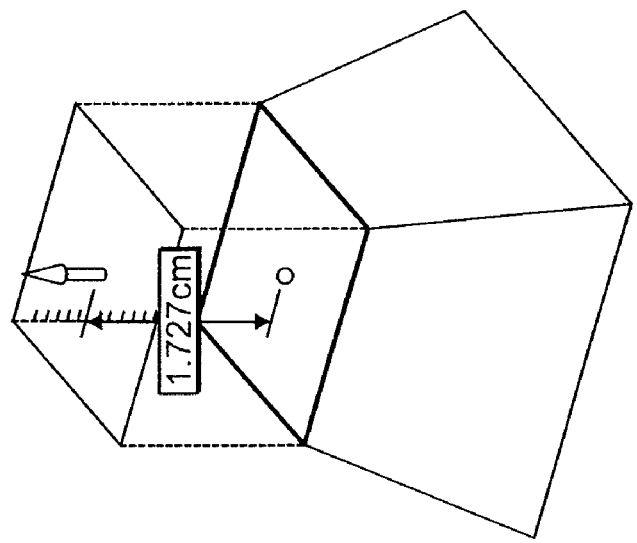
Figure 54A:
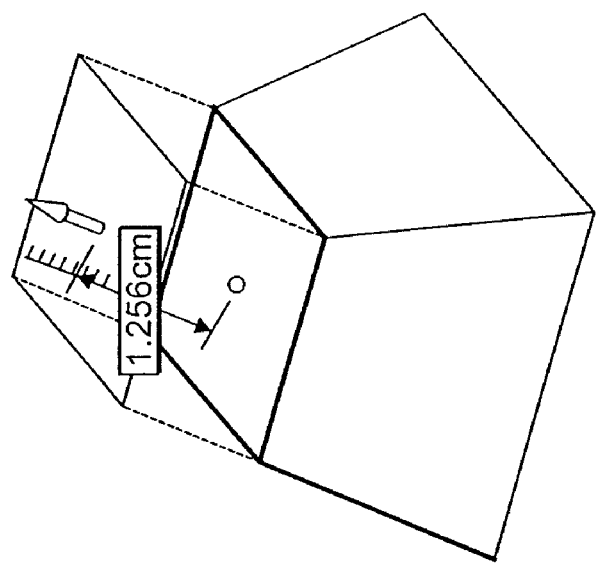

If there is a secondary direction selection, at step 3036 the tool performs the appropriate action in that direction, as shown in FIG. 54*a*, as opposed to the natural (offset) direction defined by the primary selection, as shown in FIG. 54*b*. When faces and edges are selected, the influences of the side faces at each edge are ignored, and the face is isolated from the effects of neighboring geometry, as shown in FIG. 54*b*. When only faces are selected, then the effects from the neighboring faces are used to determine what the result should be during the pull action, as shown in FIG. 54*c*.

If there is no secondary direction selection, then at step 3038, the tool checks if multiple faces are selected. If there are multiple faces from different bodies, then the Pull tool switches to Flowchart B for blends. If only a single face is selected, then the Pull tool offers the Both Sides, Add, and Cut options to the user. The tool extrudes the faces and edges in a direction perpendicular to each face using the same set of calls as in step 3036.

Figure 31:
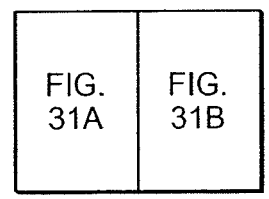
FIG. 31 (Flowchart B) describes detailed back-end logic for implementation of the 3D curve, blend, boundary blend, and sweep functions of the Pull tool.
Figure 31A:
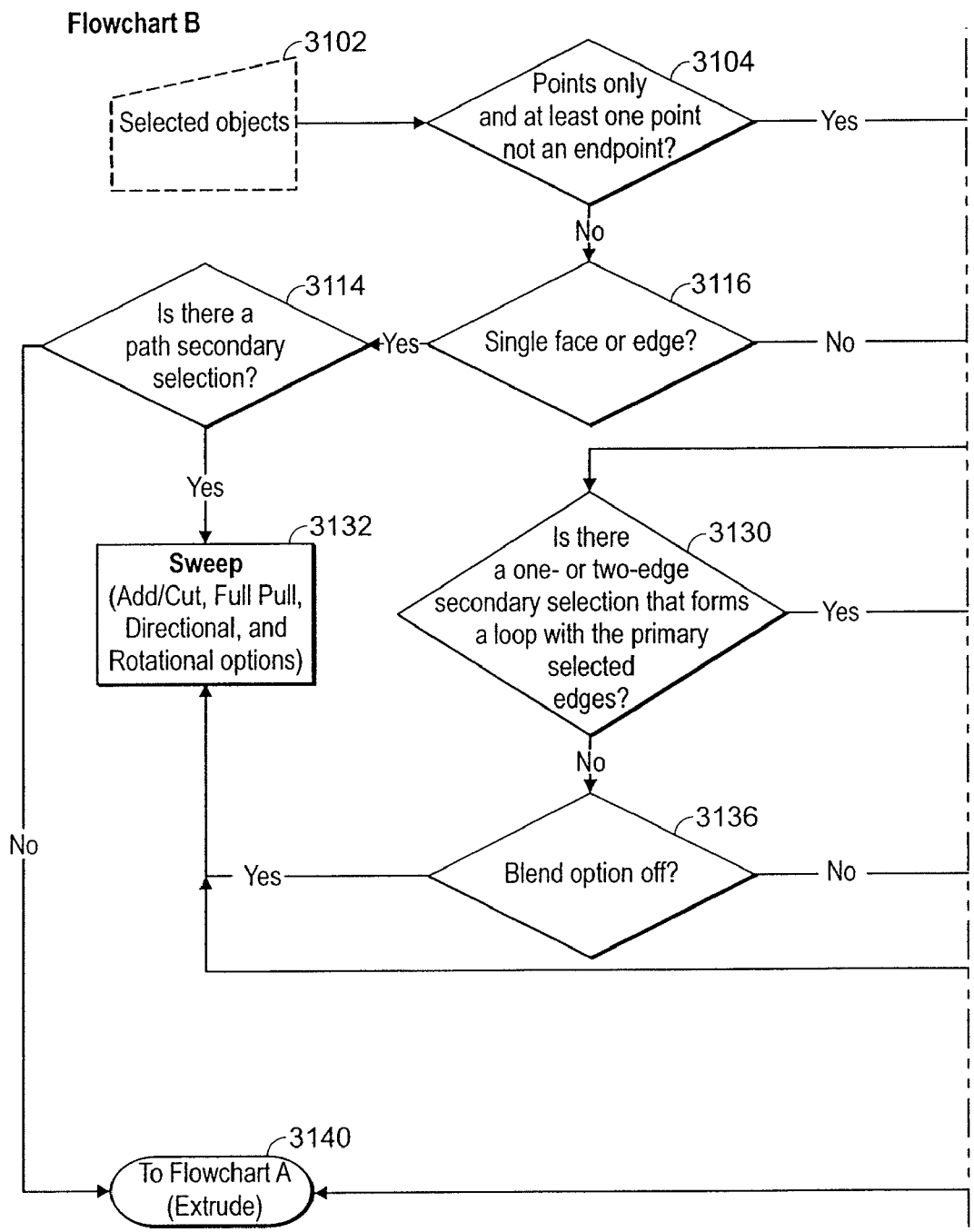
Figure 31B:
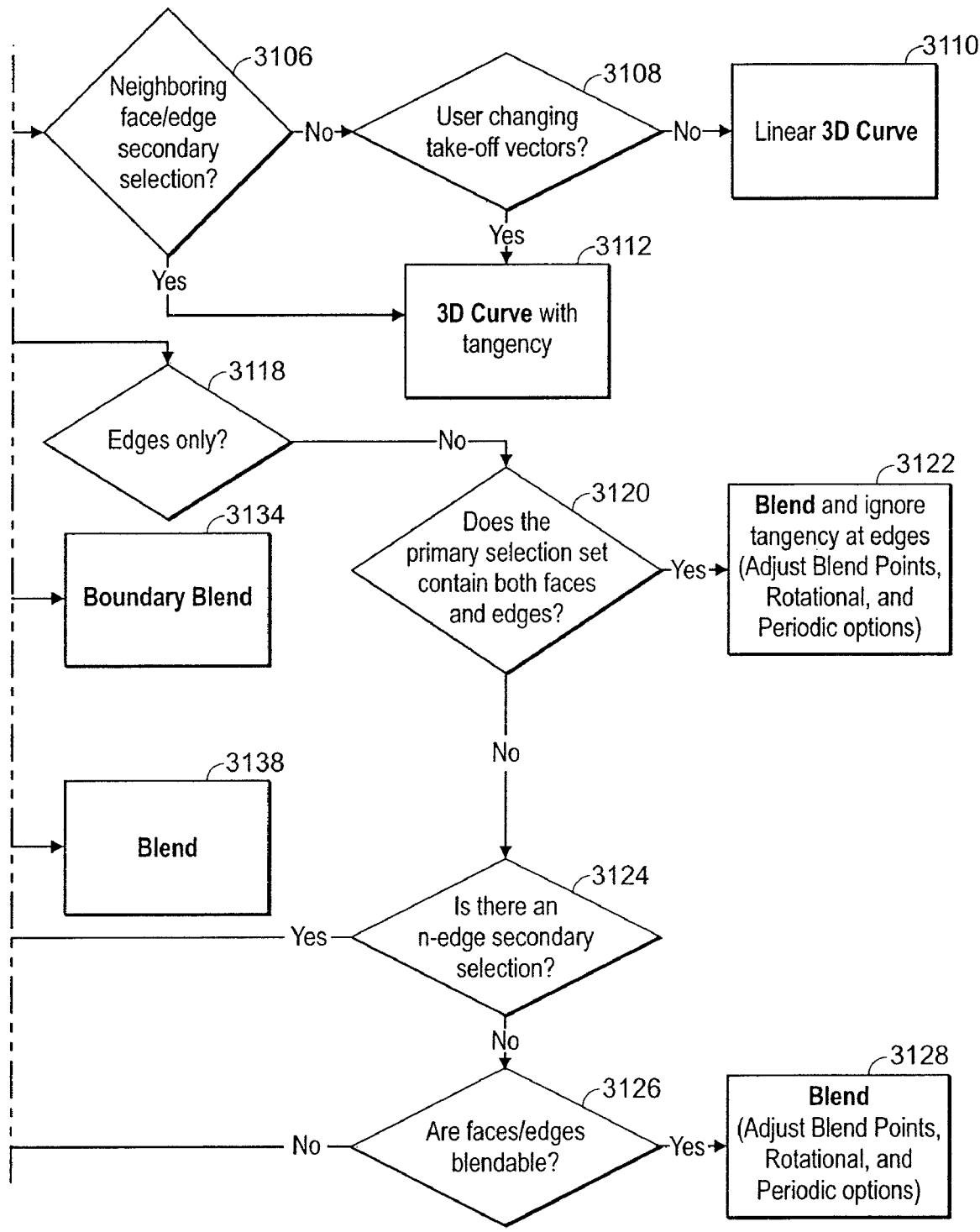

FIG. 31 (Flowchart B) describes detailed back-end logic for implementation of the 3D curve, blend, boundary blend, and sweep functions of the Pull tool. Once the user selects objects, the objects are analyzed and categorized by the Pull tool. (The complete logic for determining the pull action from the primary and secondary selections is shown in FIG. 28.) If the selected objects are a set of two or more points, and there are no secondary selections or user modifications, a 3D spline curve is fitted through the selected points. If neighboring faces or edges to the points are secondary selected, a 3D curve is created that is tangent to the secondary selected faces or edges. The user can also modify take-off vectors to control the tangency of the curve at its endpoints.

If the selected object is a single face or edge, then the Pull tool checks for a path secondary selection. If there is a path secondary selection, then the Pull tool sweeps the selected object along the path, and offers the Add, Cut, Full Pull, Directional Sweep, and Rotational Sweep options to the user as appropriate based on the geometry. The Directional Sweep option is offered when the user categorizes a direction or normal-to-a-path reference as a direction using the Pull Direction sub-tool. The Rotational Sweep option is offered when the user categorizes an axis as a rotation reference using the Pull Rotate sub-tool. If there is no path, the Pull tool switches to the workflow shown in Flowchart A to extrude the objects.

If the user only selected edges, and there is a secondary selection of one or two edges that form a loop together with the primary selected edges, then the Pull tool creates a boundary blend between the edges to form a surface. If there is no secondary selection or a loop is not formed, and the user has not selected the Blend option, then the Pull tool sweeps the selected object along the path, and offers the Add, Cut, Full Pull, Directional Sweep, and Rotational Sweep options to the user as appropriate based on the geometry selected with the Direction and Rotate Pull sub-tools. If the Blend option is selected, then the Pull tool blends between the edges.

If the user selected both faces and edges and the Blend option, the Pull tool blends between the faces, ignoring tangency at the selected edges, and offers the Rotational, Periodic, and Adjust Blend Points options to the user as appropriate. The Rotational option is offered if a cylinder or cone can be made across any two or more edges formed by the selection set as the blend is performed. Periodic is offered if the number of unique faces is three or more. Adjustment of blend points is offered as icons placed wherever there are an unequal number of segments, measured across the selected unique faces. If the user selected either three or more edges or two or more faces, and there is a secondary selection of some number of edges, the Pull tool sweeps the edges or faces along the edge secondary selections. If there is no secondary selection, and the selected edges or faces are blendable (for example, at least two faces not in the same body or coincident; at least two curves or edges not in the same body and not touching endpoints), the Pull tool blends them to create a surface or solid. If they are not blendable, the Pull tool switches to the workflow shown in Flowchart A.

We will now describe some cases that illustrate this detailed logic. The interactions with the geometry engine and object database are similar to the interactions in the description of Flowchart A (FIG. 30), and are not repeated again below.

Figure 55B:
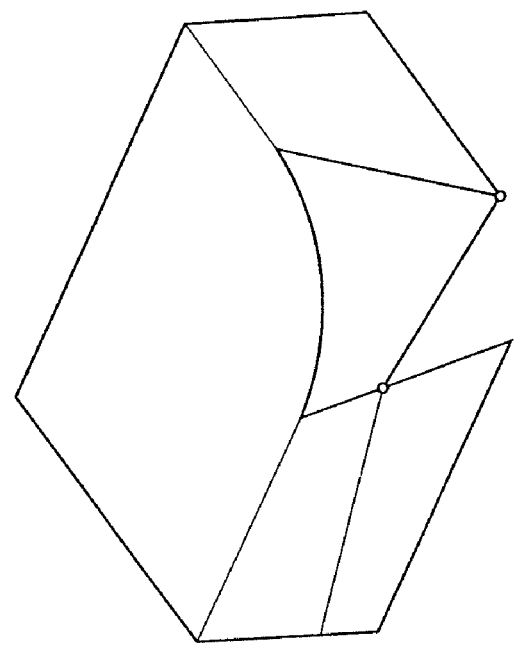
FIGS. 55 a-b show the difference between a linear 3D curve and one with tangency.
Figure 55A:
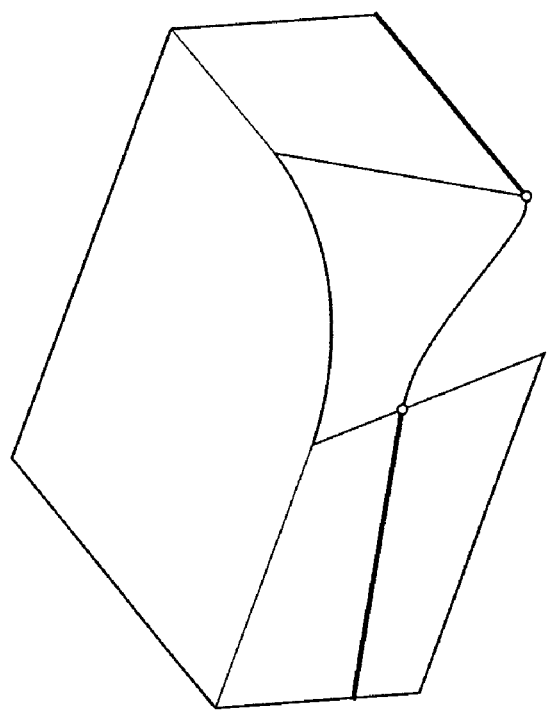

In the case of a 3D curve, the user has selected a set of points at step 3102. At step 3104, the Pull tool analyzes the selected objects to determine if the set consists only of points. If it does, then it checks at step 3106 whether the secondary selection set includes the edges or faces on which the points are located. If there are edges and/or faces in the secondary selection set, then they are used to control the tangency at the endpoints of the 3D curve at step 3112, as shown in FIG. 55*a*. If there is no secondary selection, but the user modifies the take-off vectors of the 3D curve, then tangency will be set by these user modifications at step 3112. With no secondary selection or user modification, a linear 3D curve is created at step 3110, as shown in FIG. 55*b*.

Figure 56B:
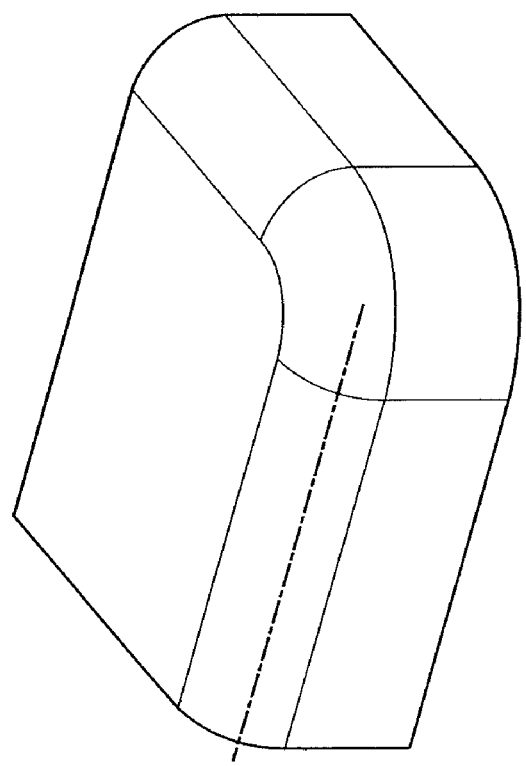
FIGS. 56 a-b show the user creating a boundary blend with the Pull tool.
Figure 56A:
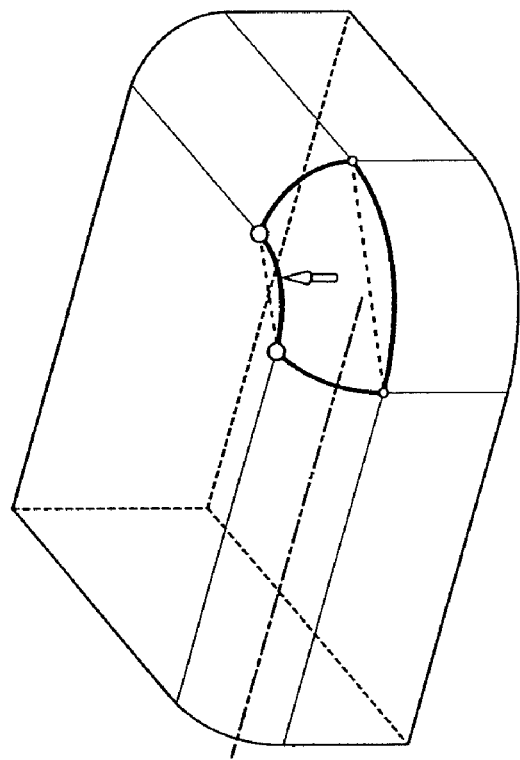

In the case of a boundary blend, the user has selected a set of edges at step 3102. At step 3104, the Pull tool analyzes the selected objects to determine if the set consists only of points. Since it does not, it proceeds to step 3116, where it analyzes the objects to determine if there is only one face or one edge. Since the objects do not match this criteria, it proceeds to step 3118, where it analyzes the objects to determine if they are only edges. Since the set consists of edges only, the Pull tool checks to see if there are one or two edges in the secondary selection set that complete the loop of edges in the primary selection set at step 3130 (shown in FIG. 56*a*). If the edges do form a complete loop, then the Pull tool creates a boundary blend, which generates a surface between the edges at step 3134, as shown in FIG. 56*b*.

Figure 57:
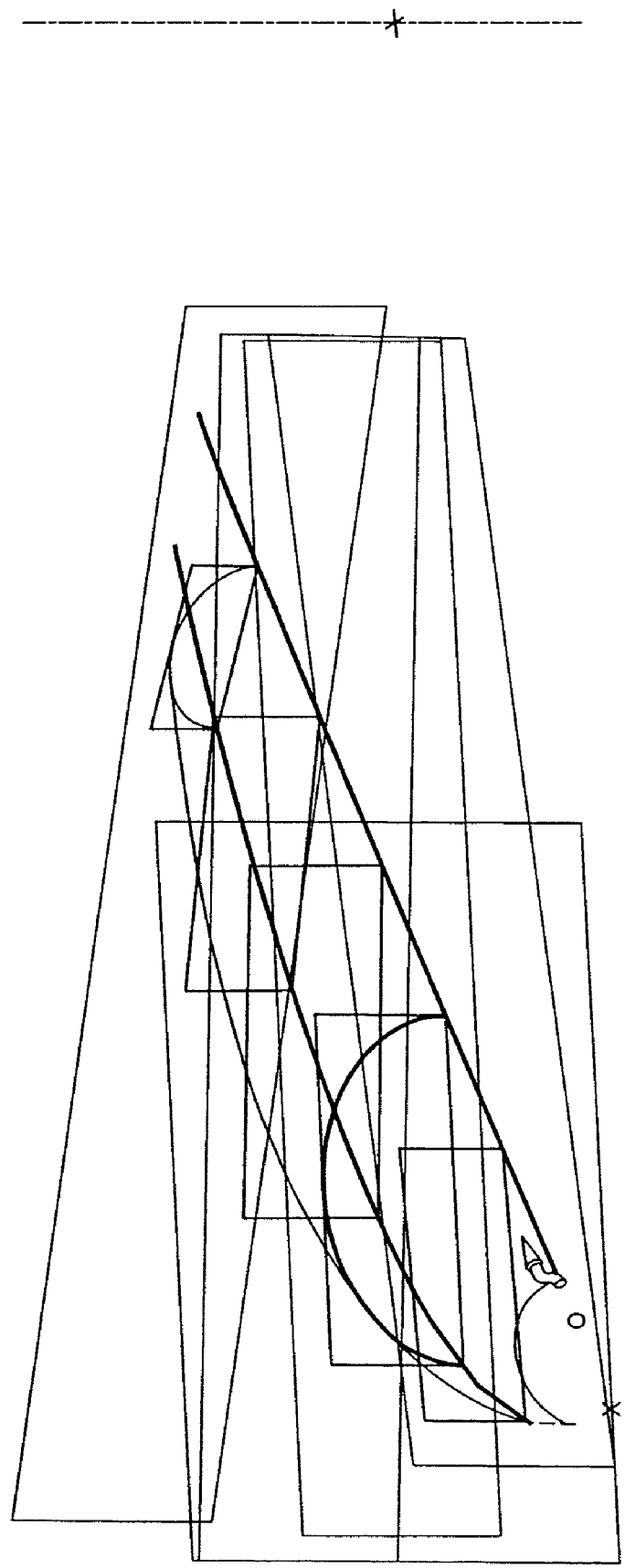
FIG. 57 shows a rotational sweep created with the Pull tool.

In the case of a rotational sweep, the user has selected one or more faces or edges to sweep, one or more paths to sweep along, and an axis to rotate the sections around at step 3102. At step 3104, the Pull tool analyzes the selected objects to determine if the set consists only of points. Since it does not, it proceeds to step 3116, where it analyzes the objects to determine if there is only one face or one edge. Since the objects do not match this criteria, it proceeds to step 3118, where it analyzes the objects to determine if they are only edges. Since the objects do not match this criteria either, the Pull tool proceeds to step 3120, where it analyzes the objects in the primary selection set to determine if both faces and edges are selected. Since the objects do not match this criteria, the Pull tool proceeds to step 3124, where it analyzes the secondary selection set to determine if it contains one or more edges. Since the user selected one or more paths to sweep along, this condition is satisfied, so the Pull tool proceeds to step 3132, where it offers the sweep options to the user. Because the user wants to perform a rotational sweep, they select the Rotational option to rotate the sweep sections around the selected axis. An example of a selection set and previewed rotational sweep is shown in FIG. 57.

Figure 58C:
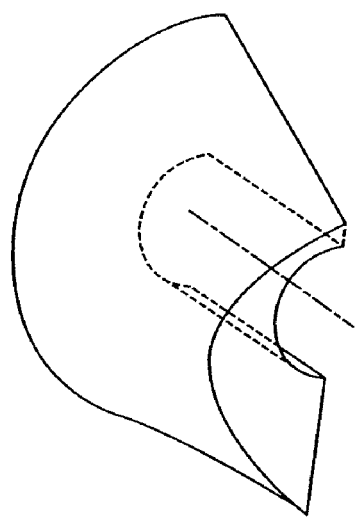
FIGS. 58 a-c show the difference between the selections for a blend and rotational blend, and the result of the rotational blend created with the Pull tool.
Figure 58B:
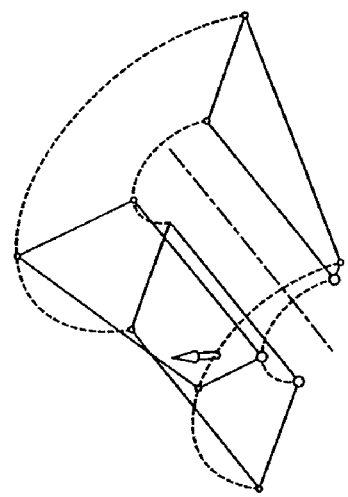
Figure 58A:
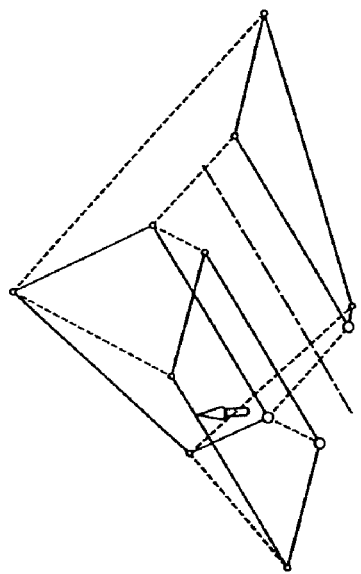

In the case of a rotational blend, the user has selected a set of faces at step 3102 that are oriented such that they rotate around a common axis. An example of such a set is shown in FIG. 41*a*. (A rotational blend can also be created with a set of edges, but this case is not described here.) At step 3104, the Pull tool analyzes the selected objects to determine if the set consists only of points. Since it does not, it proceeds to step 3116, where it analyzes the objects to determine if they are only edges. Since the objects do not match this criteria either, the Pull tool proceeds to step 3120, where it analyzes the objects in the primary selection set to determine if both faces and edges are selected. Since the objects do not match this criteria, the Pull tool proceeds to step 3124, where it analyzes the secondary selection set to determine if it contains one or more edges. Again, the objects do not match this criteria, so the Pull tool proceeds to step 3126, where it determines that the set of faces selected by the user are blendable, and proceeds to step 3128, where it offers the blend options to the user, and displays the previewed geometry or a blend, as shown in FIG. 58*a*. Because the user wants to perform a rotational blend, they select the Rotational option to create a blend around the common axis of the selected faces, as shown in FIG. 58*b*. The completed blend is shown in FIG. 58*c*.

Figure 32:
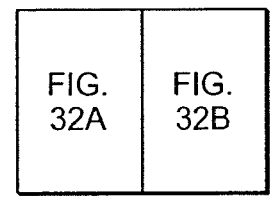
FIG. 32 (Flowchart C) describes detailed back-end logic for implementation of the rotate, angular rib, planar offset rib, and helix functions of the Pull tool.
Figure 32A:
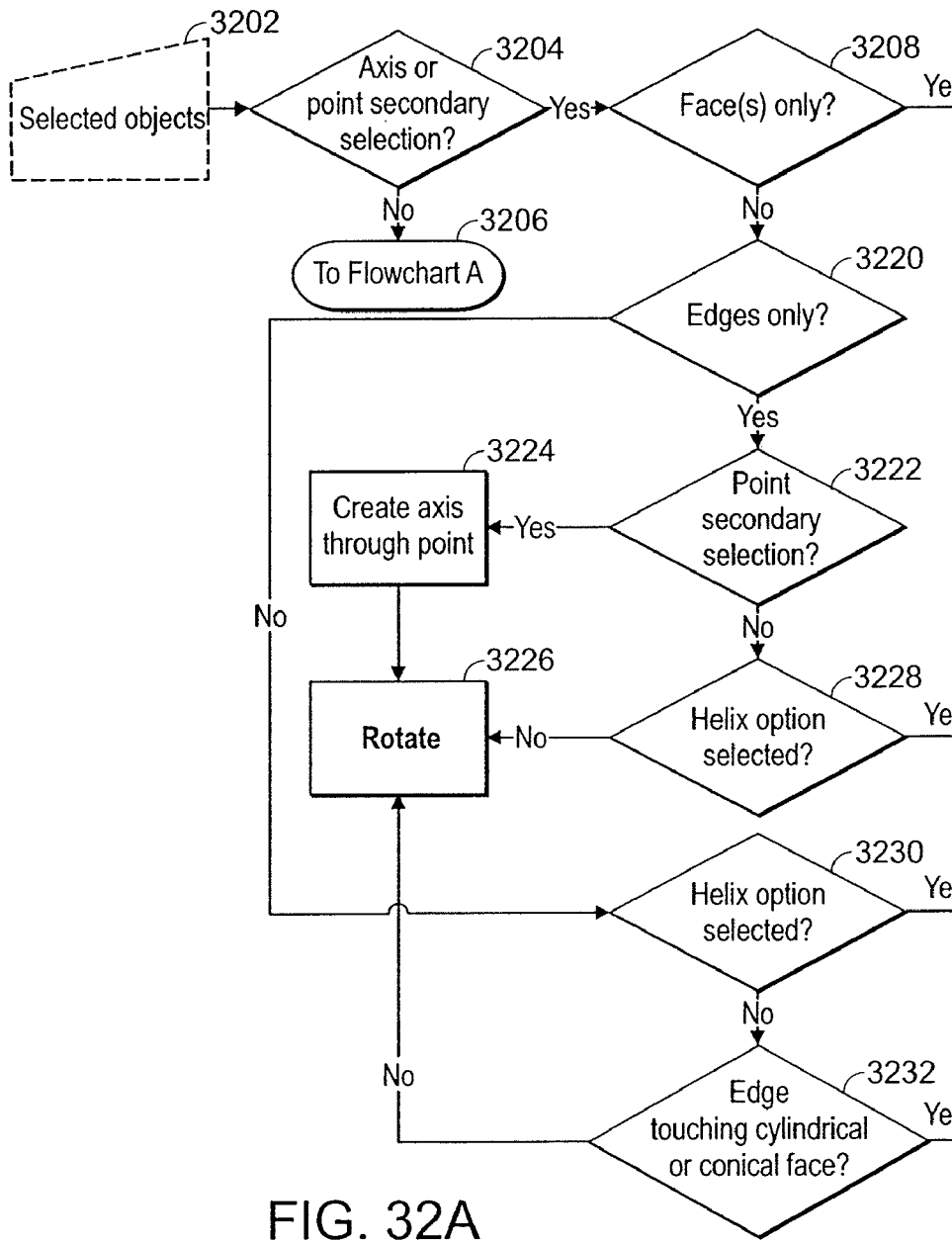
Figure 32B:
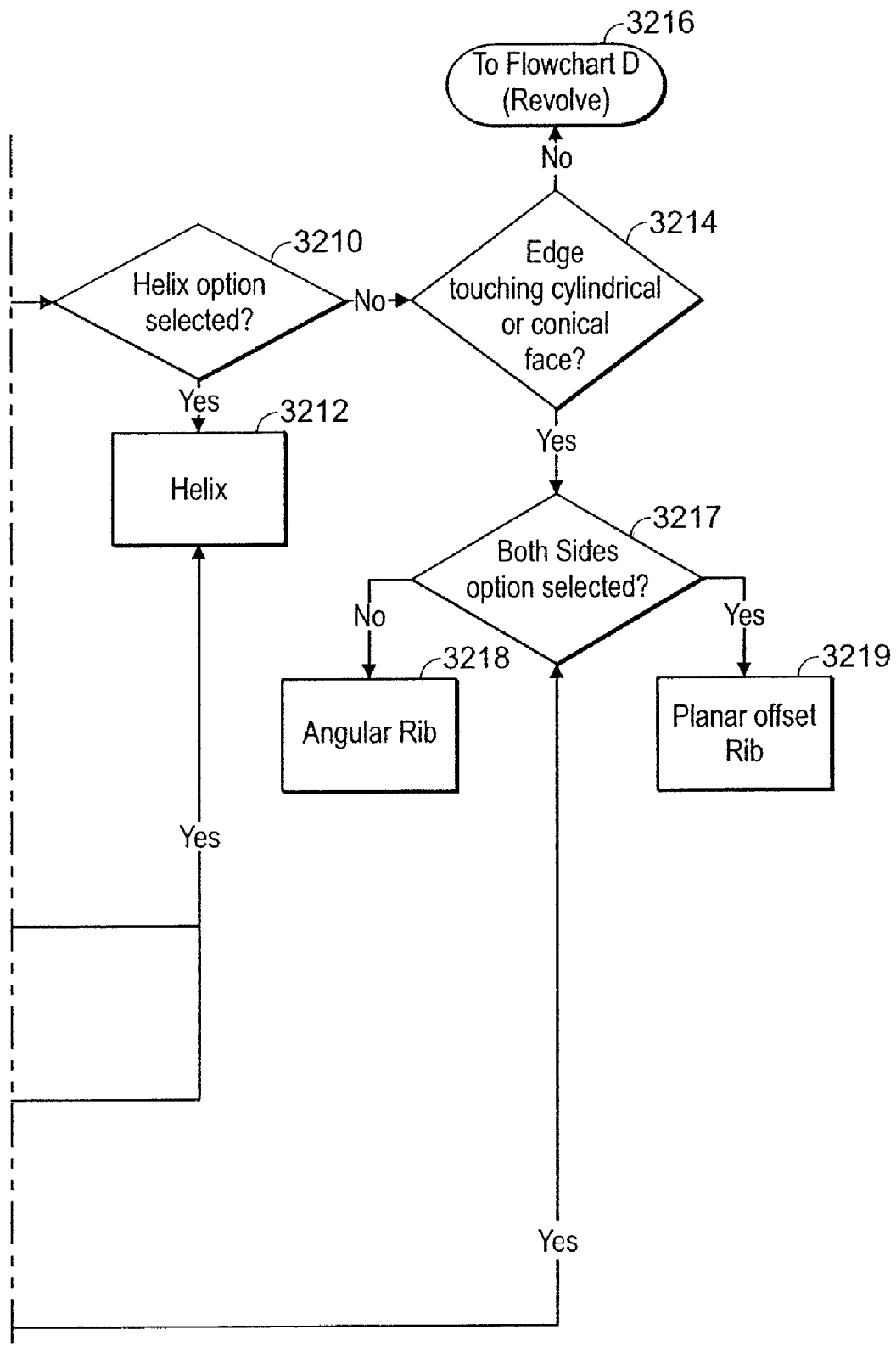

FIG. 32 (Flowchart C) describes detailed back-end logic for implementation of the rotate, angular rib, planar offset rib, and helix functions of the Pull tool. Once the user selects objects, the objects are analyzed and categorized by the Pull tool. (The complete logic for determining the pull action from the primary and secondary selections is shown in FIG. 28.) If the secondary selected object set contains an axis, the primary selection set contains only faces, and the Helix option is selected, then dragging with the Pull tool or entering dimensions creates a helix. A helix can also be created from a set containing only edges or a set containing both edges and faces.

If the secondary selected object set contains an axis, the primary selection set contains only faces, one of the edges of the objects in the primary selection set touches a cylindrical or conical face, and the Both Sides option is selected, then dragging with the Pull tool creates a planar offset rib. If the Both Sides option is not selected, then dragging with the Pull tool creates an angular rib.

If the secondary selected object set contains an axis, the primary selection set contains both faces and edges, and the Helix option is not selected, then dragging with the Pull tool rotates the selected objects. The influences of the side faces at each edge are ignored, and the face is isolated from the effects of neighboring geometry as the face is rotated. If the primary selection set contains only edges, and the secondary selected object set is a point, the Pull tool creates an axis through the point and dragging with the Pull tool rotates the edges.

We will now describe some cases that illustrate this detailed logic. The interactions with the geometry engine and object database are similar to the interactions in the description of Flowchart A (FIG. 30), and are not repeated again below.

Figure 59B:
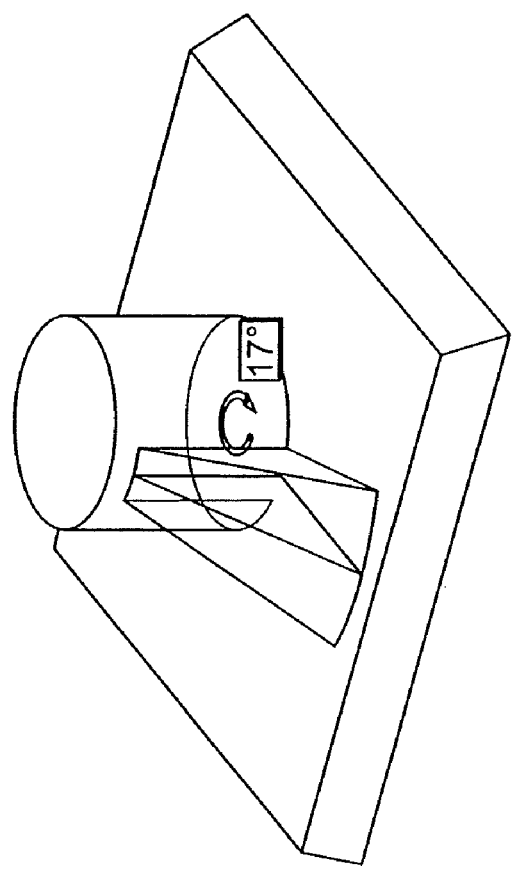
FIGS. 59 a-b show the user creating an angular rib.
Figure 59A:
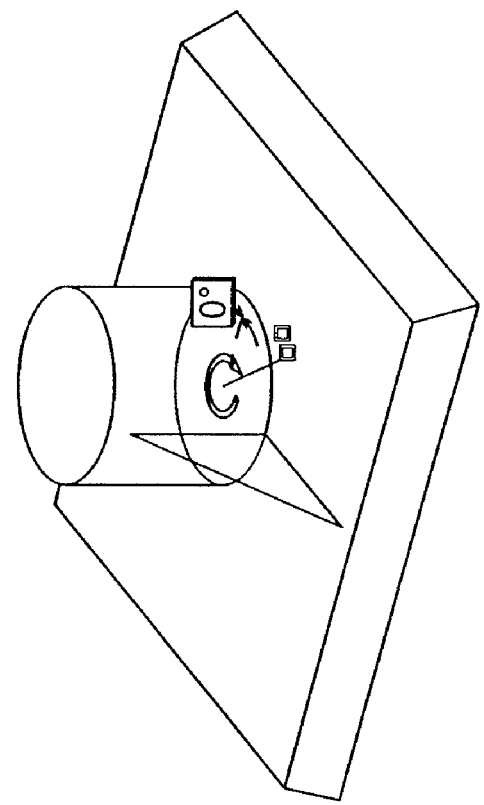

In the case of an angular rib, the user has selected a triangular planar surface and secondary selected a cylindrical face, as shown in FIG. 59*a*, at step 3202. At step 3204, the Pull tool checks to see if there is an axis or point secondary selection. Since the user secondary selected the cylindrical face, the tool automatically translates that selection into the face's axis. The tool proceeds to step 3208, where it checks the selection set and finds that the primary selection set is comprised of a single face, so it proceeds to step 3210, where it checks whether the Helix option is selected. Since the user did not select the Helix option, the tool proceeds to step 3214 and checks whether any of the edges on the triangular planar surface touch the cylindrical face. Since one of the edges does touch the cylindrical face, the tool proceeds to step 3217. In this case, the user does not select the Both Sides option, because they do not want the sides to be parallel. When the user drags with the Pull tool, an angular rib is created at step 3218, as shown in FIG. 59*b*. The opposing faces of the new solid form the angle displayed in the dimension.

Figure 60B:
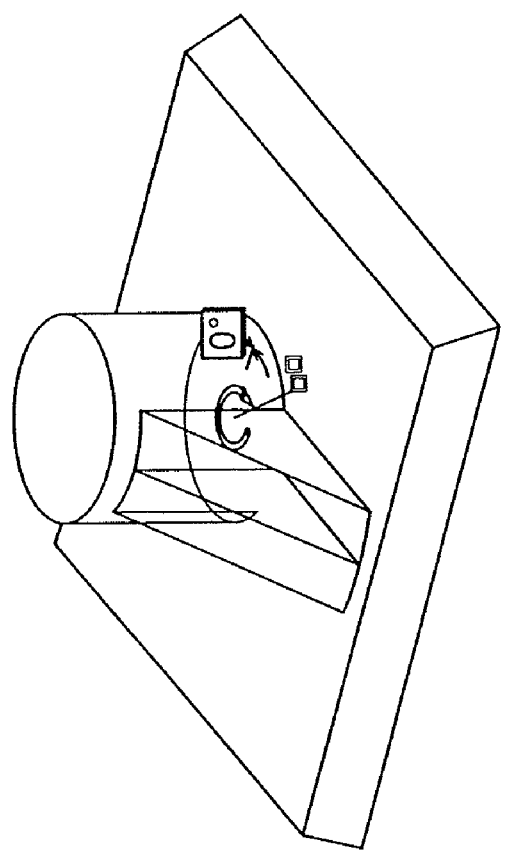
FIGS. 60 a-b show the user creating a planar offset rib.
Figure 60A:
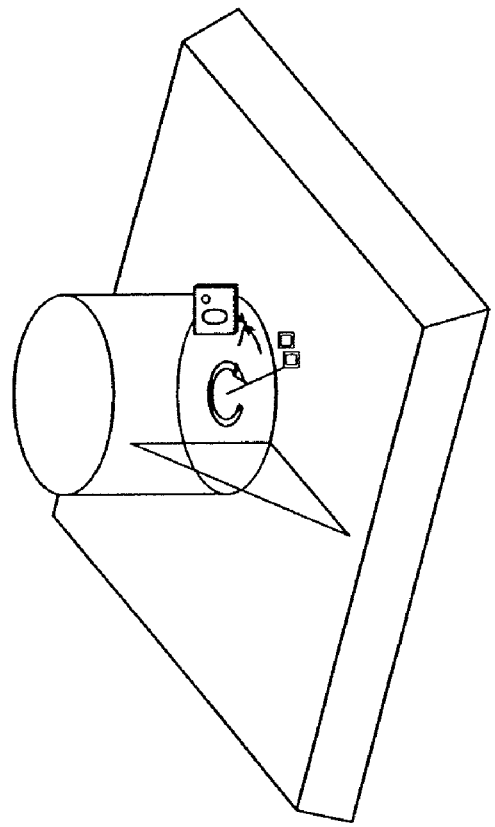

In the case of a planar offset rib, the user begins with the same selection (as shown in FIG. 60*a*) and the Pull tool proceeds through the same logic as described for the angular rib above, except that when the Pull tool checks at step 3217 whether the Both Sides option is selected, it finds that the user has selected it to keep the opposite edges parallel to each other. When the user drags with the Pull tool, a planar offset rib is created at step 3219, as shown in FIG. 60*b*.

Figure 33:
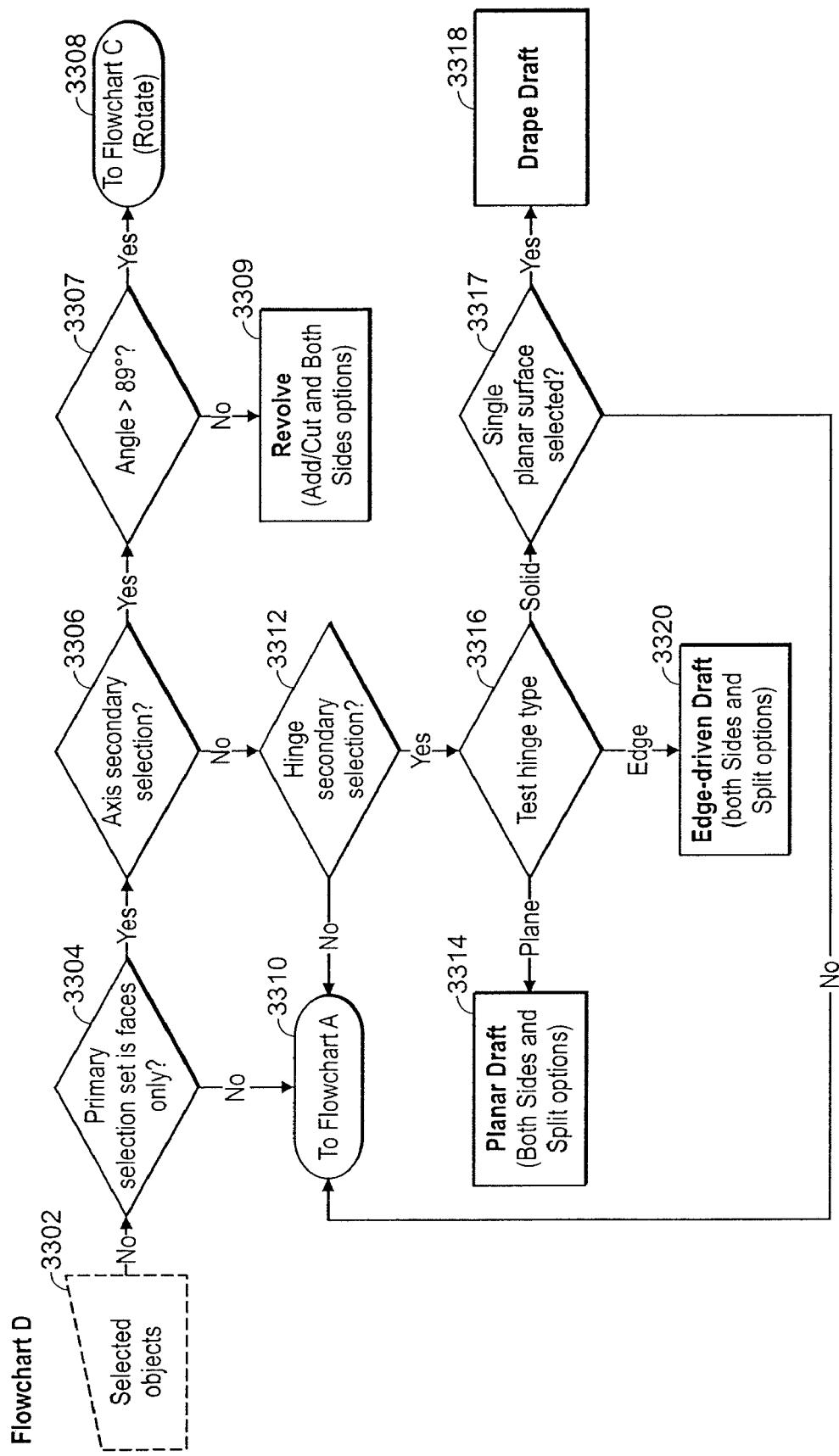
FIG. 33 (Flowchart D) describes detailed back-end logic for implementation of the revolve, planar draft, edge-driven draft, and drape draft functions of the Pull tool.

FIG. 33 (Flowchart D) describes detailed back-end logic for implementation of the revolve, planar draft, edge-driven draft, and drape draft functions of the Pull tool. Once the user selects objects, the objects are analyzed and categorized by the Pull tool. (The complete logic for determining the pull action from the primary and secondary selections is shown in FIG. 28.) If the primary selection set includes objects that are not faces, then the Pull tool switches to the workflow shown in Flowchart A. If the set contains only faces, then the tool analyzes the objects in the secondary selection set. If the secondary selection is an axis, then the Pull tool offers the Add, Cut, and Both Sides options to the user, and revolves the faces up to 89 degrees. The tool switches to the workflow shown in Flowchart C to rotate the faces once the user drags further than 89 degrees.

If the secondary selection is an object that can act as a hinge (a plane, edge, or solid), then the Pull tool tests for the hinge type. If the hinge is a plane, then the tool offers the Both Sides and Split options to the user and performs a planar draft when the user drags the faces. If the hinge is an edge, then the tool offers the Both Sides and Split options to the user and performs an edge-driven draft when the user drags the faces. If the hinge is a solid, then the tool checks whether the primary selection set is a single, planar surface. If it is, then the surface is draped over the hinge solid when the user drags the surface. If the primary selection set is not a single planar surface, the Pull tool switches to the workflow described in Flowchart A.

We will now describe some cases that illustrate this detailed logic. The interactions with the geometry engine and object database are similar to the interactions in the description of Flowchart A (FIG. 30), and are not repeated again below.

Figure 61B:
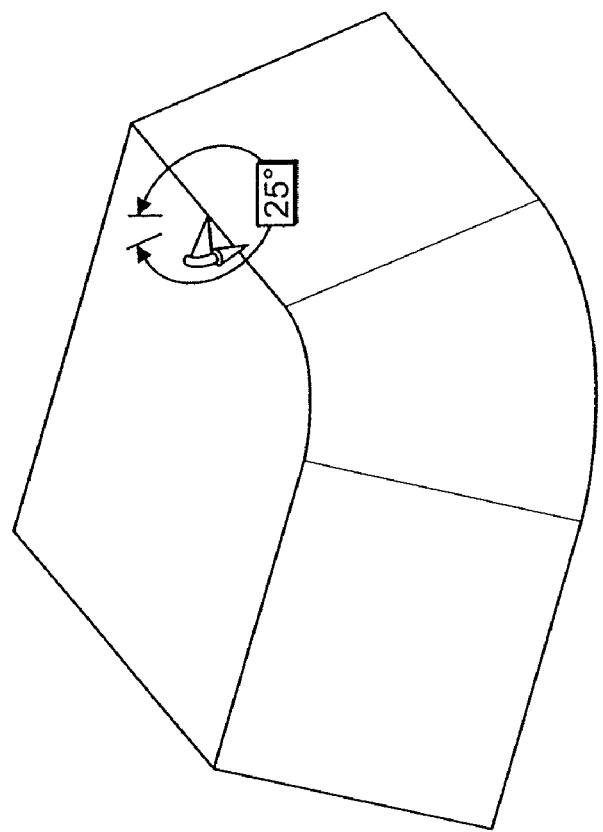
FIGS. 61 a-b show the user creating a planar draft.
Figure 61A:
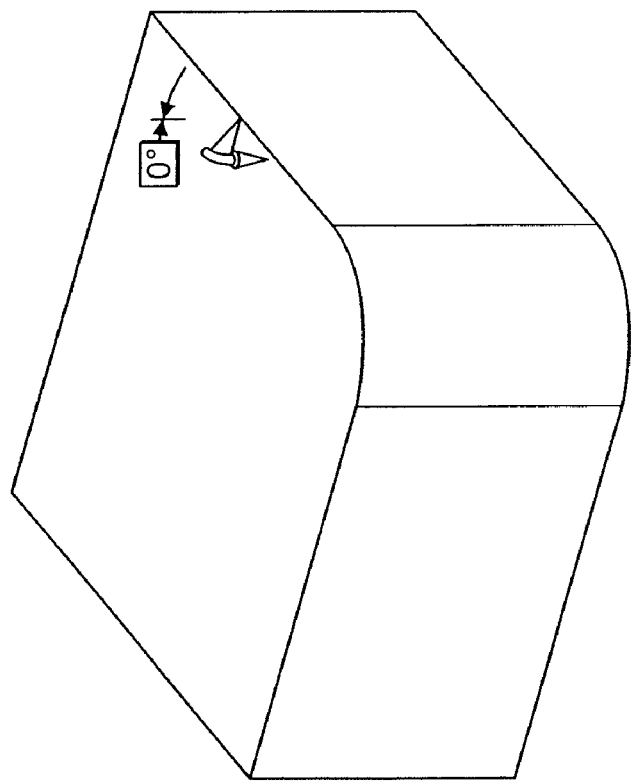

In the case of a planar draft, the user has selected three tangent faces of a solid and secondary selected the top face of the solid at step 3302, as shown in FIG. 61*a*. At step 3304, the Pull tool analyzes the primary selection set and determines that it contains only faces, so it proceeds to step 3306, where it checks whether the secondary selection is an axis. Since it is not, it proceeds to step 3312, where it checks whether the secondary selection is a hinge. Since it is, the Pull tool tests the type of hinge at step 3316. Since the hinge is a plane (that is, a planar face), the Pull tool offers the Both Sides and Split options to the user and creates a planar draft at step 3314, as shown in FIG. 61*b*. The selected faces are pivoted about the line formed where each face meets the planar hinge.

In the case of a planar draft, the user has selected three tangent faces of a solid and secondary selected a non-planar surface that intersects the solid, as well as the top and bottom tangent edges at step 3302, as shown in FIG. 61*a*. At step 3304, the Pull tool analyzes the primary selection set and determines that it contains only faces, so it proceeds to step

Figure 62:
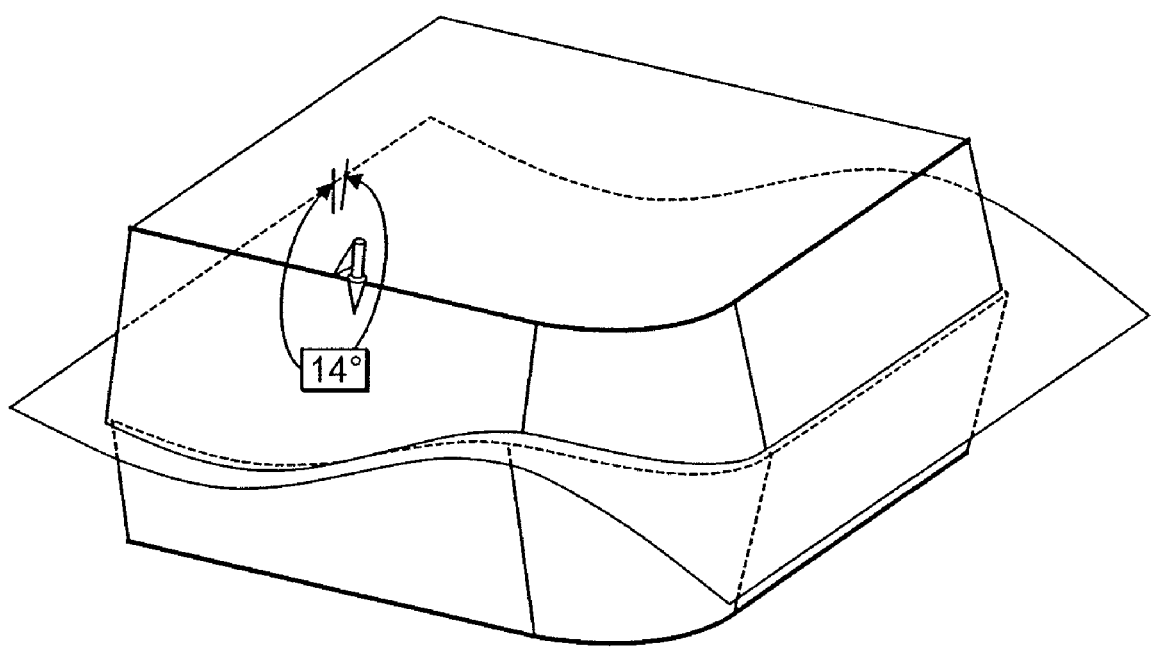
FIG. 62 shows the user creating a two edge-driven draft.

3306, where it checks whether the secondary selection is an axis. Since it is not, it proceeds to step 3312, where it checks whether the secondary selection is a hinge. Since it is, the Pull tool tests the type of hinge at step 3316. Since the hinge consists of two sets of edges, the Pull tool offers the Both Sides and Split options to the user and creates a two edge-driven draft at step 3314, and shown in FIG. 62. The secondary selected, non-planar surface is used to define the area in which discontinuities between the differently-angled faces will be resolved.

Figure 34B:
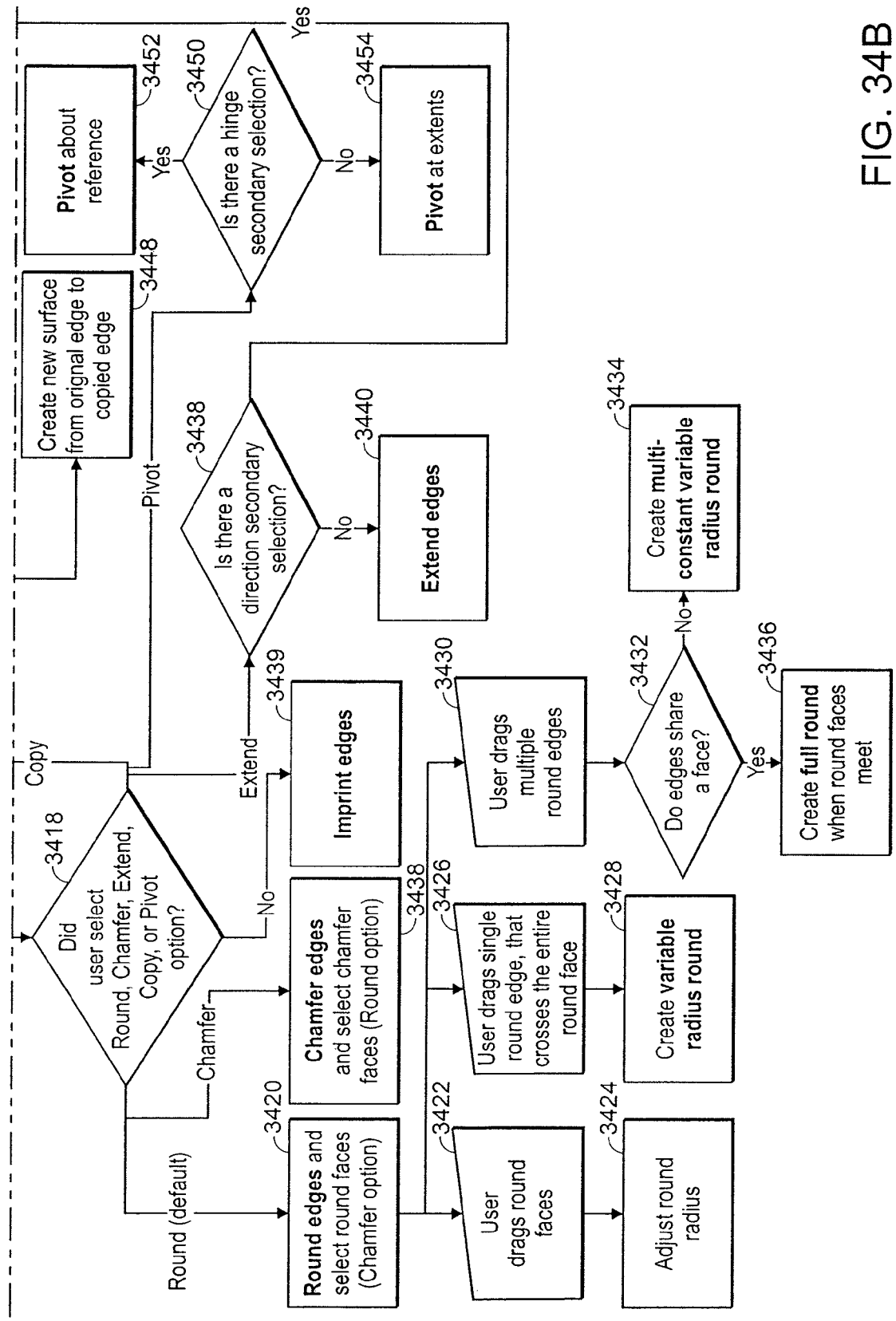
FIG. 34 (Flowchart E) describes detailed back-end logic for implementation of the pull functions that act edges (or 3D curves), such as the round, full round, variable radius round, multi-constant variable radius round, chamfer, extend edge, extend edge along surface, trim surface, imprint, extend curve, pivot at extents, pivot about reference, and copy edge functions.

FIG. 34 (Flowchart E) describes detailed back-end logic for implementation of the pull functions that act on edges (or 3D curves), such as the round, full round, variable radius round, multi-constant variable radius round, chamfer, extend edge, extend edge along surface, trim surface, extend curve, pivot at extents, pivot about reference, and copy edge functions. Once the user selects objects, the objects are analyzed and categorized by the Pull tool. (The complete logic for determining the pull action from the primary and secondary selections is shown in FIG. 28.) If the primary selection set contains only a single curve endpoint, then the Pull tool extends the curve.

If the primary selection set contains only external surface edges and there is a direction secondary selection, the tool analyzes the direction. If the direction is linear, the Pull tool switches to the workflow shown in Flowchart A to extrude the edges. If the direction is radial, the tool offsets the edges in the radial direction. If there are only external surface edges and no direction secondary selection, then, when the user drags with the Pull tool toward the interior of the surface, the Pull tool trims the surface by offsetting the edge inward. When the user drags away from the surface, the tool extends the surface by offsetting the edge outward.

If the primary selection set contains internal surface edges or the edges of a solid, and there is an edge between a planar face and a cylinder, then the edges are chamfered, the chamfer face is selected, and the Round option is offered to the user.

Next, the Pull tool checks whether the user selected an edge option. If the Chamfer option is selected, the Pull tool chamfers the edge, selects the chamfer face, and offers the Round option to the user. If the Round option is selected, the tool rounds the edge, selects the round face, and offers the Chamfer option to the user. If the user then drags the selected round face, the tool modifies the radius of the round. If the user drags a single edge of the round, and that edge crosses from one tangent edge of the round to the other tangent edge of the round (in the direction of the radius), the tool creates a variable radius round. If the user drags multiple edges of the round, the tool checks whether those edges share a face. If they do share a face, the tool creates a full round when the user drags far enough so that the two round faces meet. If the edges do not share a face, then the tool creates a multi-constant variable radius round.

If the Extend option is selected and there is a direction secondary selection, the Pull tool switches to the workflow shown in Flowchart A to extrude the edges. If there is no secondary selection, the tool extends the edges. If the Copy option is selected and the user drags the edges onto an existing face, the Pull tool copies the edges. If the user drags the edges off a face, then the Pull tool creates a new surface from the original edges to the copied edges. If the Pivot option is selected and there is a hinge secondary selection, then the Pull tool pivots the edges about the selected hinge. If there is no hinge secondary selection, then the tool pivots the edges at their extents (that is, a plane drawn through the point furthest from, or edge parallel to, the selected edge).

We will now describe some cases that illustrate the detailed logic shown in FIG. 34 (Flowchart E). The interactions with the geometry engine and object database are similar to the interactions in the description of Flowchart A (FIG. 30), and are not repeated again below.

Figure 63B:
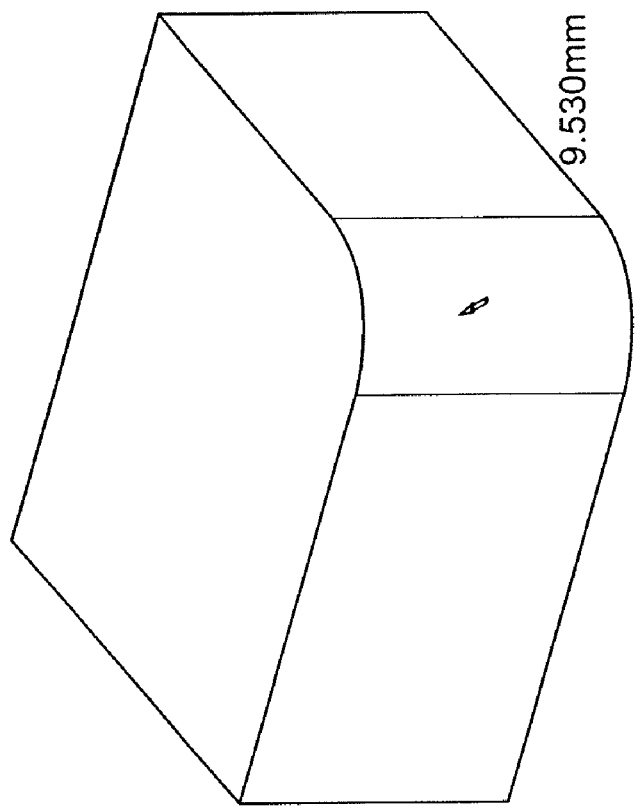
FIGS. 63 a-b show the user creating a round.
Figure 63A:
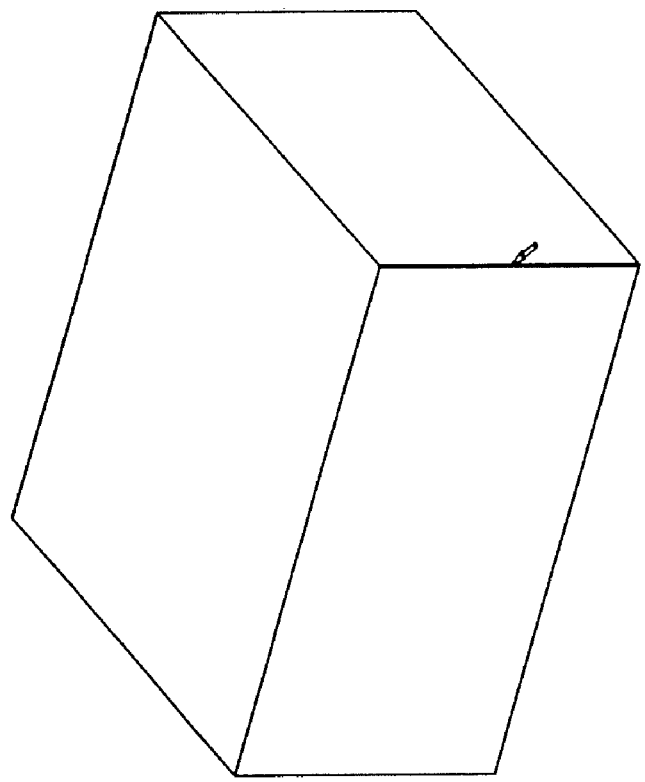

In the case of a round, the user has selected a single edge of a solid at step 3402, as shown in FIG. 63*a*. At step 3303, the Pull tool checks whether the selection set contains the endpoint of a curve. Since it does not, the Pull tool proceeds to step 3405, where it tests the selected edge and determines that it is a solid edge, and therefore proceeds to step 3414, where it checks whether the edge is between a planar face and cylinder. Since it is not, the tool proceeds to step 3418, where it checks for a user-selected option. The Round option is selected by default, and since the user does not change the option, the tool proceeds to step 3420. At this step, the tool rounds the edge to form a round face, as shown in FIG. 63*b*, then selects the round face and presents the Chamfer option to the user to make it easier to modify the round.

Figure 64B:
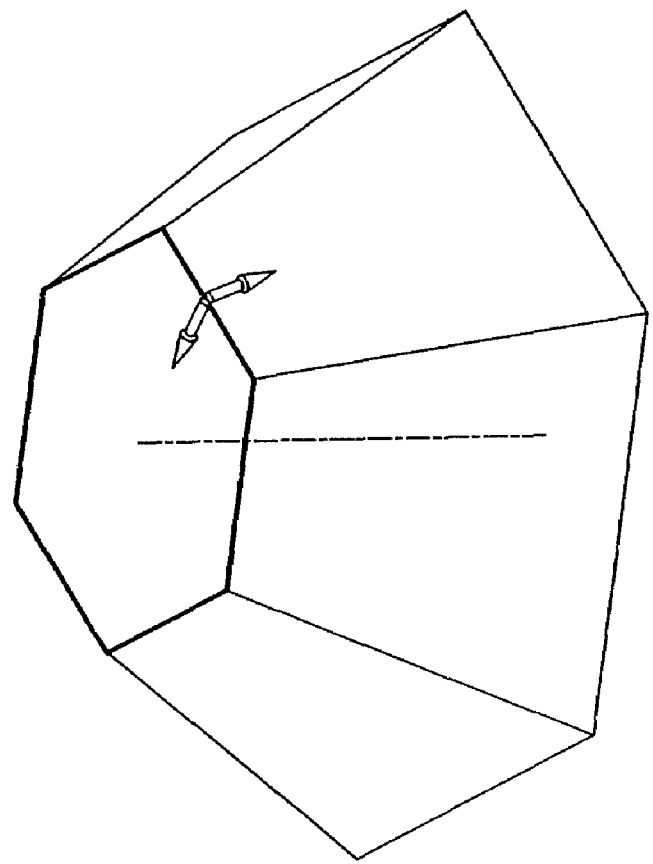
FIGS. 64 a-b show the user pivoting at the extents of the edge.
Figure 64A:
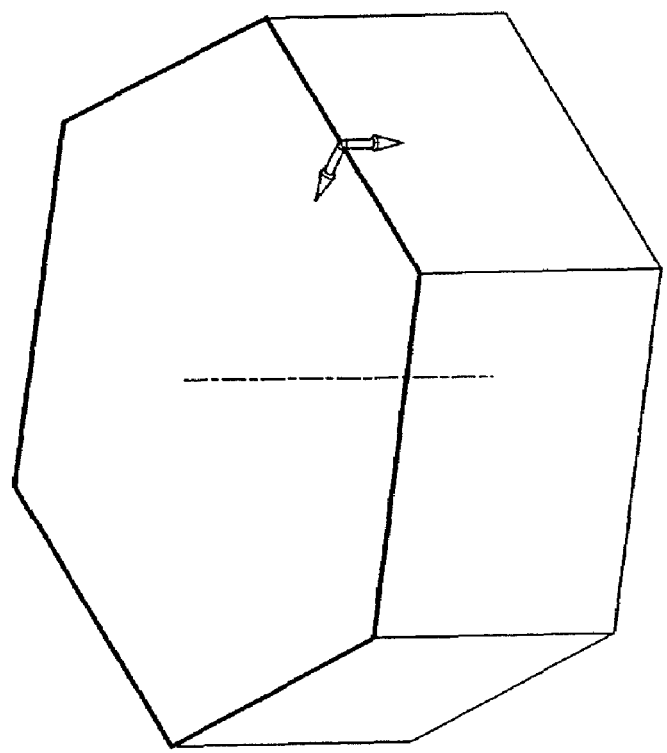

In the case of pivoting at edge extents, the user has selected all the edges of the top face of a solid at step 3402, as shown in FIG. 64*a*. At step 3303, the Pull tool checks whether the selection set contains the endpoint of a curve. Since it does not, the Pull tool proceeds to step 3405, where it tests the selected edges and determines that they are all solid edges, and therefore proceeds to step 3414, where it checks whether any edge is between a planar face and cylinder. Since none of the edges meet this criteria, the tool proceeds to step 3418, where it checks for a user-selected option. The user has selected the Pivot option, so the tool proceeds to step 3450. At this step, the Pull tool checks for a secondary selection that could act as a hinge. Since there is no secondary selection, the tool pivots the solid faces around the selected edges at step 3454, as shown in FIG. 64*b*.

Figure 35:
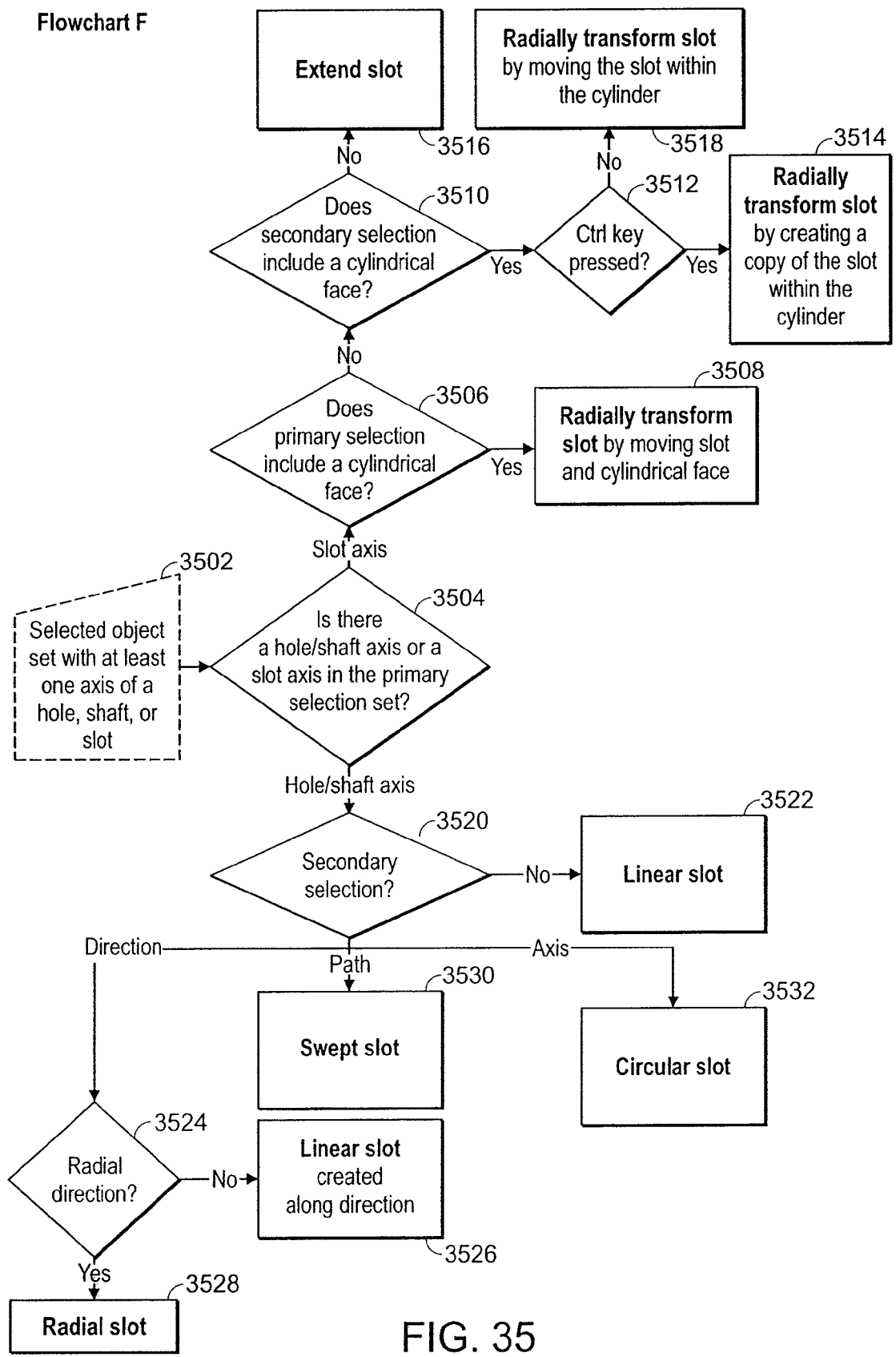
FIG. 35 (Flowchart F) describes detailed back-end logic for implementation of the pull functions that create slots, such as linear, radial, circular, and swept slot, as well as the pull functions that modify slots, such as extend slot and radially transform slot.

FIG. 35 (Flowchart F) describes detailed back-end logic for implementation of the pull functions that create slots, such as linear, radial, circular, and swept slots, as well as the pull functions that modify slots, such as extend slot and radially transform slot. Once the user selects objects, the objects are analyzed and categorized by the Pull tool. (The complete logic for determining the pull action from the primary and secondary selections is shown in FIG. 28.) If the primary selection set contains the axis of a hole or shaft, the Pull tool creates a slot. If the primary selection set contains the axis of an existing slot, the Pull tool modifies the slot.

If the Pull tool is creating a slot from a hole or shaft, and there is no secondary selection, the tool creates a linear slot. If there is a radial direction secondary selection, the tool creates a radial slot. If the direction is not radial, the tool creates a linear slot along the direction. If there is a path secondary selection, the tool creates a slot swept along the path. If there is an axis secondary selection, the tool creates a circular slot around the axis.

If the Pull tool is modifying an existing slot, and the primary selection set includes a cylindrical face that is coaxial to the slot, then the Pull tool moves both the slot and the selected cylindrical face. If the primary selection set does not include a cylindrical face, but the secondary selection set does, then the Pull tool checks whether the user is pressing the Ctrl key. If they are, then the tool creates a copy of the slot within the cylinder, and moves it in the radial direction as the user drags. If the Ctrl key is not pressed, the tool moves the slot in the radial direction within the cylinder. If no cylindrical face is selected, the tool extends the slot.

We will now describe some cases that illustrate this detailed logic. The interactions with the geometry engine and object database are similar to the interactions in the description of Flowchart A (FIG. 30), and are not repeated again below.

Figure 65B:
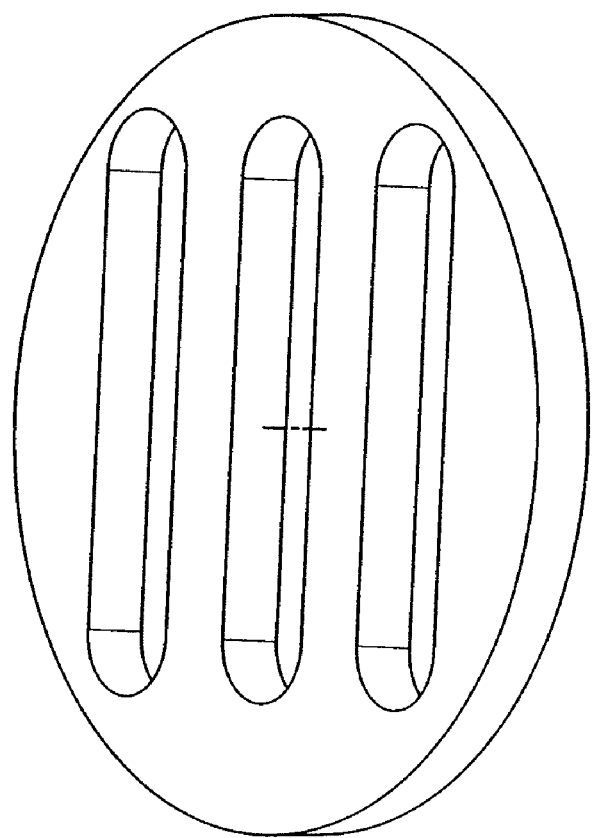
FIGS. 65 a-b show the user creating a linear slot.
Figure 65A:
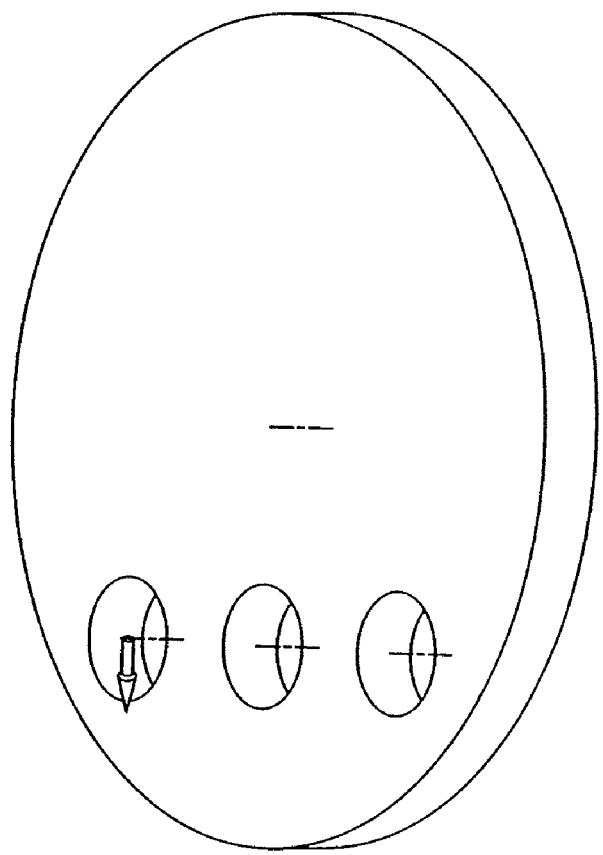

In the case of a linear slot, the user has selected the axes of three holes at step 3502, as shown in FIG. 65a. At step 3504, the Pull tool analyzes the primary selection set and determines that it contains hole axes, so it proceeds to step 3520, where it checks for a secondary selection. Since there is no secondary selection, it proceeds to step 3522, where it creates one linear slot for each selected hole axis, as shown in FIG. 65b.

Figure 66B:
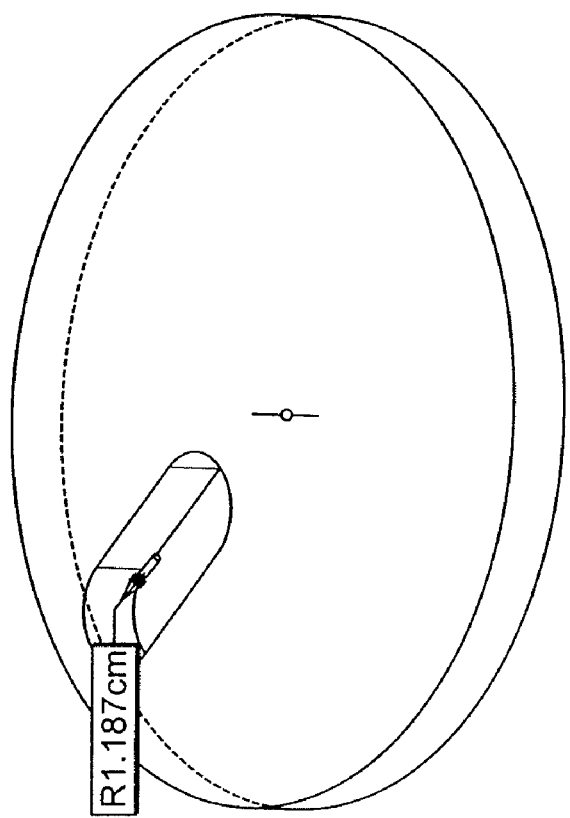
FIGS. 66 a-b show the user creating a radial slot.
Figure 66A:
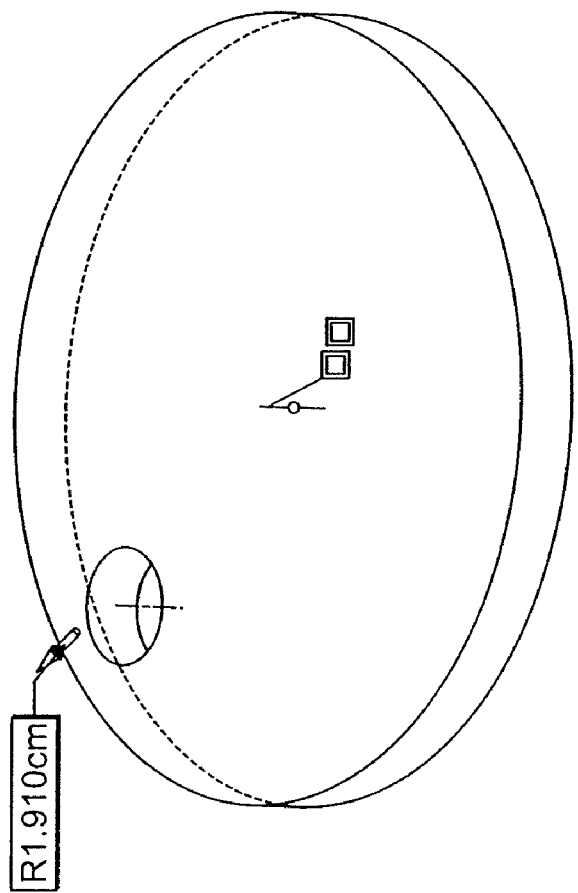

In the case of a linear slot, the user has selected the axis of a hole and secondary selected a cylindrical face to set a radial direction at step 3502, as shown in FIG. 66a. At step 3504, the Pull tool analyzes the primary selection set and determines that it contains a hole axis, so it proceeds to step 3520, where it checks for a secondary selection. The secondary selection is a direction, so the tool proceeds to step 3524 where it checks whether it is a radial direction. Since the secondary selection is a radial direction, the tool proceeds to step 3528, where it creates a radial slot toward the axis of the cylindrical face, as shown in FIG. 65b.

Figure 67B:
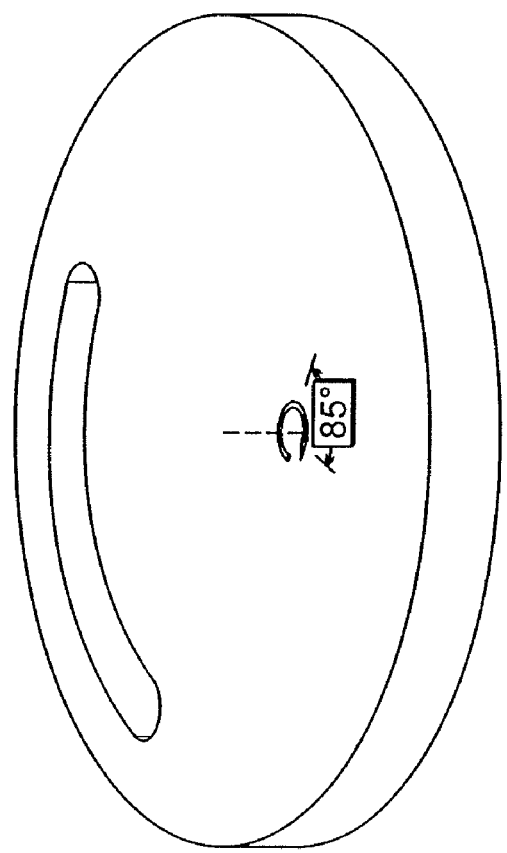
FIGS. 67 a-b show the user creating a circular slot.
Figure 67A:
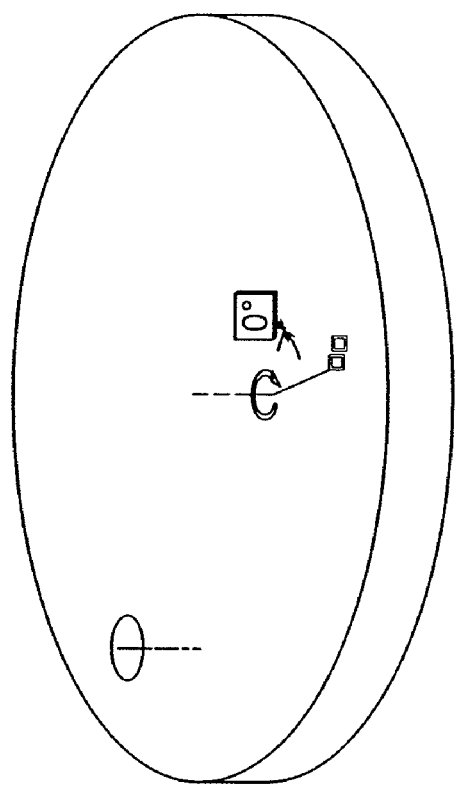

In the case of a linear slot, the user has selected the axis of a hole and secondary selected secondary selected the cylindrical solid's axis at step 3502, as shown in FIG. 67a. At step 3504, the Pull tool analyzes the primary selection set and determines that it contains a hole axis, so it proceeds to step 3520, where it checks for a secondary selection. The secondary selection is an axis, so the tool proceeds to step 3532, where it creates a circular slot rotated around the axis of the cylindrical face, as shown in FIG. 67b.

Figure 68B:
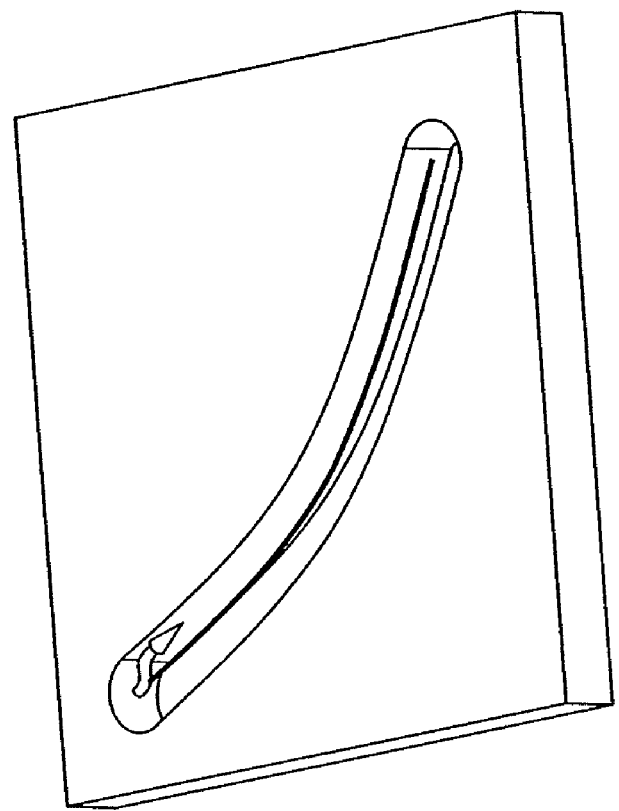
FIGS. 68 a-b show the user creating a swept slot.
Figure 68A:
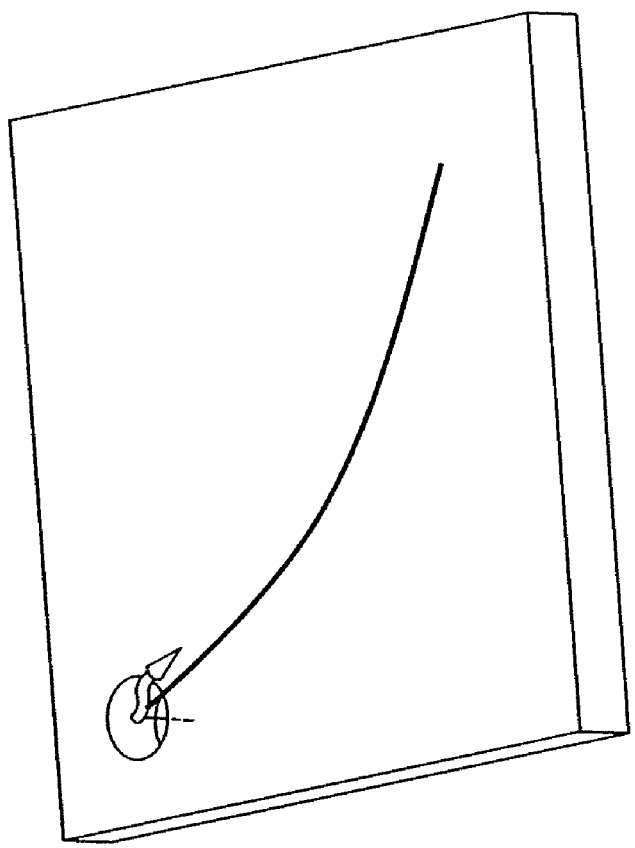

In the case of a linear slot, the user has selected the axis of a hole and secondary selected secondary selected curve to act as a path at step 3502, as shown in FIG. 68a. At step 3504, the Pull tool analyzes the primary selection set and determines that it contains a hole axis, so it proceeds to step 3520, where it checks for a secondary selection. The secondary selection is a path, so the tool proceeds to step 3530, where it creates a slot swept along the path, as shown in FIG. 68b.

Accordingly the reader will see that, according to one embodiment of the invention, we have provided a tool within a three-dimensional modeling software application that, given any surface or solid can modify that surface or solid.

While the above description contains many specificities, these should not be construed as limitations on the scope of any embodiment, but as exemplifications of the presently preferred embodiments thereof. Many other ramifications and variations are possible within the teachings of the various embodiments.

What is claimed is:

1. A method for interactively modifying the underlying geometry of at least one CAD object using a single modification tool capable of modifying the at least one CAD object in multiple ways, the single modification tool predicting a user's intended modification, and performing the predicted modification without recording related history information indicating historical changes made to the at least one CAD object as it has been changed and modified over time, the method comprising:

(a) using the underlying geometry of at least one CAD object to display it with a corresponding position and orientation within a three dimensional modeling space, wherein the at least one CAD object is a three dimensional boundary representation CAD object, and wherein the at least one CAD object is displayed within a graphical user interface of a computer aided design modeling system;

(b) receiving from a user, through the single modification tool, a selection of the at least one CAD object;

(c) the single modification tool automatically predicting the user's intended type of three dimensional modification to the at least one CAD object based on the type of the at least one CAD object and the at least one CAD object's relationships with the geometry of at least one surrounding CAD object, wherein the single modification tool is capable of performing multiple types of three dimensional modifications and the predicted three dimensional modification is selected from the multiple types of modifications without explicit commands from the user directing the type of modification to be performed and the predicted three dimensional modification is selected by categorizing the selection of at least one CAD object and the at least one CAD object's relationships with the geometry of the at least one surrounding CAD object;

(d) receiving, from the user, an amount of change for the predicted three dimensional modification to the at least one CAD object;

(e) the single modification tool modifying the at least one CAD object in accordance with the predicted type of three dimensional modification and the amount of change, wherein the modified at least one CAD object is redisplayed in real-time for further interactive modification by the user; and (f) updating the underlying geometry of the at least one CAD object such that changes to the displayed at least one CAD object are reflected in the updated underlying geometry representation of the at least one CAD object stored within the computer aided design modeling system, and performing such updates without recording history information.

2. The method of claim 1, wherein the automatic prediction of the intended type of modification can be overridden by a user command.

3. The method of claim 1, wherein the predicted type of modification is at least one of an offsetting the at least one CAD object, blending the at least one CAD object, thickening the surface of the at least one CAD object, generating a full round on the at least one CAD object, extruding the at least one CAD object, sweeping the at least one CAD object, revolving the at least one CAD object, generating a rib on the at least one CAD object, generating a helix from the at least one CAD object, performing a planar draft with the at least one CAD object, performing an edge-driven draft with the at least one CAD object, and performing a drape draft with the at least one CAD object, extruding the CAD object, blending and edge of the CAD object, and sweeping the CAD object.

4. The method of claim 1, wherein the predicted type of modification is at least one of performing a round on the at least one CAD object, extending an edge of the at least one CAD object, trimming the at least one CAD object, pivoting an edge of the at least one CAD object, variably rounding the at least one CAD object, blending the at least one CAD object, directionally sweeping the at least one CAD object, rotationally sweeping the at least one CAD object, boundary blending the at least on CAD object, rotating an edge of the at least one CAD object, scaling the at least one CAD object generating a slot on the at least one CAD object, generating a swept slot on the at least one CAD object, generating a circular slot on the at least on CAD object, radially transforming a slot on the at least one CAD object, and generating a 3D curve with the at least one CAD object.

5. The method of claim 1, wherein the amount of change for the modification to the at least one CAD object is indicated by at least one of a drag, a dimension, and a geometry reference.

6. The method of claim 1, wherein the single modification tool modifies the at least one CAD object in accordance with the predicted type of modification, the amount of change, and the at least one CAD object's geometrical relationships with at least one of, one or more surrounding CAD objects, and one or more related CAD objects.

7. The method of claim 6, wherein the modification by the single modification tool comprises at least one of rounding and chamfering the at least one CAD object's edges with at least one of, the one or more surrounding CAD objects, and the one or more related CAD objects.

8. The method of claim 1, further comprising receiving from a user, through the single modification tool, a selection of at least one reference CAD object, wherein the single modification tool automatically predicts the user's intended type of modification to the at least one CAD object based on the type of the at least one CAD object, the type of the at least one reference CAD object, and the at least one CAD object's relationships with the geometry of at least one of, one more surrounding CAD objects, and one or more related CAD objects.

9. The method of claim 8, wherein the at least one CAD object is a face and the at least one reference CAD object is an axis.

10. A computer system, comprising a processor, a display with a graphical user interface, and a memory for storing CAD models, for interactively modifying the underlying geometry of at least one CAD object using a single modification tool capable of modifying the at least one CAD object in multiple ways, the single modification tool predicting a user's intended modification, and performing the predicted modification without recording related history information indicating historical changes made to the at least one CAD object as it has been changed and modified over time, the system comprising:

(a) using the underlying geometry of at least one CAD object to display it with a corresponding position and orientation within a three dimensional modeling space, wherein the at least one CAD object is a boundary representation CAD object and wherein the at least one CAD object is displayed within the graphical user interface of the display;

(b) receiving from a user, using an input device, through the single modification tool, a selection of the at least one CAD object;

(c) the single modification tool automatically predicting the user's intended type of three dimensional modification to the at least one CAD object based on the type of the at least one CAD object and the at least one CAD object's relationships with the geometry of at least one surrounding CAD object, wherein the single modification tool is capable of performing multiple types of three dimensional modifications and the predicted three dimensional modification is selected from the multiple types of modifications without explicit commands from the user directing the type of modification to be performed and the predicted three dimensional modification is selected by categorizing the selection of at least one CAD object and the at least one CAD object's relationships with the geometry of the at least one surrounding CAD object;

(d) receiving, from the user, an amount of change for the predicted three dimensional modification to the at least one CAD object;

(e) the single modification tool modifying the at least one CAD object in accordance with the predicted type of three dimensional modification and the amount of change, wherein the modified at least one CAD object is redisplayed in real-time for further interactive modification by the user; and (f) updating the underlying geometry of the at least one CAD object such that changes to the displayed at least one CAD object are reflected in the updated underlying geometry representation of the at least one CAD object stored within the memory of the computer system, and performing such updates without recording history information.

11. The system of claim 10, wherein the automatic prediction of the intended type of modification can be overridden by a user command.

12. The system of claim 10, wherein the predicted type of modification is at least one of an offsetting the at least one CAD object, blending the at least one CAD object, thickening the surface of the at least one CAD object, generating a full round on the at least one CAD object, extruding the at least one CAD object, sweeping the at least one CAD object, revolving the at least one CAD object, generating a rib on the at least one CAD object, generating a helix from the at least one CAD object, performing a planar draft with the at least one CAD object, performing an edge-driven draft with the at least one CAD object, and performing a drape draft with the at least one CAD object, extruding the CAD object, blending and edge of the CAD object, and sweeping the CAD object.

13. The system of claim 10, wherein the predicted type of modification is at least one of performing a round on the at least one CAD object, extending an edge of the at least one CAD object, trimming the at least one CAD object, pivoting an edge of the at least one CAD object, variably rounding the at least one CAD object, blending the at least one CAD object, directionally sweeping the at least one CAD object, rotationally sweeping the at least one CAD object, boundary blending the at least on CAD object, and rotating an edge of the at least one CAD object, scaling the at least one CAD object, generating a slot on the at least one CAD object, generating a swept slot on the at least one CAD object, generating a circular slot on the at least on CAD object, radially transforming a slot on the at least one CAD object, and generating a 3D curve with the at least one CAD object.

14. The system of claim 10, wherein the amount of change for the modification to the at least one CAD object is indicated by at least one of a drag, a dimension, and a geometry reference.

15. The system of claim 10, wherein the single modification tool modifies the at least one CAD object in accordance with the predicted type of modification, the amount of change, and the at least one CAD object's geometrical relationships with at least one of, one or more surrounding CAD objects, and one or more related CAD objects.

16. The system of claim 15, wherein the modification by the single modification tool comprises at least one of rounding and chamfering the at least one CAD object's edges with at least one of, the one or more surrounding CAD objects, and the one or more related CAD objects.

17. The system of claim 10, further comprising receiving from a user, through the single modification tool, a selection of at least one reference CAD object, wherein the single modification tool automatically predicting the user's intended type of modification to the at least one CAD object based on the type of the at least one CAD object, the type of the at least one reference CAD object, and the at least one CAD object's relationships with the geometry of at least one of, the one or more surrounding CAD objects, and the one or more related CAD objects.

18. The system of claim 17, wherein the at least one CAD object is a face and the at least one reference CAD object is an axis.

* * * * *